(12) United States Patent
Kim et al.

(10) Patent No.: US 12,058,859 B2
(45) Date of Patent: Aug. 6, 2024

(54) VERTICAL MEMORY DEVICES HAVING SUPPORT STRUCTURES TO REPLACE DUMMY CHANNELS AND METHODS OF MANUFACTURING THE SAME

(71) Applicant: SAMSUNG ELECTRONICS CO., LTD., Suwon-si (KR)

(72) Inventors: Kangmin Kim, Hwaseong-si (KR); Joongshik Shin, Yongin-si (KR); Hongik Son, Yongin-si (KR); Hyeonjoo Song, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 318 days.

(21) Appl. No.: 17/174,497

(22) Filed: Feb. 12, 2021

(65) Prior Publication Data
US 2021/0399009 A1    Dec. 23, 2021

(51) Int. Cl.
*H10B 43/27* (2023.01)
*H01L 23/522* (2006.01)
*H10B 41/10* (2023.01)
*H10B 41/27* (2023.01)
*H10B 41/35* (2023.01)
*H10B 43/10* (2023.01)
*H10B 43/35* (2023.01)

(52) U.S. Cl.
CPC ......... *H10B 43/27* (2023.02); *H01L 23/5226* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 43/35; H10B 41/35; H10B 43/10; H10B 41/27; H01L 23/5226
See application file for complete search history.

(56) References Cited

U.S. PATENT DOCUMENTS

| 9,299,717 B2 | 3/2016 | Lee et al. |
| 9,799,670 B2 | 10/2017 | Nishikawa et al. |
| 9,871,053 B2 | 1/2018 | Kwak |

(Continued)

OTHER PUBLICATIONS

Partial European Search Report dated Sep. 24, 2021 in corresponding European Application No. 21166081.6 (13 pages).

*Primary Examiner* — Lex H Malsawma
*Assistant Examiner* — Sean Ayers Winters
(74) *Attorney, Agent, or Firm* — F. CHAU & ASSOCIATES, LLC

(57) ABSTRACT

A vertical memory device includes a gate electrode structure formed on a substrate including a cell array region and a pad region, a channel, contact plugs, and support structures. The gate electrode structure includes gate electrodes extending in a second direction and stacked in a staircase shape in a first direction on the pad region. The channel extends through the gate electrode structure on the cell array region. The contact plugs contact corresponding ones of steps, respectively, of the gate electrode structure. The support structures extend through the corresponding ones of the steps, respectively, and extend in the first direction on the pad region. The support structure includes a filling pattern and an etch stop pattern covering a sidewall and a bottom surface thereof. An upper surface of each of the support structures is higher than that of the channel.

19 Claims, 44 Drawing Sheets

(56) References Cited

U.S. PATENT DOCUMENTS

| | | | |
|---|---|---|---|
| 10,224,104 B2 | 3/2019 | Chowdhury et al. | |
| 10,290,535 B1* | 5/2019 | Ho | H01L 21/76802 |
| 10,381,373 B2 | 8/2019 | Okizumi et al. | |
| 10,468,433 B2 | 11/2019 | Kim et al. | |
| 2009/0039335 A1* | 2/2009 | Terao | H01L 27/0688 |
| | | | 257/4 |
| 2018/0308856 A1* | 10/2018 | Cho | H10B 43/27 |
| 2018/0337192 A1 | 11/2018 | Kim et al. | |
| 2019/0139771 A1* | 5/2019 | Kang | H01L 29/7854 |
| 2019/0157283 A1* | 5/2019 | Jung | H10B 43/27 |
| 2019/0355740 A1* | 11/2019 | Hong | H01L 29/7926 |
| 2020/0013797 A1* | 1/2020 | Shim | H10B 43/50 |
| 2020/0027893 A1* | 1/2020 | Yang | H01L 21/76831 |
| 2020/0058667 A1 | 2/2020 | Baek | |

\* cited by examiner

FIG. 1
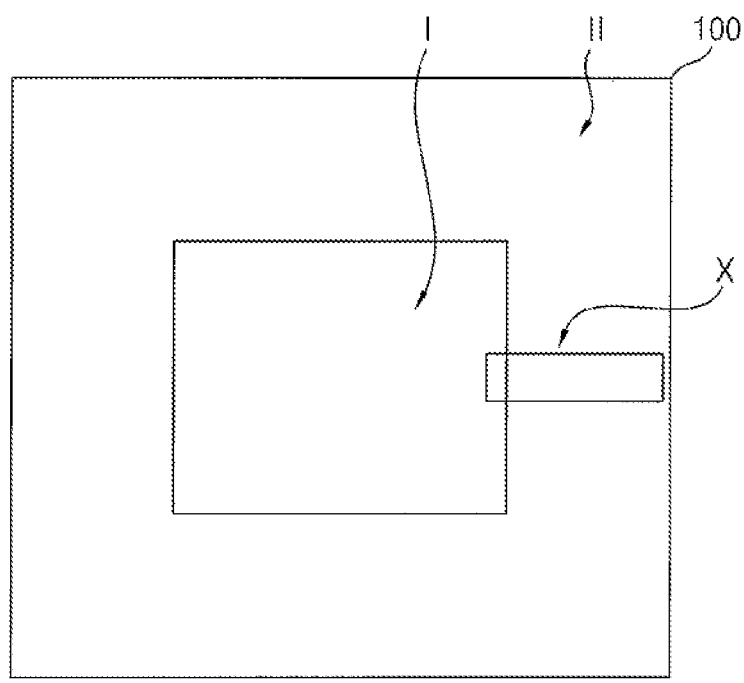
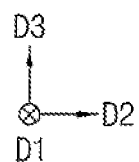

VERTICAL MEMORY DEVICES HAVING SUPPORT STRUCTURES TO REPLACE DUMMY CHANNELS AND METHODS OF MANUFACTURING THE SAME

CROSS-REFERENCE TO RELATED APPLICATIONS

This application claims priority under 35 U.S.C. § 119 to Korean Patent Application No. 10-2020-0074081, filed on Jun. 18, 2020 in the Korean Intellectual Property Office (KIPO), the contents of which are herein incorporated by reference in their entirety.

TECHNICAL FIELD

The present inventive concept relates to a vertical memory device and a method of manufacturing the same.

DISCUSSION OF RELATED ART

In a method of manufacturing a VNAND flash memory device, an insulation layer and a sacrificial layer may be alternately and repeatedly formed on a substrate to form a mold, and a channel may be formed through the mold. In order that the mold may not fall down in subsequent processes, a dummy channel may be formed through the mold together with the channel. When a word line cut is formed through the mold by an etching process so that the mold may be divided into a plurality of pieces in a direction perpendicular to an extension direction of the mold, and then, the sacrificial layer may be replaced with a gate electrode. The etching process for forming the word line cut may be influenced by the dummy channel, and thus, the word line cut may not be formed in a straight line but may be bent toward the dummy channel. Some of the gate electrodes subsequently formed may be electrically connected with each other due to the bending of the word line cut, thereby causing reliability failure such as an electrical short between the gate electrodes in the VNAND flash memory device.

SUMMARY

Example embodiments of the present inventive concept provide a vertical memory device having enhanced characteristics and a method of manufacturing the same.

According to an example embodiment of the present inventive concept, there is provided a vertical memory device. The vertical memory device may include a gate electrode structure, a channel, contact plugs, and support structures. The gate electrode structure may be formed on a substrate including a cell array region and a pad region, and may include gate electrodes spaced apart from each other in a first direction perpendicular to an upper surface of the substrate and stacked in a staircase shape on the pad region of the substrate. Each of the gate electrodes may extend in a second direction parallel to the upper surface of the substrate. The channel may extend in the first direction through the gate electrode structure on the cell array region of the substrate. The contact plugs may contact corresponding ones of steps, respectively, of the gate electrode structure, and each of the contact plugs may extend in the first direction on the pad region of the substrate. The support structures may extend through the corresponding ones of the steps, respectively, of the gate electrode structure, and each of the support structures may extend in the first direction on the pad region of the substrate. Each of the support structures may include a filling pattern extending in the first direction on the substrate and an etch stop pattern covering a sidewall and a bottom surface of the filling pattern. An upper surface of each of the support structures may be higher than an upper surface of the channel.

According to an example embodiment of the present inventive concept, there is provided a vertical memory device. The vertical memory device may include a gate electrode structure, a division pattern, channels, a channel connection pattern, a support layer, a support pattern, a contact plug, and a support structure. The gate electrode structure may be formed on a substrate, and may include gate electrodes spaced apart from each other in a first direction perpendicular to an upper surface of the substrate and stacked in a staircase shape. Each of the gate electrodes may extend in a second direction parallel to the upper surface of the substrate. The division pattern may be formed at a sidewall of the gate electrode structure, and may extend in the second direction on the substrate. The channels may be spaced apart from each other in a horizontal direction parallel to the upper surface of the substrate, and each of the channels may extend in the first direction through the gate electrode structure on the substrate. The channel connection pattern may be formed on the substrate, and may electrically connect the channels with each other. The support layer may be formed on the channel connection pattern. The support pattern may be connected to the support layer, and may contact the upper surface of the substrate. The contact plug may extend on the substrate in the first direction and contacting a step of the gate electrode structure. The support structure may extend on the substrate in the first direction, and may extend through the step of the gate electrode structure and the support pattern to contact the upper surface of the substrate. An upper surface of the division pattern may be higher than an upper surface of the support structure, and the upper surface of the support structure may be higher than upper surfaces of the channels.

According to an example embodiment of the present inventive concept, there is provided a vertical memory device. The vertical memory device may include a gate electrode structure, channels, a charge storage structure, a channel connection pattern, a support layer, a support pattern, contact plugs, and support structures. The gate electrode structure may be formed on a substrate including a cell array region and a pad region, and may include gate electrodes spaced apart from each other in a first direction perpendicular to an upper surface of the substrate and stacked in a staircase shape on the pad region of the substrate. Each of the gate electrodes may extend in a second direction parallel to the upper surface of the substrate. The channels may be spaced apart from each other in a horizontal direction parallel to the upper surface of the substrate, and each of the channels may extend in the first direction through the gate electrode structure on the cell array region of the substrate. The charge storage structure may be formed on an outer sidewall of each of the channels. The channel connection pattern may be formed on the cell array region of the substrate, and may electrically connect the channels with each other. The support layer may be formed on the channel connection pattern. The support pattern may be connected to the support layer, and may contact an upper surface of the substrate. The contact plugs may contact corresponding ones of steps, respectively, of the gate electrode structure, and each of the contact plugs may extend in the first direction on the pad region of the substrate. The support structures may extend through the corresponding ones of the steps, respectively, of the gate electrode structure, and each of the support structures may extend in the first direction on the pad region of the substrate. Each of the support structures may include a filling pattern extending in the first direction on the substrate, and an etch stop pattern covering a sidewall and a bottom surface of the filling pattern. An upper surface of each of the support structures may be higher than upper surfaces of the channels.

According to an example embodiment of the present inventive concept, there is provided a method of manufacturing a vertical memory device. In the method, a mold may be formed on a substrate including a cell array region and a pad region. The mold may include step layers stacked on the cell array region and the pad region of the substrate in a first direction perpendicular to an upper surface of the substrate and having a staircase shape on the pad region of the substrate, and each of the step layers may include a sacrificial layer and an insulation layer stacked in the first direction. A channel may be formed through the mold on the cell array region of the substrate to contact the upper surface of the substrate. First and second openings may be formed. The first opening may extend through the mold on the cell array region and the pad region of the substrate, and may extend in a second direction parallel to the upper surface of the substrate to divide the mold in a third direction parallel to the upper surface of the substrate and crossing the second direction. The second opening may extend through a portion of a step of the mold adjacent to the first opening in the third direction on the pad region of the substrate. A support structure may be formed in the second opening. The sacrificial layers of the mold exposed by the first opening may be removed to form first gaps. Gate electrodes may be formed in the first gaps, respectively.

According to an example embodiment of the present inventive concept, there is provided a method of manufacturing a vertical memory device. In the method, a mold may be formed on a substrate including a cell array region and a pad region. The mold may include step layers stacked on the cell array region and the pad region of the substrate in a first direction perpendicular to an upper surface of the substrate and having a staircase shape on the pad region of the substrate, and each of the step layers may include a sacrificial layer and an insulation layer stacked in the first direction. A channel may be formed through the mold on the cell array region of the substrate to contact the upper surface of the substrate. First and second openings may be formed. The first opening may extend through the mold on the cell array region and the pad region of the substrate, and may extend in a second direction parallel to the upper surface of the substrate to divide the mold in a third direction parallel to the upper surface of the substrate and crossing the second direction. The second opening may extend through a portion of a step of the mold adjacent to the first opening in the third direction on the pad region of the substrate. A sacrificial layer structure may be formed in the first and second openings. A support layer may be formed on the mold and the sacrificial layer structure. The support layer may be partially removed to form a third opening at least partially exposing a first portion of the sacrificial layer structure in the first opening. The first portion of the sacrificial layer structure in the first opening may be removed via the third opening to form the first opening again, and a second portion of the sacrificial layer structure remaining in the second opening may form a support structure. The sacrificial layers of the mold exposed by the first opening may be removed to form gaps. Gate electrodes may be formed in the gaps, respectively.

According to an example embodiment of the present inventive concept, there is provided a method of manufacturing a vertical memory device. In the method, a mold may be formed on a substrate including a cell array region and a pad region. The mold may include step layers stacked on the cell array region and the pad region of the substrate in a first direction perpendicular to an upper surface of the substrate and having a staircase shape on the pad region of the substrate, and each of the step layers may include a sacrificial layer and an insulation layer stacked in the first direction. A channel may be formed through the mold on the cell array region of the substrate to contact the upper surface of the substrate. A first opening and second openings may be simultaneously formed by an etching process on the mold. The first opening may extend through the mold on the cell array region and the pad region of the substrate, and may extend in a second direction parallel to the upper surface of the substrate to divide the mold in a third direction parallel to the upper surface of the substrate and crossing the second direction. The second openings may extend through corresponding steps, respectively, of the mold. Support structures may be formed in the second openings, respectively. The sacrificial layers of the mold exposed by the first opening may be removed to form first gaps. Gate electrodes may be formed in the first gaps, respectively. Contact plugs contacting portions of the gate electrodes, respectively, adjacent to the support structures may be formed. The gate electrodes may be formed to be spaced apart from each other in the first direction on the cell array region and the pad region of the substrate to form a gate electrode structure having a staircase shape on the pad region of the substrate. The contact plugs may contact corresponding steps, respectively, of the gate electrode structure.

In the method of manufacturing a vertical memory device in accordance with an example embodiment of the present inventive concept, after forming an opening extending in a direction to divide a mold, a support structure may be formed to prevent the mold from leaning or falling down, so that the opening may be formed in a straight line with no influence of the support structure. Accordingly, the gat electrode structures that may be separated by the opening may have enhanced characteristics.

BRIEF DESCRIPTION OF THE DRAWINGS

The above and other aspects and features of the present inventive concept will become more apparent by describing in detail example embodiments thereof with reference to the accompanying drawings, in which:

FIGS. 1 to 41 are plan views and cross-sectional views illustrating a method of manufacturing a vertical memory device in accordance with example embodiments of the present inventive concept;

Figure 2:
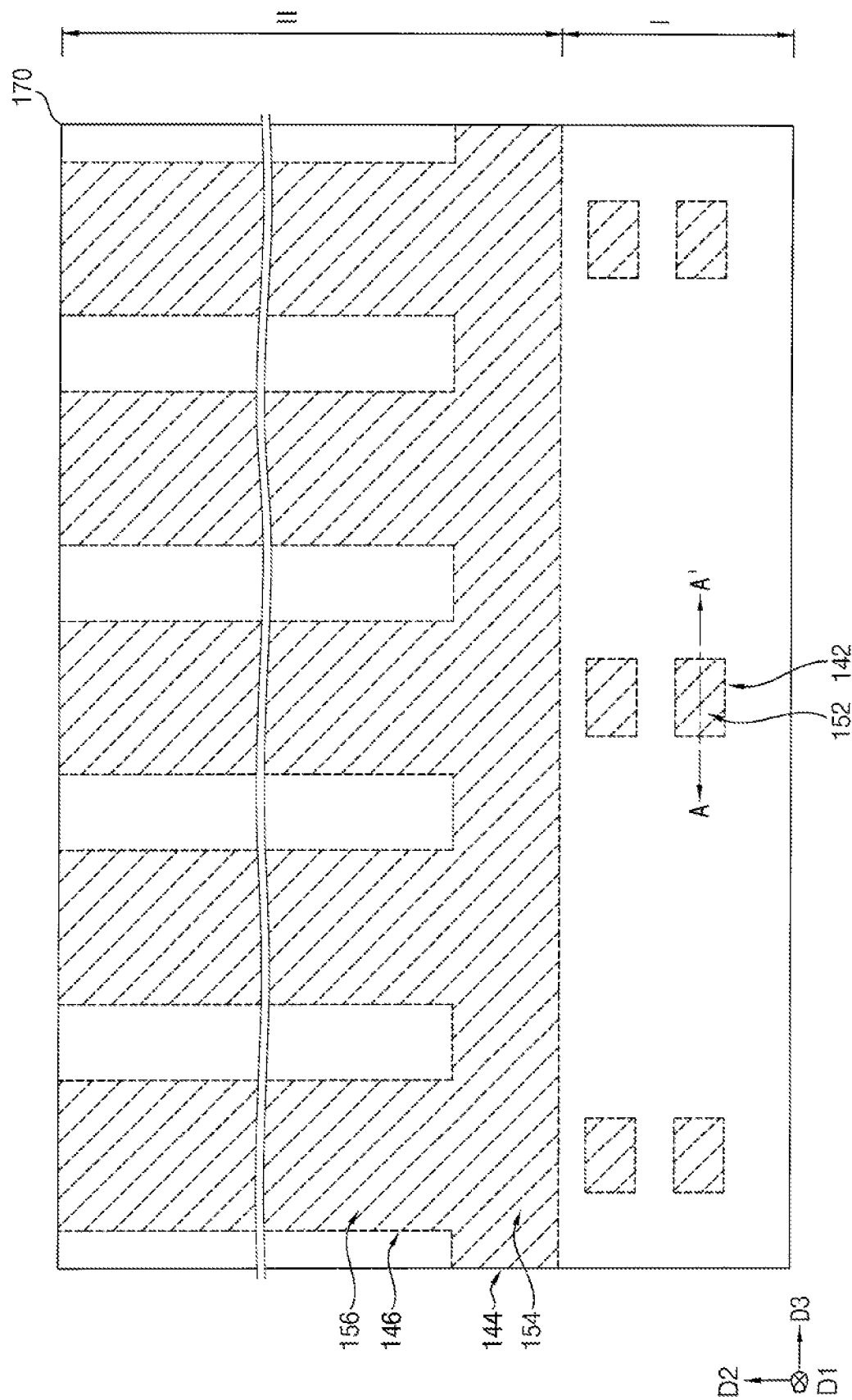

Since the drawings in FIGS. 1-46 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

It will be understood that, although the terms "first", "second" and/or "third" may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second or third element, component, region, layer or section without departing from the teachings of the present inventive concept.

In this specification, when material A is described to have etching selectivity with respect to material B, it may mean that there is a significant etch rate difference between material A and material B, and either material A can be selectively etched away with material B remaining, or material B can be selectively etched away with material A remaining.

Hereinafter, in the specification (and not necessarily in the claims) a direction substantially perpendicular to an upper surface of a substrate may be defined as a first direction D1, and two directions substantially parallel to the upper surface of the substrate and crossing each other may be defined as second and third directions D2 and D3, respectively. In an example embodiment of the present inventive concept, the second and third directions D2 and D3 may be substantially perpendicular to each other.

FIGS. 1 to 41 are plan views and cross-sectional views illustrating a method of manufacturing a vertical memory device in accordance with example embodiments of the present inventive concept. FIGS. 1-2, 4, 8, 12, 17, 25, 29-30 and 37 are the plan views, and FIGS. 3, 5-7, 9-11, 13-16, 18-24, 26-28, 31-36 and 38-41 are the cross-sectional views. FIGS. 2 to 41 are about a region X of FIG. 1.

Figure 5:
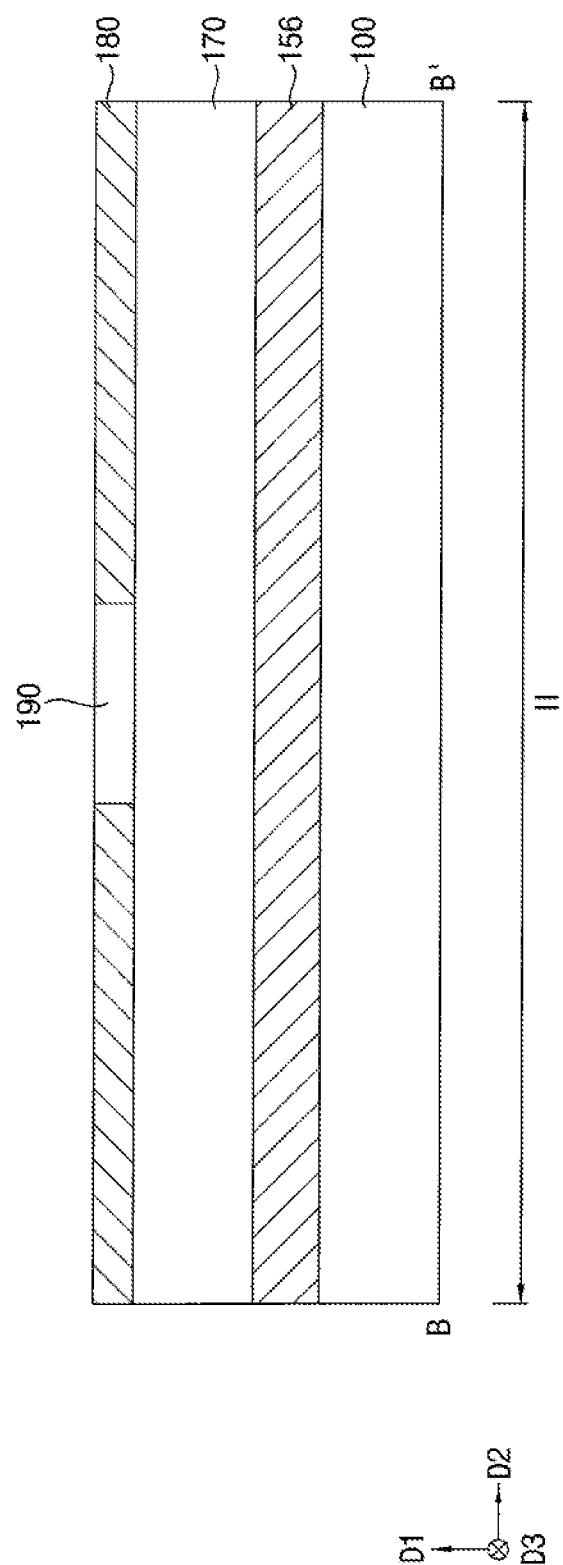
Figure 6:
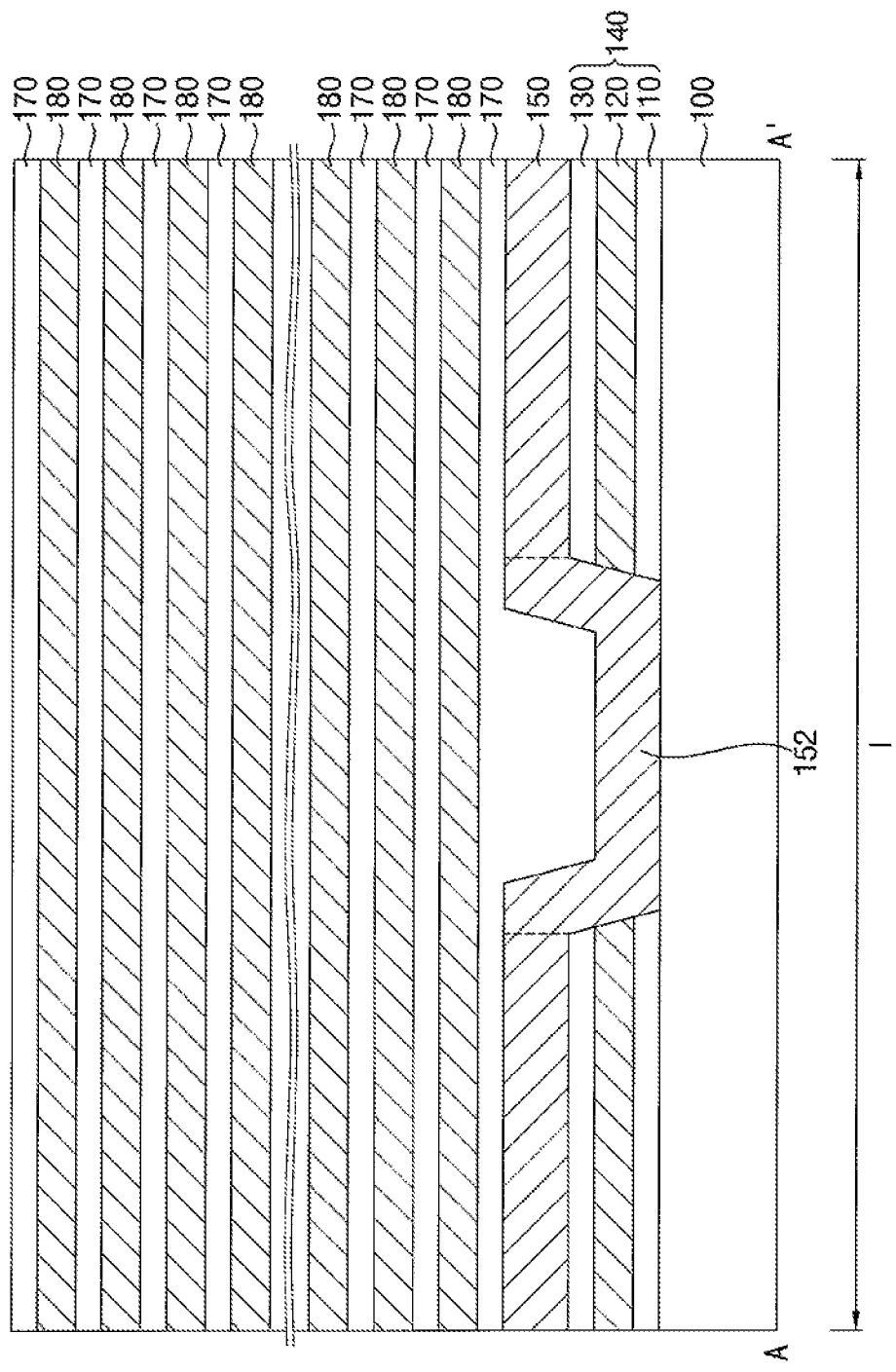
Figure 7:
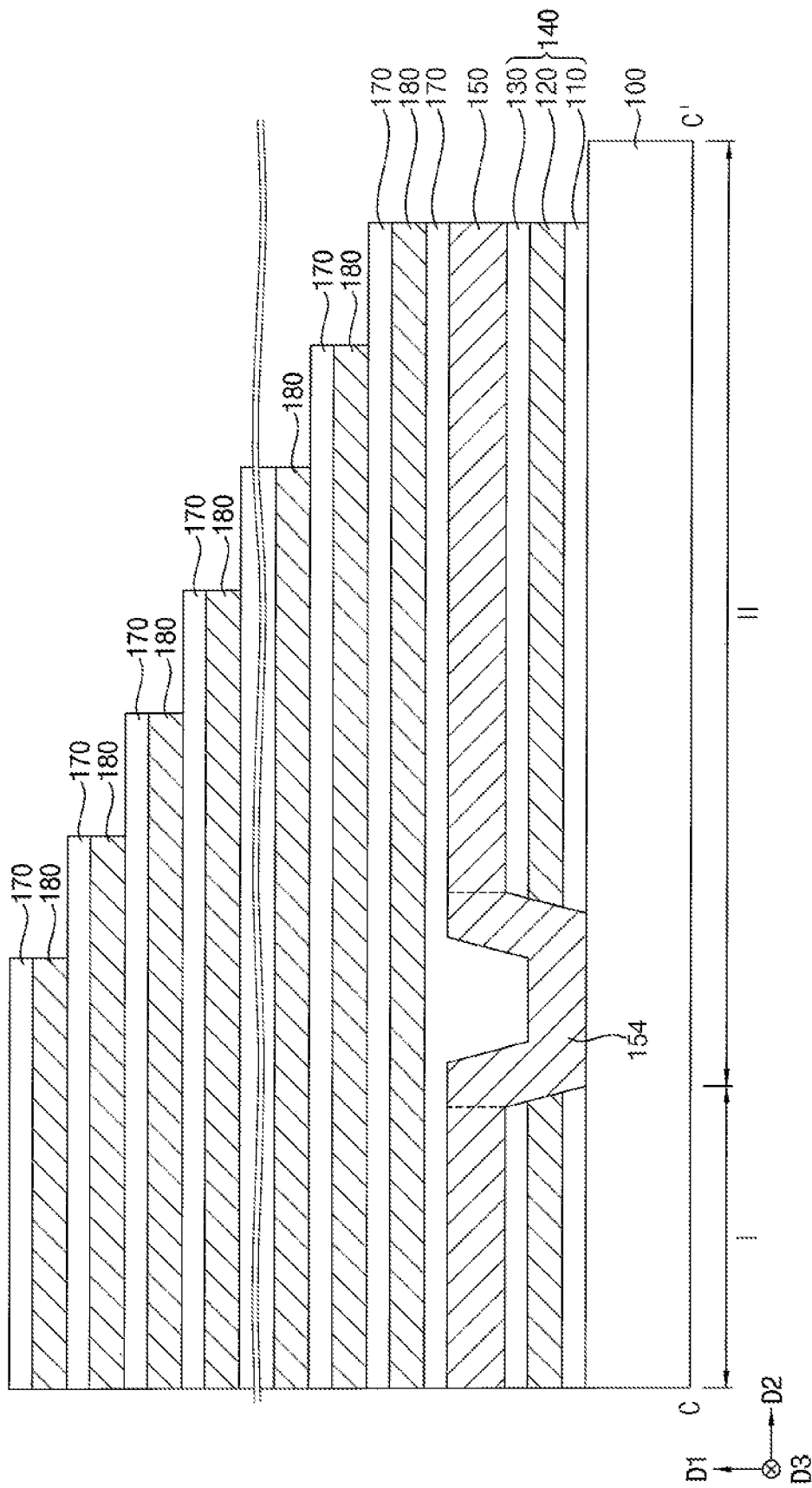
Figure 9:
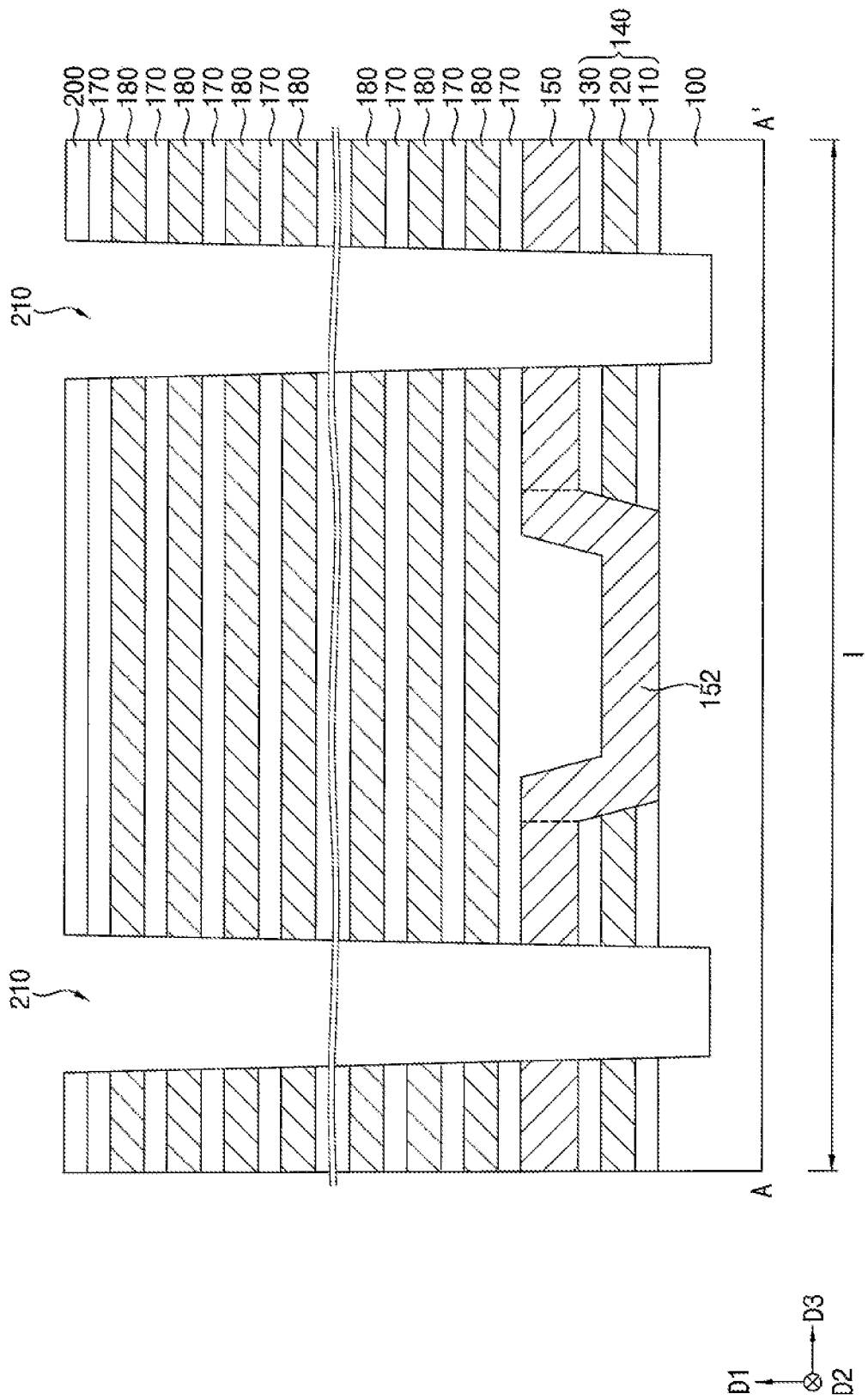
Figure 10:
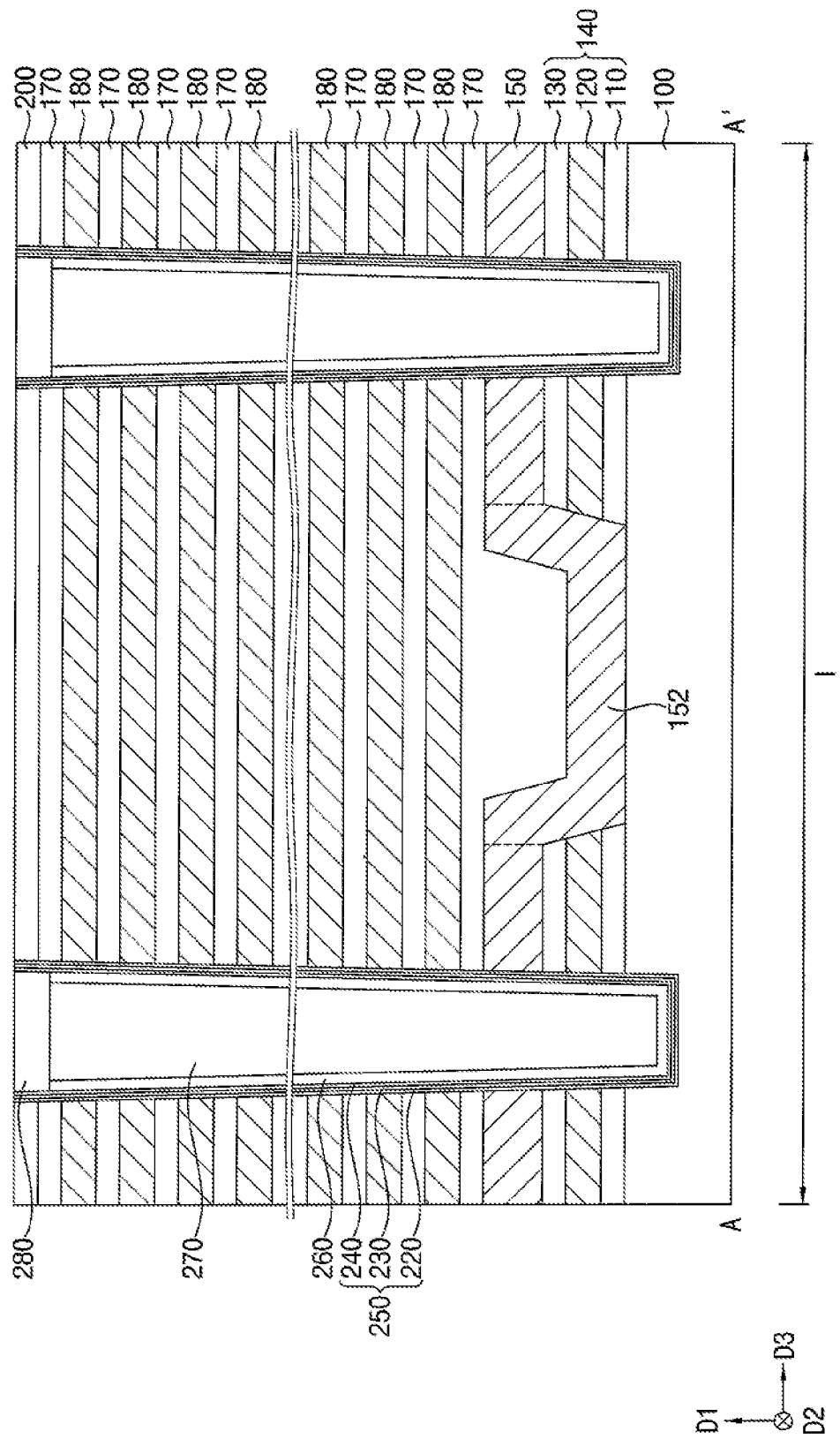
Figure 11:
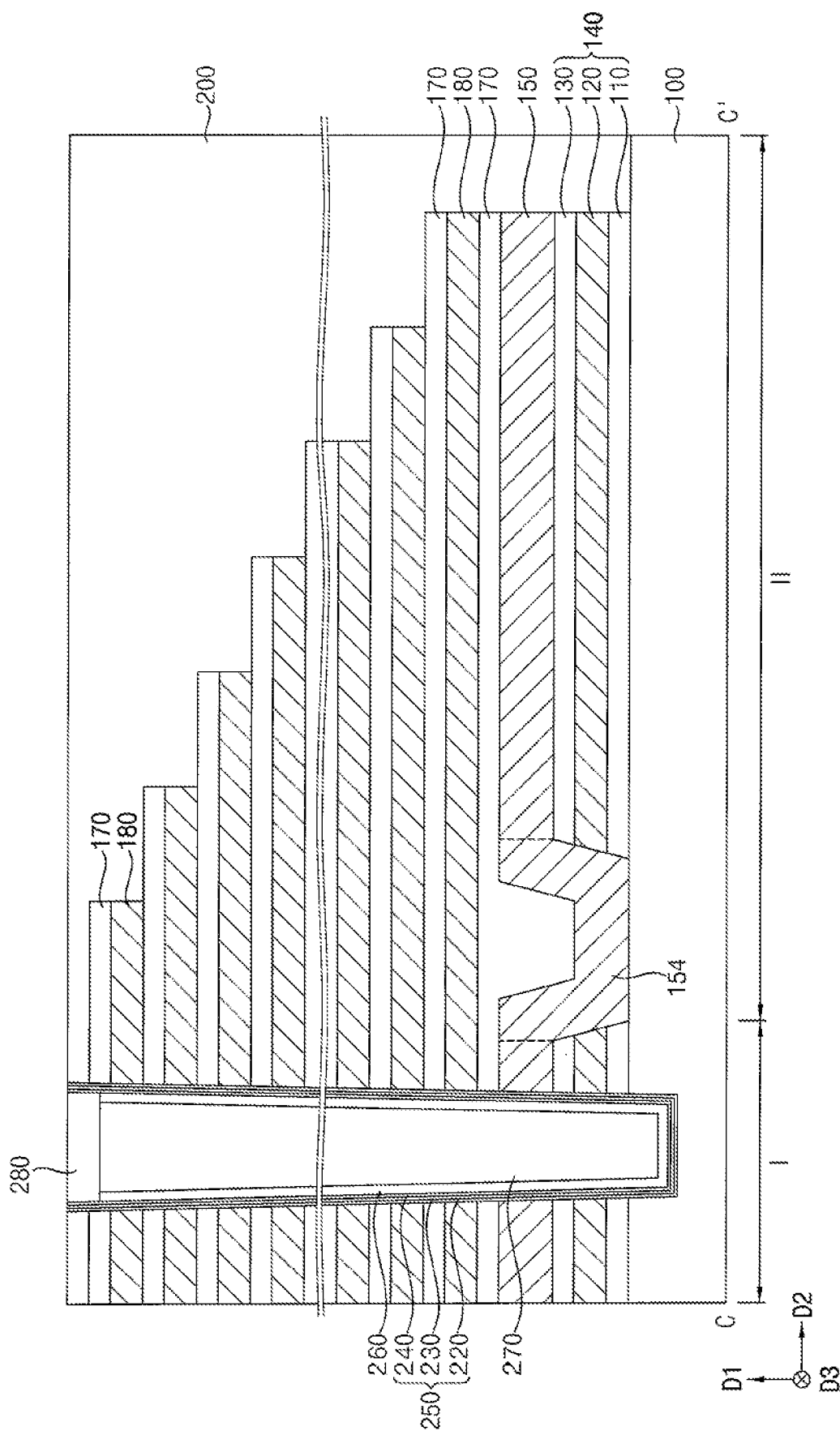
Figure 13:
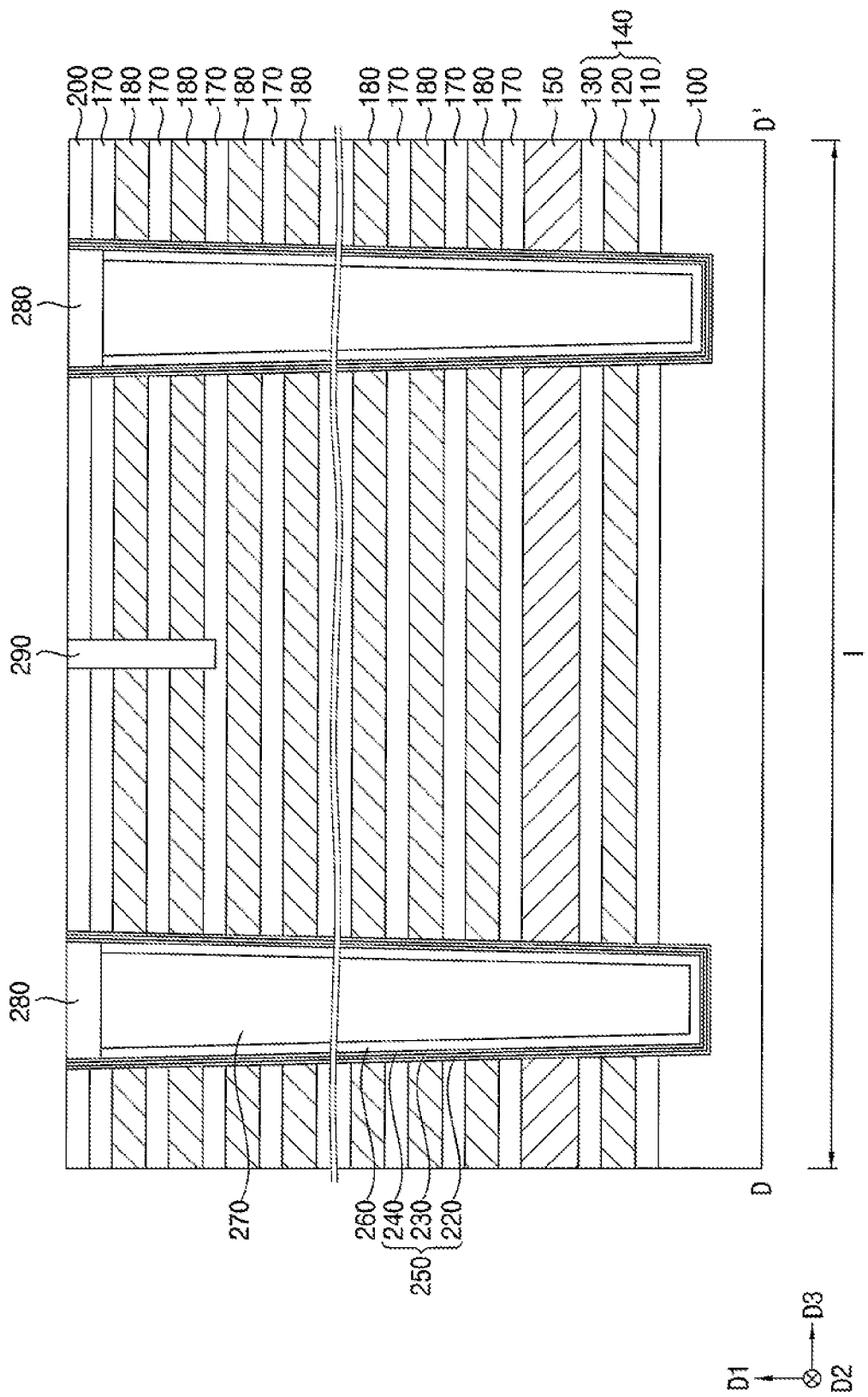
Figure 14:
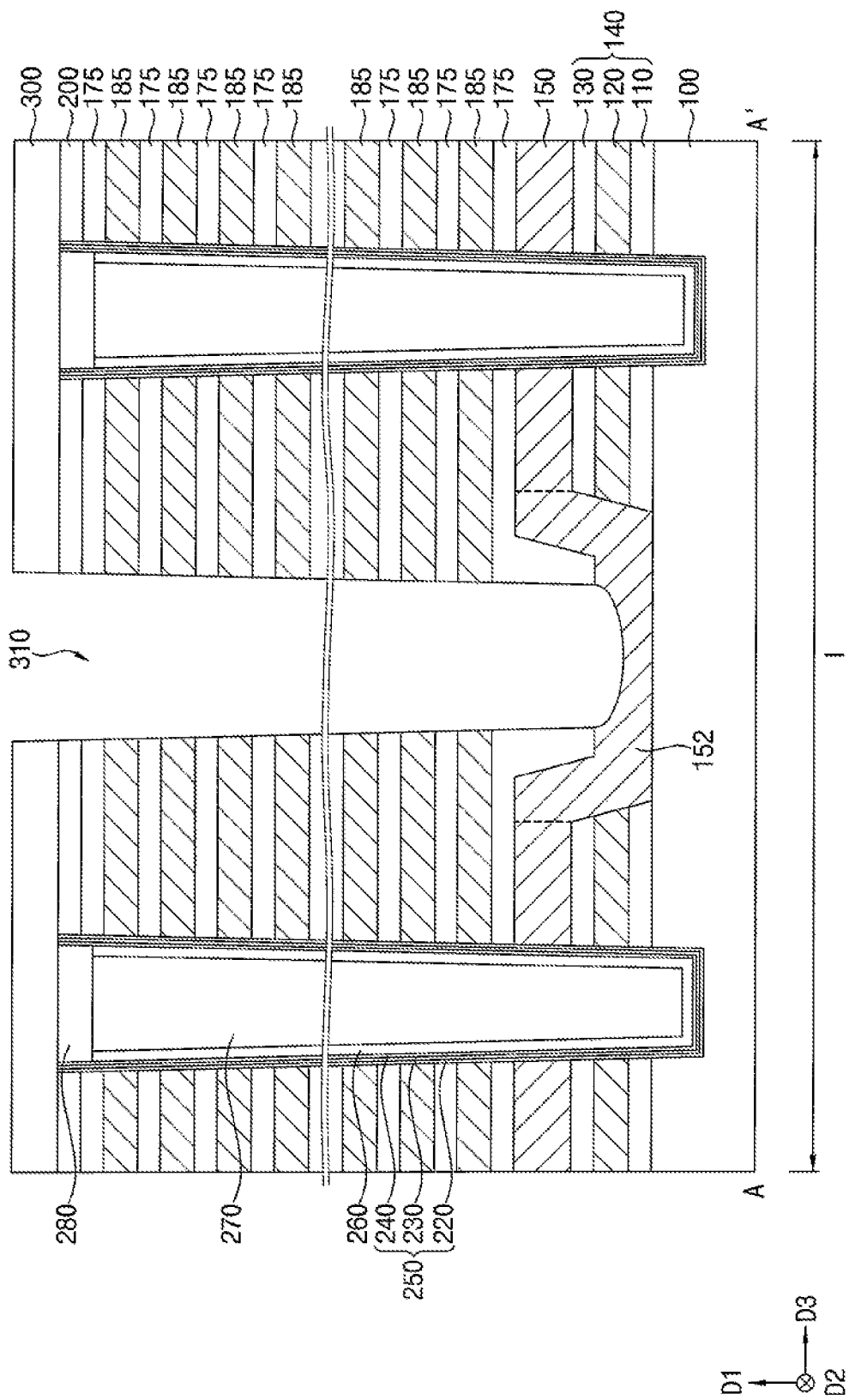
Figure 15:
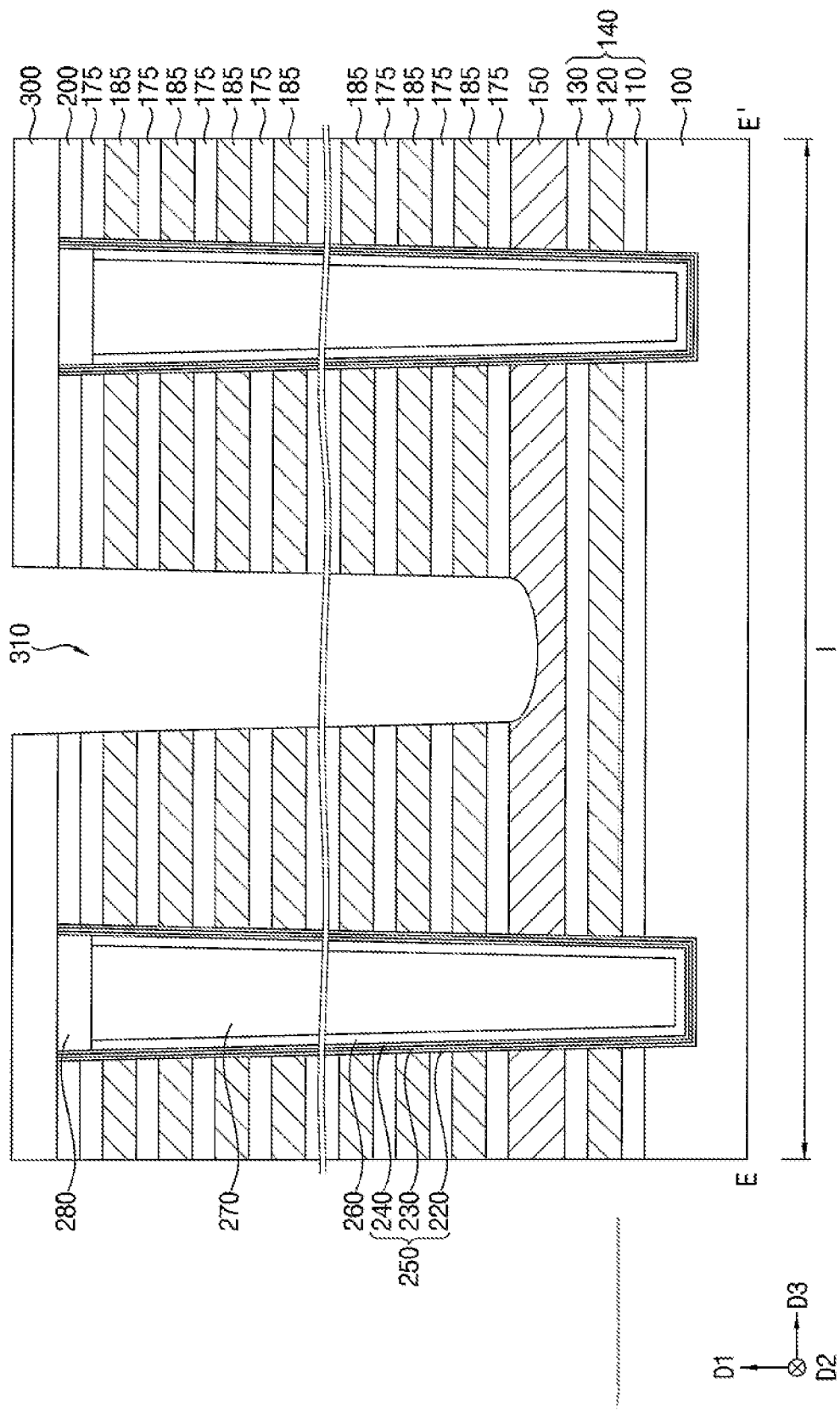
Figure 16:
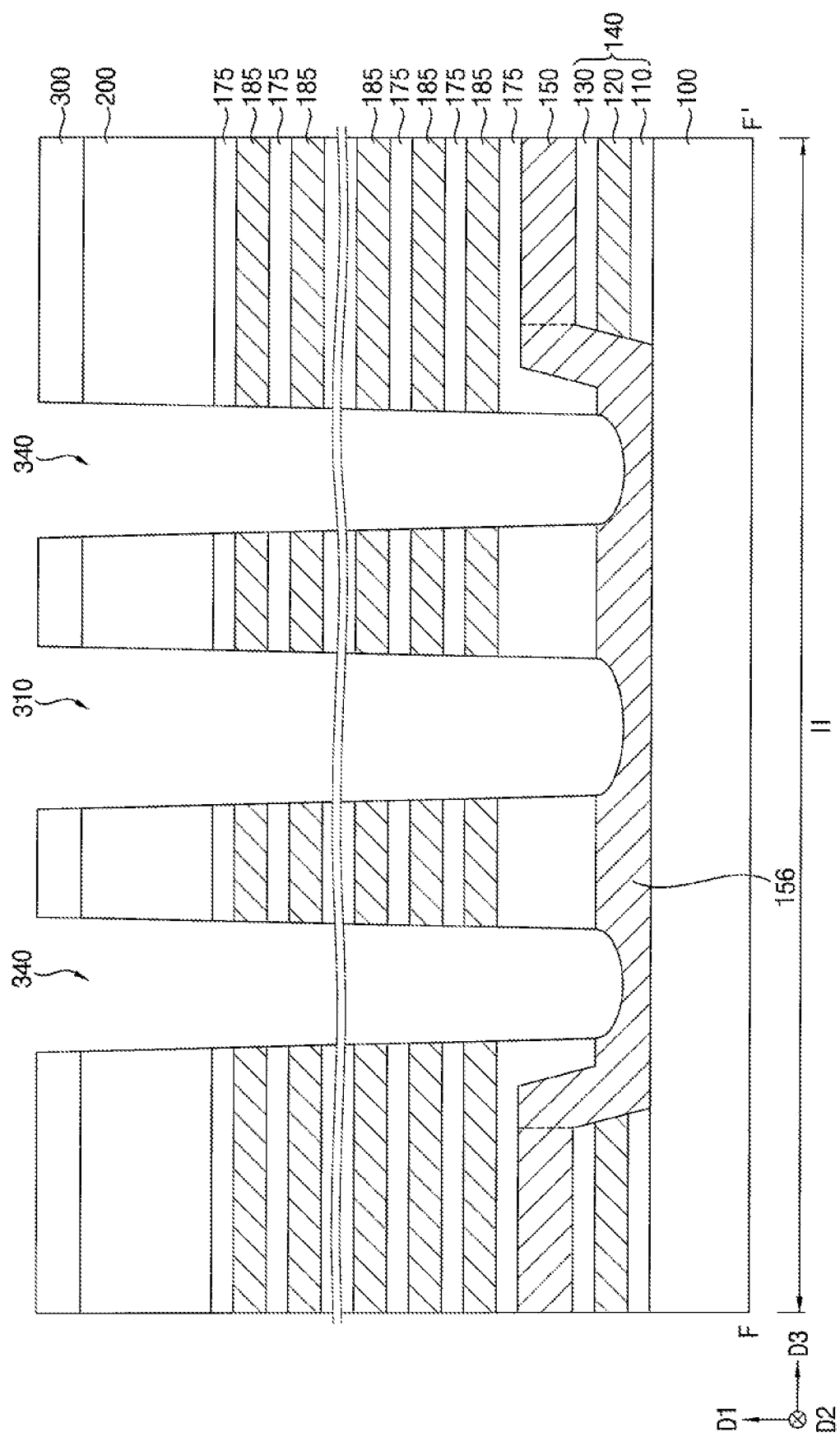
Figure 17:
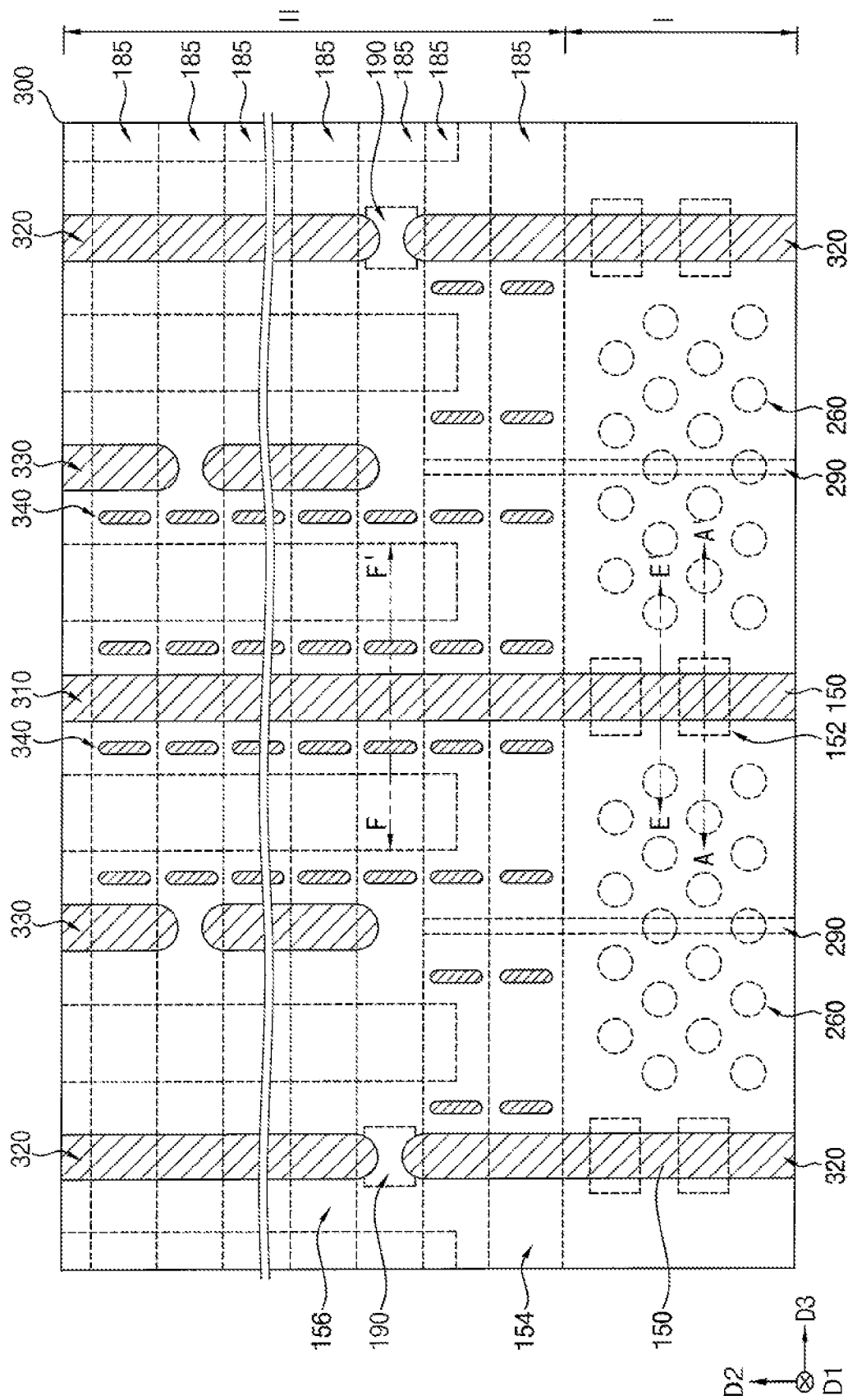
Figure 39:
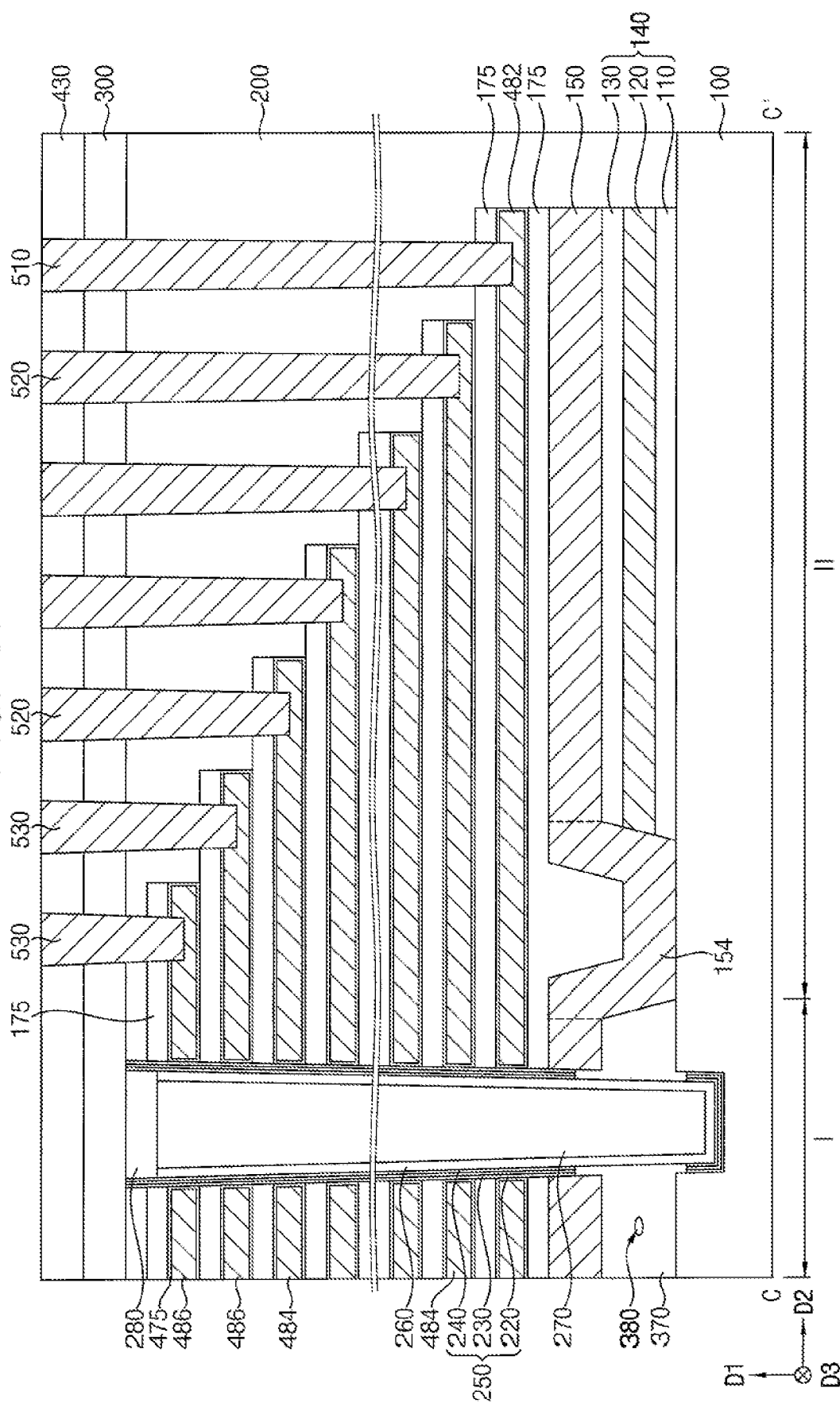
Figure 40:
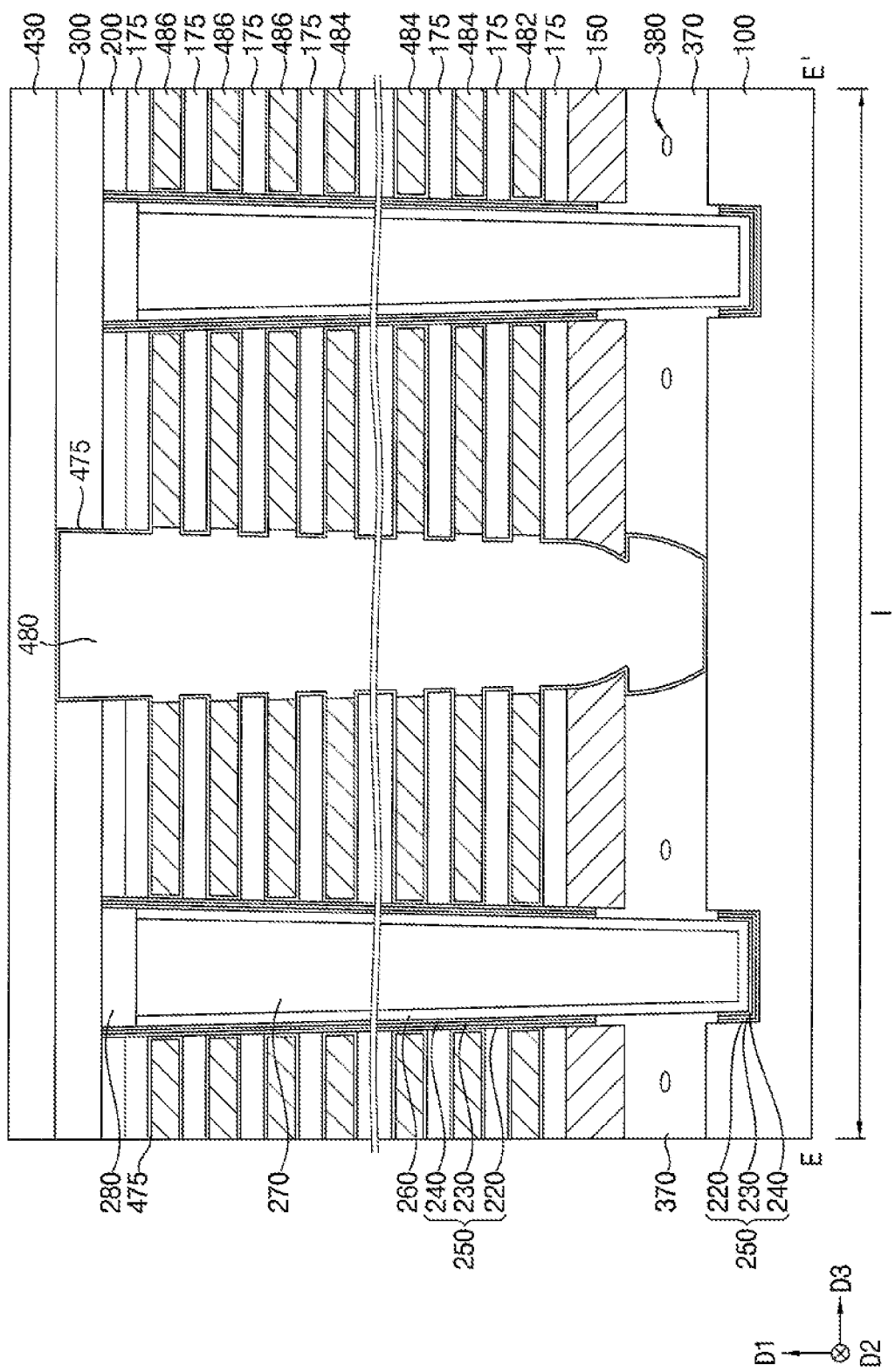
Figure 41:
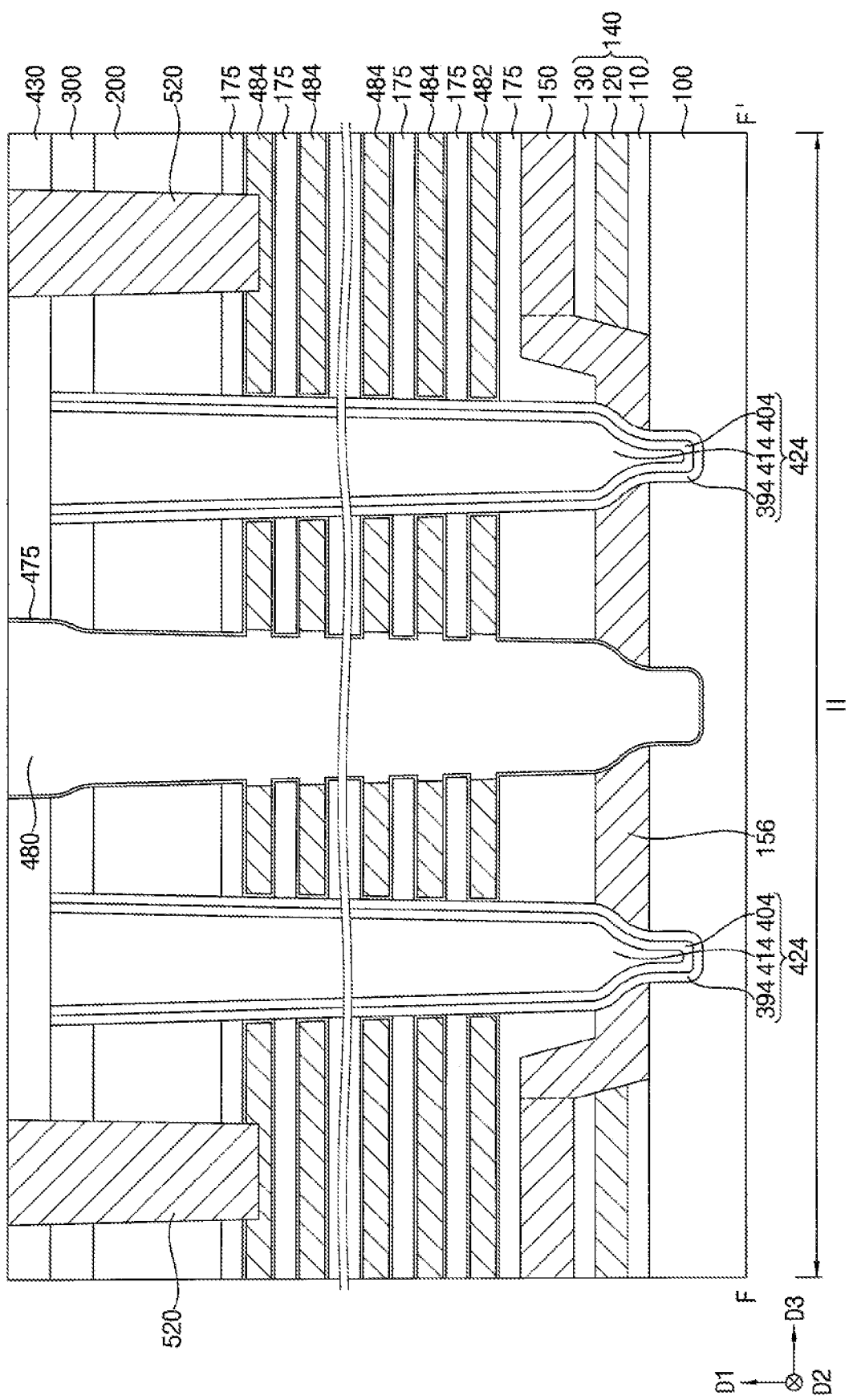

FIGS. 3, 6, 9, 10, 14, 18, 20, 22, 26, 31, 34 and 38 are cross-sectional views taken along lines A-A', respectively, of corresponding plan views, FIG. 5 is a cross-sectional view taken along line B-B' of a corresponding plan view, FIGS. 7, 11 and 39 are cross-sectional views taken along lines C-C', respectively, of corresponding plan views, FIG. 13 is a cross-sectional view taken along line D-D' of a corresponding plan view, FIGS. 15, 19, 21, 23, 27, 32, 35 and 40 are cross-sectional views taken along lines E-E', respectively, of corresponding plan views, and FIGS. 16, 24, 28, 33, 36 and 41 are cross-sectional views taken along lines F-F', respectively, of corresponding plan views.

Referring to FIG. 1, a substrate 100 on which the vertical memory device may be formed may include first and second regions I and II.

The first region I may be a cell array region in which memory cells may be formed, the second region II may surround the first region I and may be a pad region or extension region in which contact plugs for transferring electrical signals to the memory cells may be formed.

The substrate 100 may include a Group IV semiconductor material such as, for example, silicon (Si), germanium (Ge), silicon-germanium (SiGe), etc. or a III-V compound such as, for example, gallium phosphide (GaP), gallium arsenide (GaAs), Gallium Antimonide (GaSb), indium phosphide (InP), indium arsenide (InAs), indium antimonide (InSb), indium gallium arsenide (InGaAs), etc. In an example embodiment of the present inventive concept, the substrate 100 may be a silicon-on-insulator (SOI) substrate or a germanium-on-insulator (GOI) substrate. For example, n-type impurities may be implanted into the substrate 100.

Figure 3:
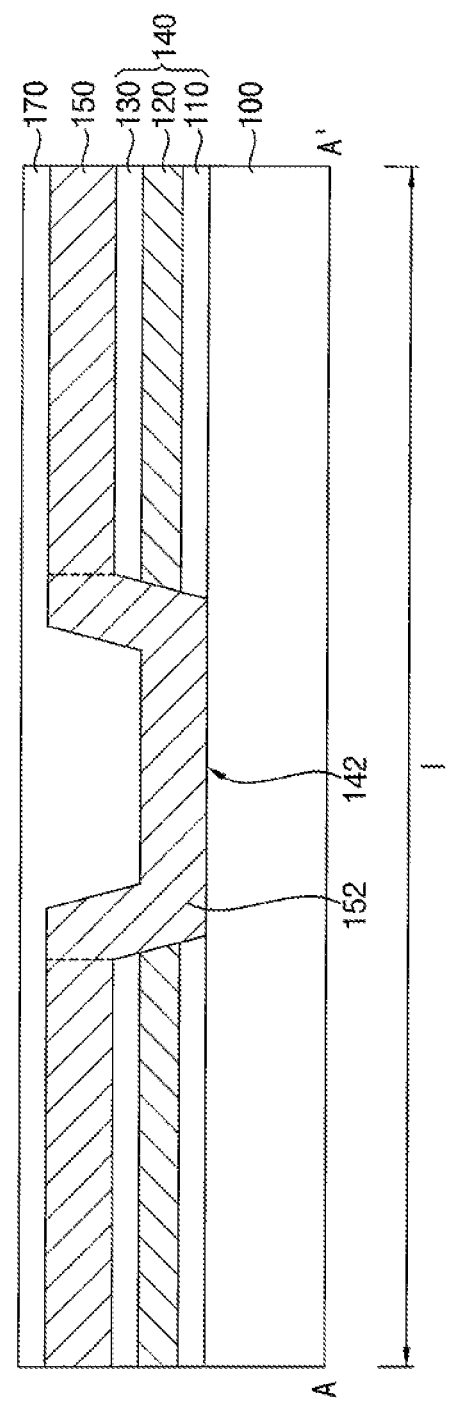

Referring to FIGS. 2 and 3, a first sacrificial layer structure 140 may be formed on the substrate 100, and partially removed to form first to third openings 142, 144 and 146 each of which may expose an upper surface of the substrate 100. The first opening 142 may be formed on the first region I (i.e., cell array region) of the substrate 100, while the second and third openings 144 and 146 may be formed on the second region II (i.e., pad region) of the substrate 100. A first support layer 150 may be formed on the exposed substrate 100 and the first sacrificial layer structure 140 to at least partially fill each of the first to third openings 142, 144 and 146.

The first sacrificial layer structure 140 may include first, second and third sacrificial layers 110, 120 and 130 sequentially stacked in the first direction D1 on the substrate 100. The first and third sacrificial layers 110 and 130 may include an oxide, e.g., silicon oxide ($SiO_2$), and the second sacrificial layer 120 may include a nitride, e.g., silicon nitride ($Si_3N_4$). The first support layer 150 may include a material having an etching selectivity with respect to the first to third sacrificial layers 110, 120 and 130, e.g., polysilicon (p-Si) doped with n-type impurities or undoped polysilicon (p-Si). In an example embodiment of the present inventive concept, the first support layer 150 may be formed by depositing amorphous silicon (a-Si), and crystallizing the amorphous silicon (a-Si) by a heat treatment process or by deposition processes of other layers so that the first support layer 150 may include polysilicon (p-Si).

In an example embodiment of the present inventive concept, a plurality of first openings 142 may be formed in the second direction D2 on the first region I of the substrate 100, and may also be formed in the third direction D3 on the first region I of the substrate 100. For example, the plurality of first openings 142 formed in the first region I may be spaced apart from each other in the second direction D2 and spaced apart from each other in the third direction D3. The second opening 144 may extend in the third direction D3 on a portion of the second region II of the substrate 100 adjacent to the first region I of the substrate 100, however, the present inventive concept may not be limited thereto. For example, the second opening 144 may also be formed on a portion of the first region I of the substrate 100 adjacent to the second region II of the substrate 100. The third opening 146 may be connected to the second opening 144 on the second region II of the substrate 100 to extend in the second direction D2. A plurality of third openings 146 may be spaced apart from each other in the third direction D3. In an example embodiment of the present inventive concept, the first openings 142 disposed in the second direction D2 may be aligned with the third opening 146 extending in the second direction D2.

The first support layer 150 may have a constant thickness, and thus a first recess may be formed on a portion of the first support layer 150 in each of the first to third openings 142, 144 and 146. Hereinafter, the portions of the first support layers 150 in the first to third openings 142, 144 and 146 may be referred to as first to third support patterns 152, 154 and 156, respectively.

An insulation layer 170 may be formed on the first support layer 150 to fill the first recesses, and an upper portion thereof may be planarized. The insulation layer 170 may include an oxide, e.g., silicon oxide ($SiO_2$), and the planarization process may include a chemical mechanical polishing (CMP) process and/or an etch back process.

Figure 4:
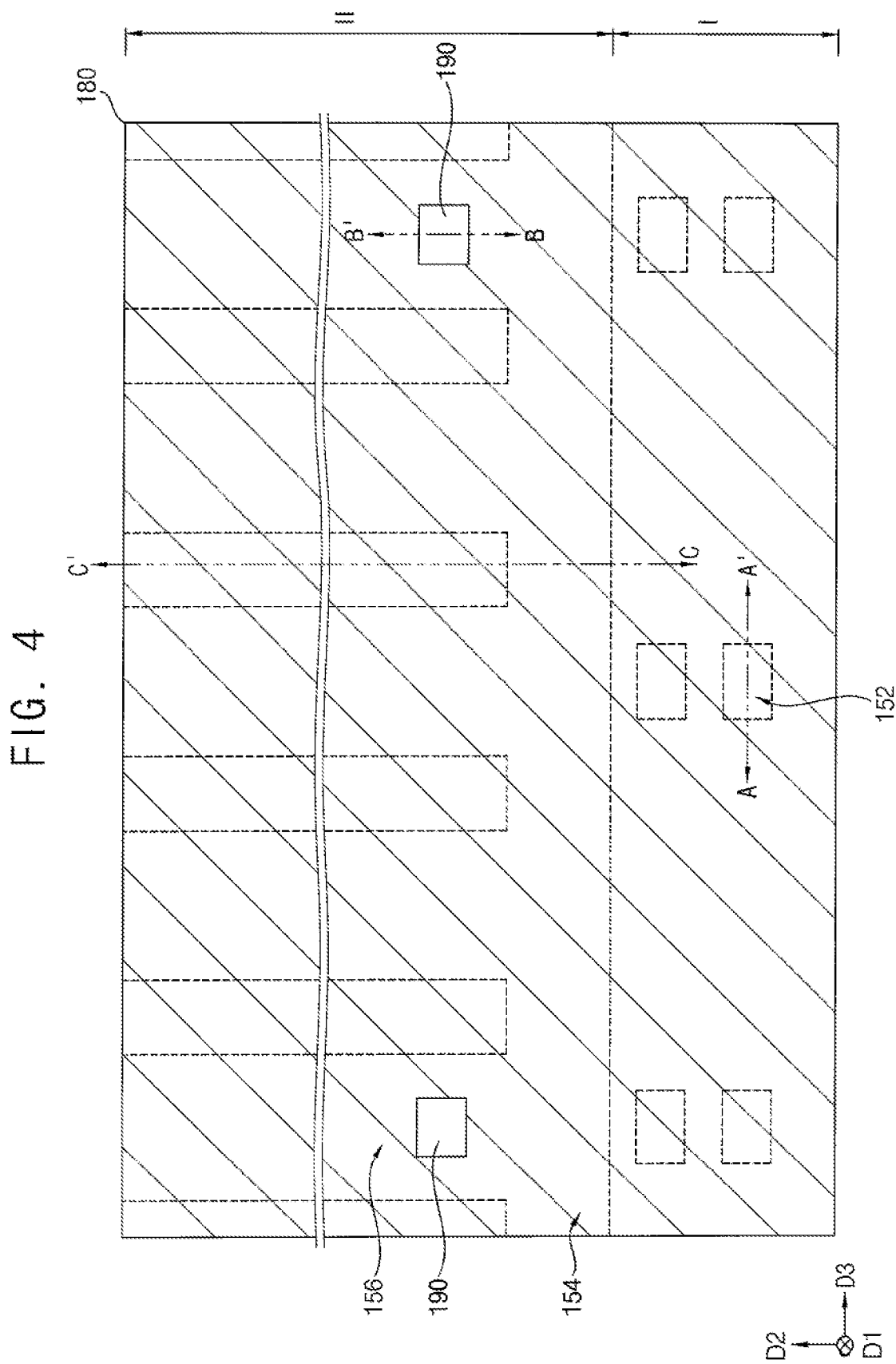

Referring to FIGS. 4 and 5, a fourth sacrificial layer 180 may be formed on the insulation layer 170, and a first division pattern 190 may be formed through a portion of the fourth sacrificial layer 180 on the second region II of the substrate 100.

The first division pattern 190 may be formed by partially removing the fourth sacrificial layer 180 to form a fourth opening and filling the fourth opening with an insulating material. In an example embodiment of the present inventive concept, a plurality of first division patterns 190 may be formed to be spaced apart from each other in the third direction D3. In an example embodiment of the present inventive concept, each of the first division patterns 190 may overlap the third support pattern 156 in the first direction D1. In an example embodiment of the present inventive concept, each of the first division patterns 190 may be aligned with the first support patterns 152 in the second direction D2.

The fourth sacrificial layer 180 may include a material having an etching selectivity with respect to the insulation layer 170, e.g., a nitride such as silicon nitride ($Si_3N_4$), and the first division pattern 190 may have a material having an etching selectivity with respect to the fourth sacrificial layer 180, e.g., an oxide such as silicon oxide ($SiO_2$).

Referring to FIGS. 6 and 7, the insulation layer 170 and the fourth sacrificial layer 180 may be alternately and repeatedly formed in the first direction D1 on the fourth sacrificial layer 180 to form a mold layer on the substrate 100.

A photoresist pattern may be formed on an uppermost one of the insulation layers 170 to partially cover the uppermost one of the insulation layers 170, and the uppermost one of the insulation layers 170 and an uppermost one of the fourth sacrificial layers 180 thereunder may be etched using the photoresist pattern as an etching mask. The photoresist pattern may be formed through a photolithography process. The etching process may be a reactive ion etching (RIE) process. Thus, one of the insulation layers 170 directly under the uppermost one of the fourth sacrificial layers 180 may be partially exposed. After a trimming process for reducing an area of the photoresist pattern, the uppermost one of the insulation layers 170, the uppermost one of the fourth sacrificial layers 180, the partially exposed one of the insulation layers 170 and one of the fourth sacrificial layers 180 directly thereunder may be etched again using the reduced photoresist pattern as an etching mask. The trimming process and the etching process may be alternately and repeatedly performed so that a staircase structure including a plurality of step layers each of which may consist of one of the fourth sacrificial layers 180 and one of the insulation layers 170 directly thereon may be formed on the second region II of the substrate 100, and a mold having the staircase structure may be formed on the first and second regions I and II of the substrate 100. Thus, each of the plurality of step layers may include not only an exposed portion, but also a portion covered by upper level step layers.

Hereinafter, a "step layer" may be referred to as an entire portion of the fourth sacrificial layer 180 and the insulation layer 170 at the same level, which may include not only an exposed portion but also a non-exposed portion, and a "step" may be referred to as the exposed portion of the step layer that may not be covered by upper step layers to be exposed. In an example embodiment of the present inventive concept, the steps may be arranged in the second direction D2 on the second region II of the substrate 100. Alternatively, the steps may be arranged in the third direction D3 on the second region II of the substrate 100. For example, the step layers on the second region II of the substrate 100 of the staircase structure may have areas decreasing by a given rate from a lowermost level toward an uppermost level thereof.

Figure 8:
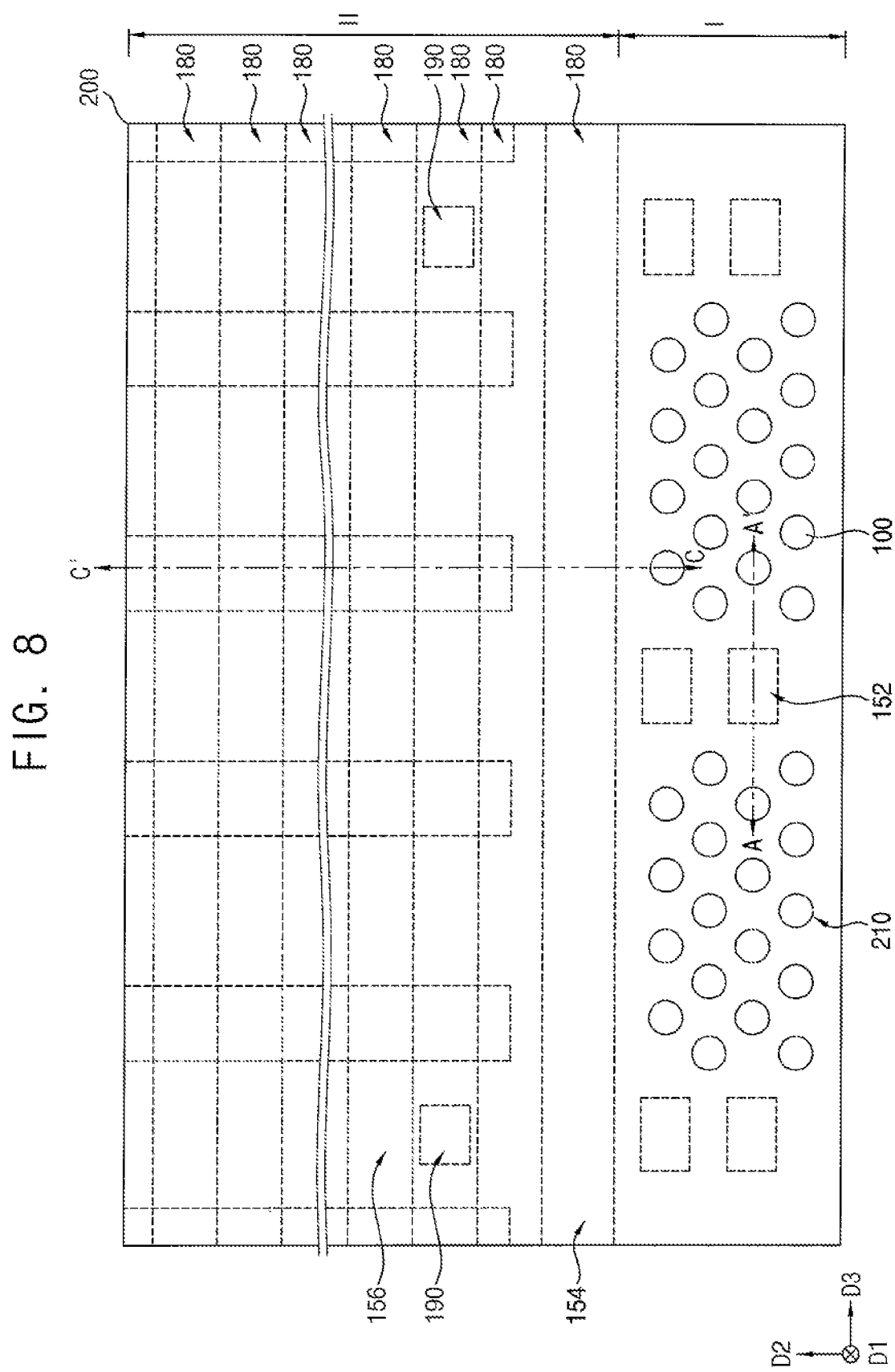

Referring to FIGS. 8 and 9, a first insulating interlayer 200 may be formed on the uppermost one of the insulation layers 170, and a channel hole 210 may be formed through the first insulating interlayer 200 and the mold to expose an upper surface of the substrate 100 by, e.g., a dry etching process.

The first insulating interlayer 200 may include an oxide, e.g., silicon oxide ($SiO_2$).

In an example embodiment of the present inventive concept, the dry etching process may be performed until the upper surface of the substrate 100 is exposed, and an upper portion of the substrate 100 may be further removed in the dry etching process. For example, after removing the upper portion of the substrate 100, a bottom surface of the channel hole 210 may be lower than a top surface of the substrate 100. However, the present inventive concept may not be limited thereto. For example, the first region I of the substrate 100 under the channel hole 210 may not be over-etched. In an example embodiment of the present inventive concept, a plurality of channel holes 210 may be formed in each of the second and third directions D2 and D3 on the first region I of the substrate 100, and thus a channel hole array may be defined. For example, the plurality of channel holes 210 may be spaced apart from each other in a horizontal direction (second direction D2 or third direction D3) parallel to the upper surface of the substrate 100.

Referring to FIGS. 10 and 11, a charge storage structure 250, a channel 260, a first filling pattern 270 and a capping pattern 280 may be formed in the channel hole 210.

A charge storage structure layer and a channel layer may be sequentially formed on a sidewall of the channel hole 210, the exposed upper surface of the substrate 100 (i.e., the bottom surface of the channel hole 210) and an upper surface of the first insulating interlayer 200, a filling layer may be formed on the channel layer to fill a remaining portion of the channel hole 210, and the filling layer, the channel layer and the charge storage structure layer may be planarized until the upper surface of the first insulating interlayer 200 is exposed. The planarization process may include a chemical mechanical polishing (CMP) process and/or an etch back process.

By the planarization process, the charge storage structure 250 and the channel 260, which may each have a cup-like shape and are sequentially stacked on the sidewall of the channel hole 210 and the upper surface of the substrate 100, may be formed, and the first filling pattern 270 may fill an inner space formed by the channel 260. The first filling pattern 270 may be formed to have a pillar shape. The channel 260 may be formed by, for example, an atomic layer deposition (ALD) process and/or a chemical vapor deposition (CVD) process. The first filling pattern 270 may be formed by a spin-on-glass (SOG) technique.

As the channel hole 210 in which the channel 260 is formed may define the channel hole array, and the channel 260 in the channel hole 210 may define a channel array.

In an example embodiment of the present inventive concept, the charge storage structure 250 may include a first blocking pattern 220, a charge storage pattern 230 and a tunnel insulation pattern 240 sequentially stacked. The first blocking pattern 220, the charge storage pattern 230, and the tunnel insulation pattern 240 may be conformally formed to have thicknesses that do not completely fill each of the channel holes 210, and may be formed by, for example, an atomic layer deposition (ALD) process and/or a chemical vapor deposition (CVD) process. For example, the first blocking pattern 220, the charge storage pattern 230 and the tunnel insulation pattern 240 may include an oxide, e.g., silicon oxide ($SiO_2$), a nitride, e.g., silicon nitride ($Si_3N_4$), and an oxide, e.g., silicon oxide ($SiO_2$), respectively.

The channel 260 may include, e.g., undoped polysilicon (p-Si), and the first filling pattern 270 may include an oxide, e.g., silicon oxide ($SiO_2$).

Upper portions of the first filling pattern 270, the channel 260 and the charge storage structure 250 may be removed to form a second recess, a capping layer may be formed on the first insulating interlayer 200 to fill the second recess, and the capping layer may be planarized until the upper surface of the first insulating interlayer 200 is exposed to form the capping pattern 280. The capping pattern 280 may include, e.g., doped polysilicon (p-Si).

The charge storage structure 250, the channel 260, the first filling pattern 270 and the capping pattern 280 in each of the channel holes 210 may form a pillar structure having a pillar shape.

Figure 12:
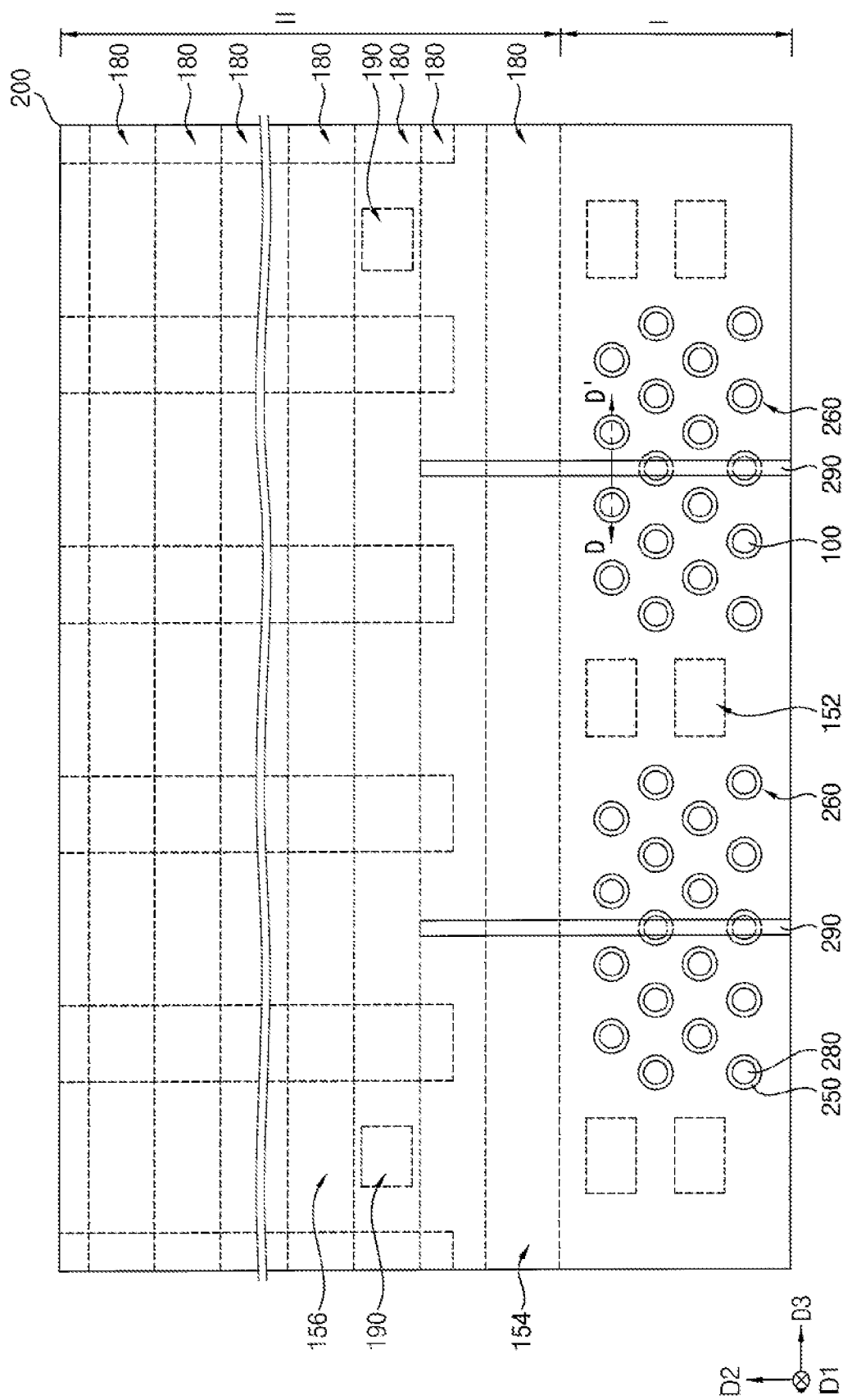

Referring to FIGS. 12 and 13, a second division pattern 290 may be formed through ones of the fourth sacrificial layers 180 and the insulation layers 170.

The second division pattern 290 may be formed by forming an etching mask on the first insulating interlayer 200, etching the first insulating interlayer 200, ones of the insulation layers 170 and the fourth sacrificial layers 180 through the etching mask to form a fifth opening, and filling the fifth opening with an insulating material.

In an example embodiment of the present inventive concept, the second division pattern 290 may extend through upper portions of ones of the channels 260. Additionally, the second division pattern 290 may extend through the first insulating interlayer 200, ones of the fourth sacrificial layers 180 at upper two levels, respectively, and ones of the insulation layers 170 at upper two levels, respectively, and further one of the insulation layers 170 directly thereunder. For example, the second division pattern 290 may penetrate an upper portion the further one of the insulation layers 170 directly thereunder. The second division pattern 290 may extend in the second direction D2 on the first and second regions I and II of the substrate 100, and extend through two upper step layers of the staircase structure. Accordingly, the ones of the fourth sacrificial layers 180 at the two upper levels, respectively, may be divided by the second division pattern 290 in the third direction D3. In an example embodiment of the present inventive concept, each of the second division patterns 290 on the first region I of the substrate 100 may be disposed between neighboring two of the first support patterns 152 arranged in the third direction D3.

Referring to FIGS. 14 to 17, a second insulating interlayer 300 may be formed on the first insulating interlayer 200, the capping pattern 280 and the second division pattern 290, and sixth to ninth openings 310, 320, 330 and 340 may be formed through the first and second insulating interlayers 200 and 300 and the mold by, e.g., a dry etching process. The dry etching process may be a vertical dry etching process such as, for example, reactive ion etching (RIE) process.

In an example embodiment of the present inventive concept, the dry etching process may be performed until an upper surface of the first support layer 150 or upper surfaces of the first to third support patterns 152, 154 and 156 are exposed, and an upper portion of the first support layer 150 or upper portions of the first to third support patterns 152, 154 and 156 may also be removed during the dry etching process. As the sixth to ninth openings 310, 320, 330 and 340 are formed, the insulation layers 170 and the fourth sacrificial layers 180 of the mold may be exposed. For example, the sidewalls of the insulation layers 170 and the fourth sacrificial layers 180 of the mold may be exposed by the sixth to ninth openings 310, 320, 330 and 340.

In an example embodiment of the present inventive concept, each of the sixth to eighth openings 310, 320 and 330 may extend in the second direction D2, and a plurality of sixth openings 310, a plurality of seventh openings 320, and a plurality of eighth openings 330 may be formed in the third direction D3. Each of the sixth to eighth openings 310, 320 and 330 may expose an upper surface of the second support pattern 154 or the third support pattern 156 on the second region II of the substrate 100, each of the sixth and seventh openings 310 and 320 may expose upper surfaces of the first support layer 150 and the first support pattern 152 on the first region I of the substrate 100, and the eighth opening 330 may be aligned with the second division pattern 290 in the second direction D2. The eighth openings 330 may not be formed on the first region I of the substrate 100.

As the sixth to seventh openings 310 and 320 are formed, the insulation layer 170 may be divided into a plurality of insulation patterns 175 each of which may extend in the second direction D2, and the fourth sacrificial layer 180 may be divided into a plurality of fourth sacrificial patterns 185 each of which may extend in the second direction D2. For example, the plurality of insulation patterns 175 and the plurality of fourth sacrificial patterns 185 may be divided by the sixth to seventh openings 310 and 320 in the third direction D3 on the first and second regions I and II of the substrate 100.

In an example embodiment of the present inventive concept, the sixth opening 310 may continuously extend in the second direction D2 on the first and second regions I and II of the substrate 100, while the seventh opening 320 may be discontinuous at a portion on the second region II of the substrate 100. Thus, the fourth sacrificial patterns 185 extending in the second direction D2 at opposite sides, respectively, of the seventh opening 320 in the third direction D3 may be connected with each other at the discontinuous portion of seventh opening 320. In an example embodiment of the present inventive concept, the discontinuous portion of the seventh opening 320, or a connecting portion of the fourth sacrificial patterns 185 may overlap one of the fourth sacrificial patterns 185 at a third level from above and the first division pattern 190 in the first direction D1.

In an example embodiment of the present inventive concept, the eighth opening 330 may not extend continuously but may be discontinuous at a portion on the second region II of the substrate 100, and thus a plurality of eighth openings 330 may be formed to be spaced apart from each other in the second direction D2 on the second region II of the substrate 100. In an example embodiment of the present inventive concept, each of the sixth openings 310 on the second region II of the substrate 100 may be disposed between neighboring two of the eighth openings 330 arranged in the third direction D3. For example, the eighth opening 330 may be disposed between the sixth opening 310 and the seventh opening 320 in the third direction D3.

In an example embodiment of the present inventive concept, a plurality of ninth openings 340 may be spaced apart from each other in the second direction D2 on the second region II of the substrate 100. In an example embodiment of the present inventive concept, each of the ninth openings 340 may extend through the steps of the mold. The ninth openings 340 may be formed between the sixth and eighth openings 310 and 330 neighboring in the third direction D3 or between the seventh and eighth openings 320 and 330 neighboring in the third direction D3. However, the ninth openings 340 each of which extends through upper two steps of the mold may be formed between the sixth opening 310 and the second division pattern 290 and between the seventh opening 320 and the second division pattern 290. The steps may be arranged in the second direction D2 on the second region II of the substrate 100, and thus, the upper two steps of the mold may be the closest two steps to the first region I of the substrate 100 among the steps of the mold.

In an example embodiment of the present inventive concept, each of the ninth openings 340 may have bar shape extending in the second direction D2 in a plan view, and a pair of ninth openings 340 spaced apart from each other in the third direction D3 may be formed between the sixth and eighth openings 310 and 330, between the seventh and eighth openings 320 and 330, between the sixth opening 310 and the second division pattern 290, or between the seventh opening 320 and the second division pattern 290. However, the present inventive concept may not be limited thereto, and the shape and layout of the ninth openings 340 may be various, which will be illustrated below.

In an example embodiment of the present inventive concept, each of the ninth openings 340 may expose an upper surface of the second support pattern 154 or the third support pattern 156 on the second region II of the substrate 100.

Figure 18:
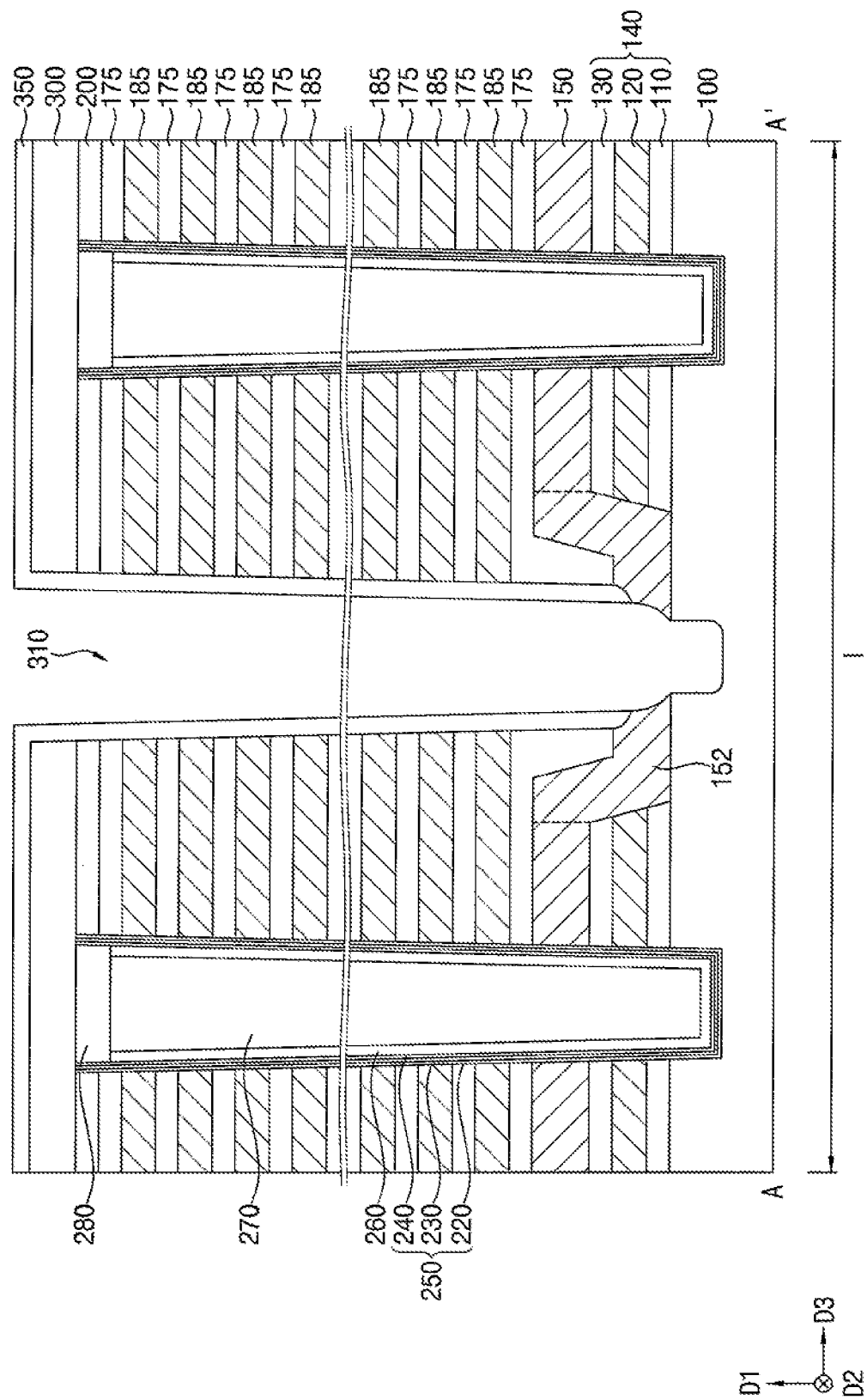
Figure 19:
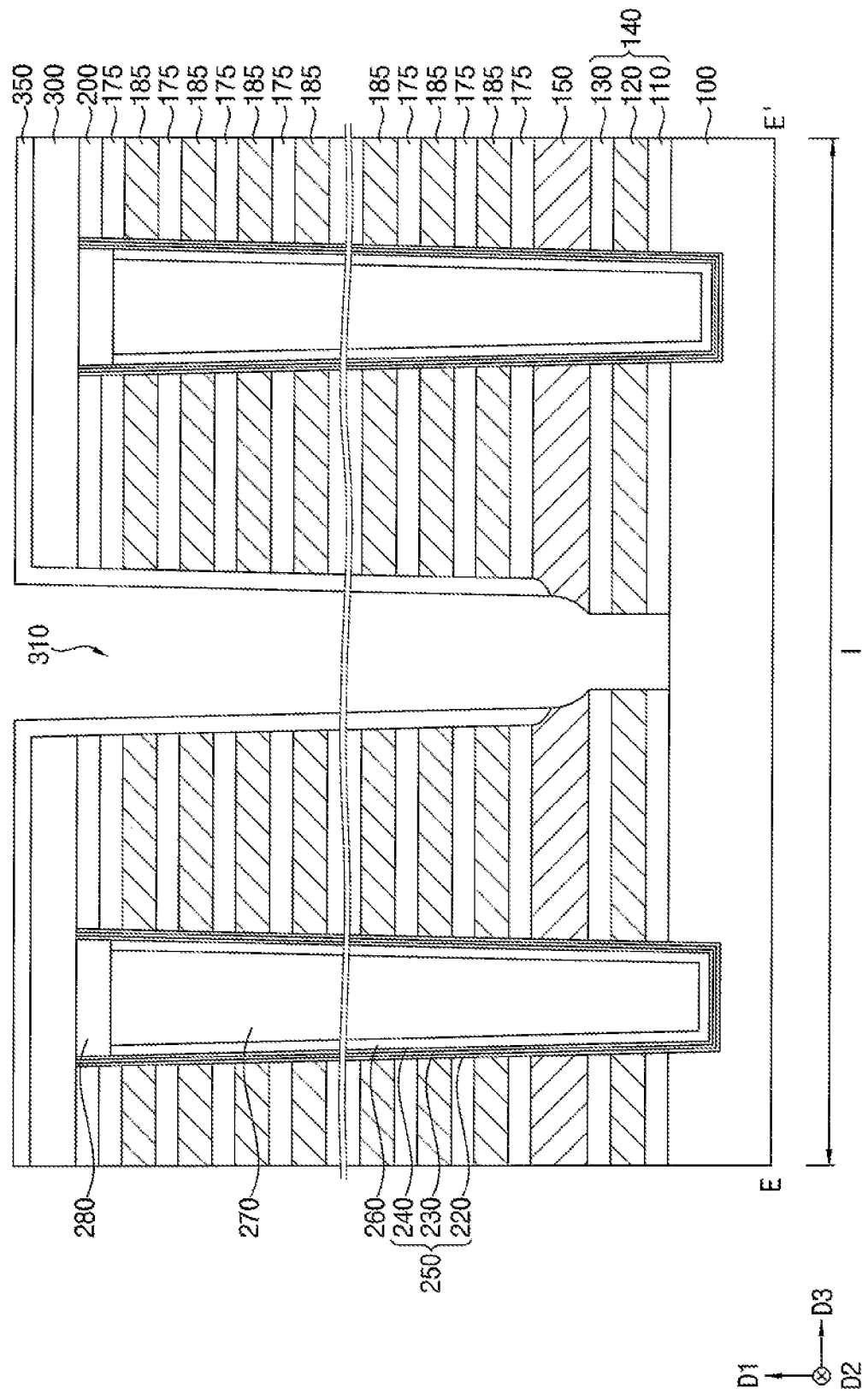

Referring to FIGS. 18 and 19, a first spacer layer may be formed on sidewalls of the sixth to ninth openings 310, 320, 330 and 340 and an upper surface of the second insulating interlayer 300, and portions of the first spacer layer on bottoms of the sixth to ninth openings 310, 320, 330 and 340 may be removed by an anisotropic etching process to form a first spacer 350, and thus upper surfaces of the first support layer 150 and the first to third support patterns 152, 154 and 156 may be partially exposed.

The exposed portions of the first support layer 150 and the first to third support patterns 152, 154 and 156 and a portion of the first sacrificial layer structure 140 thereunder may be removed by an etching process so that the sixth to ninth openings 310, 320, 330 and 340 may be enlarged downwardly. Each of the sixth and seventh openings 310 and 320 may extend through the first support layer 150 and the first sacrificial layer structure 140 to expose an upper surface of the substrate 100 and sidewalls of the first sacrificial layer structure 140 on the first region I of the substrate 100, and each of the sixth to ninth openings 310, 320, 330 and 340 may extend through a corresponding one of the first to third support patterns 152, 154 and 156 on the first and second regions I and II of the substrate 100 to expose an upper surface of the substrate 100, and may extend through a portion of the substrate 100.

In an example embodiment of the present inventive concept, the first spacer 350 may include, e.g., undoped amorphous silicon (a-Si) or undoped polysilicon (p-Si). When the first spacer 350 includes undoped amorphous silicon (a-Si), the undoped amorphous silicon (a-Si) may be crystallized during other deposition processes.

Figure 20:
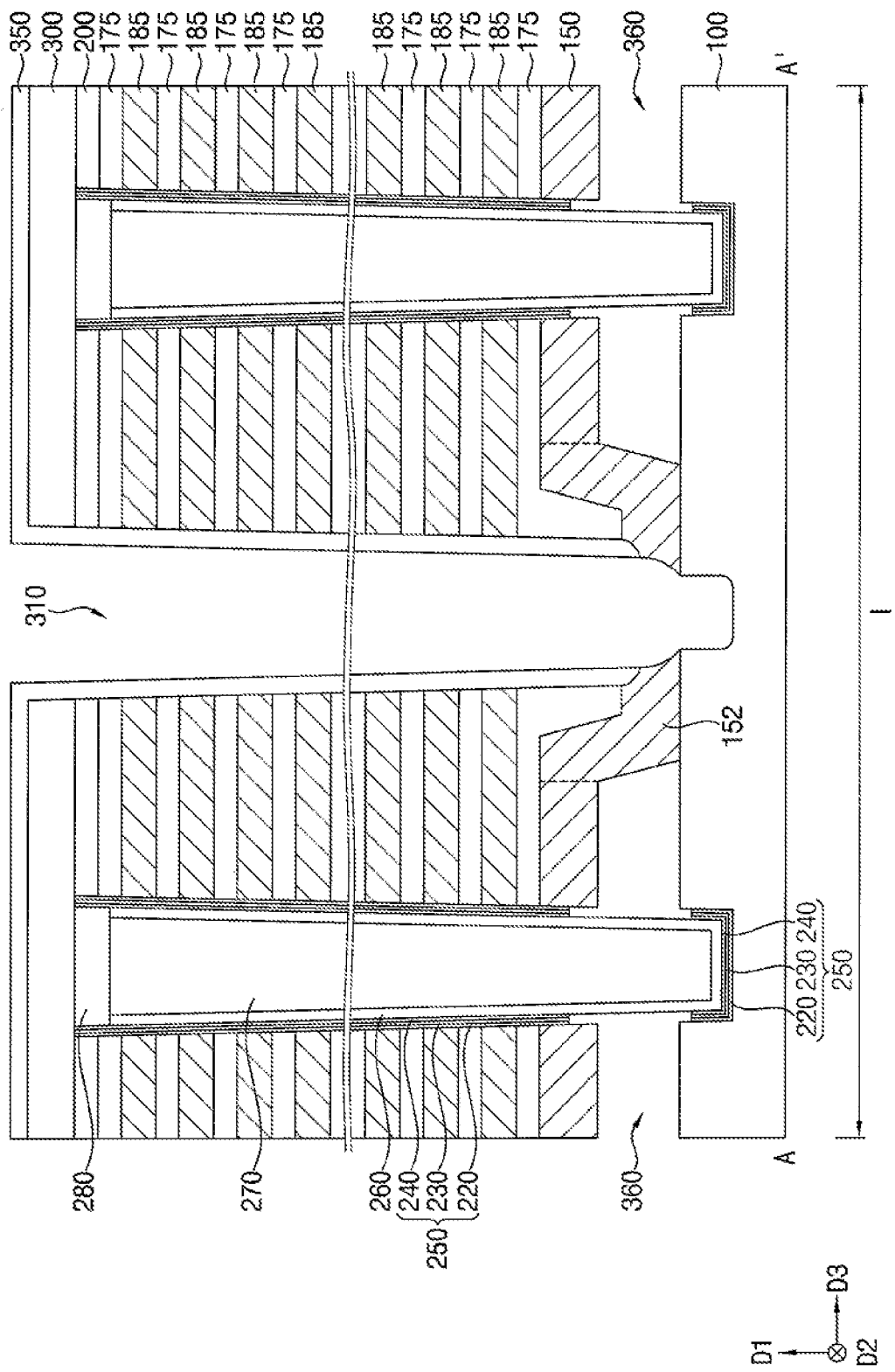
Figure 21:
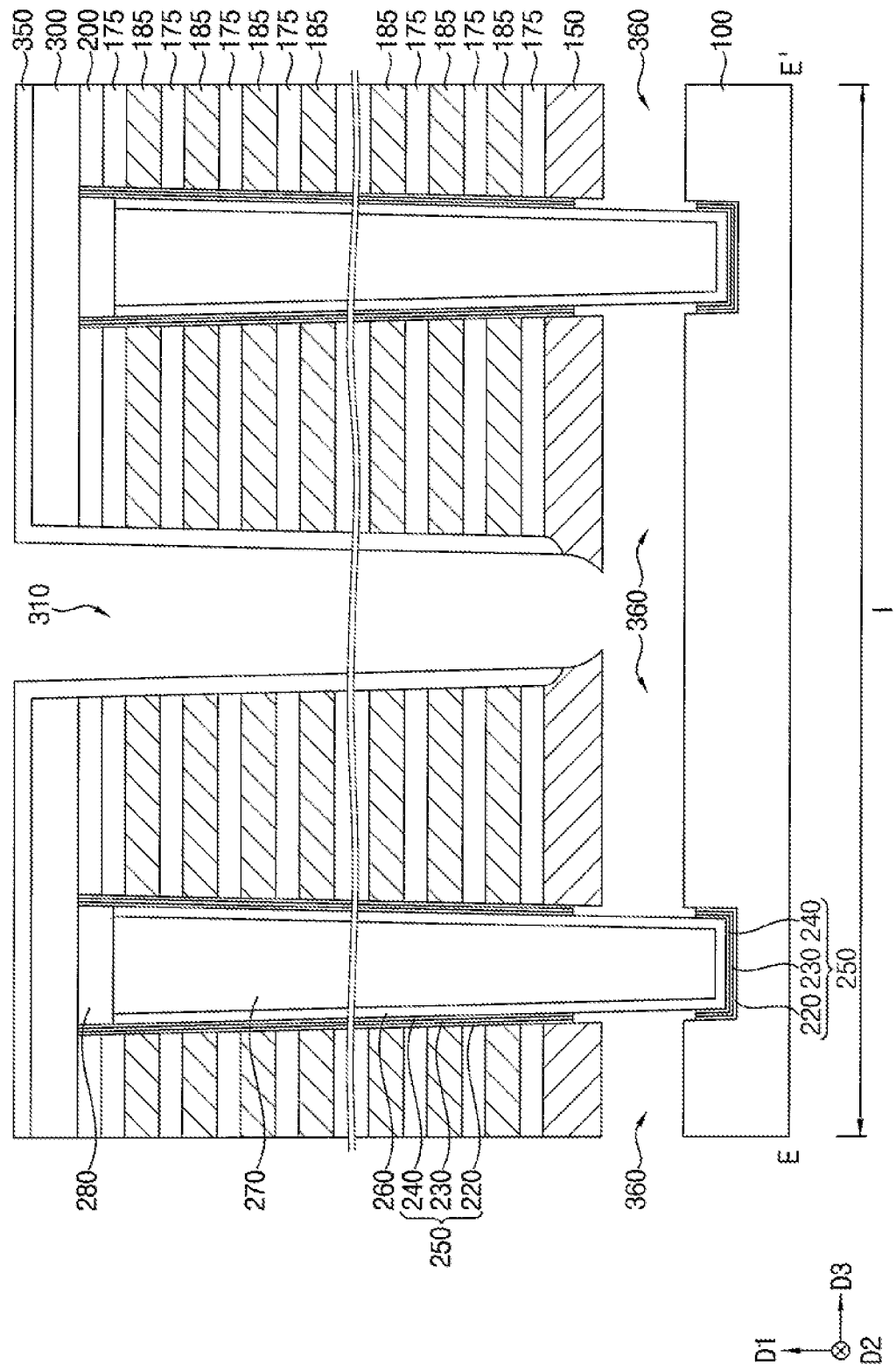

Referring to FIGS. 20 and 21, the first sacrificial layer structure 140 exposed by the sixth to ninth openings 310, 320, 330 and 340 may be partially removed to form a first gap 360.

The first sacrificial layer structure 140 may be removed by a wet etching process using, e.g., hydrofluoric acid (HF) or phosphoric acid ($H_3PO_4$). For example, when the second sacrificial layer 120 of the first sacrificial layer structure 140 is formed of silicon nitride ($Si_3N_4$) and the first and third sacrificial layers 110 and 130 of the first sacrificial layer structure 140 are formed of silicon oxide ($SiO_2$), the second sacrificial layer 120 may be removed by an etching process using an etching solution including phosphoric acid ($H_3PO_4$), and the first and third sacrificial layers 110 and 130 may be removed by an etching process using an etching solution including hydrofluoric acid (HF).

The sixth to ninth openings 310, 320, 330 and 340 may extend through the second and third support patterns 154 and 156 and may not expose the first sacrificial layer structure 140 on the second region II of the substrate 100, and thus the first gap 360 may be formed only on the first region I of the substrate 100. As the first gap 360 is formed, a lower portion of the first support layer 150 and an upper surface of the substrate 100 may be exposed on the first region I of the substrate 100. However, the present inventive concept may not be limited thereto. For example, the first gap 360 may also be formed on the second region II of the substrate 100.

In an example embodiment of the present inventive concept, when the first sacrificial layer structure 140 is removed to form the first gap 360, a portion of the charge storage structure 250 exposed by the first gap 360 may be also removed to expose an outer sidewall of the channel 260, and thus the charge storage structure 250 may be separated into an upper portion extending through the mold to cover most of the outer sidewall of the channel 260 and a lower portion covering some portion of the outer sidewall and a bottom surface of the channel 260 on the substrate 100. In the process of removing the first sacrificial layer structure 140, the wet etchant may not only etch the charge storage structure 250 located between the channel 260 and the first sacrificial layer structure 140, but also etch upward to remove a portion of the charge storage structure 250 located between the channel 260 and the first support layer 150 and downward to remove a portion of the charge storage structure 250 located between the channel 260 and the substrate 100.

In an example embodiment of the present inventive concept, an upper surface of a portion of the first gap 360 adjacent to the outer sidewall of the channel 260 may be higher than the lower surface of the first support layer 150, and a lower surface of the portion of the first gap 360 adjacent to the outer sidewall of the channel 260 may be lower than the upper surface of the substrate 100.

When the first gap 360 is formed, the first support layer 150 and the first to third support patterns 152, 154 and 156 may not be removed, and thus the mold may not fall down by the first support layer 150, the first to third support patterns 152, 154 and 156, the channel 260 and the first filling pattern 270.

Figure 22:
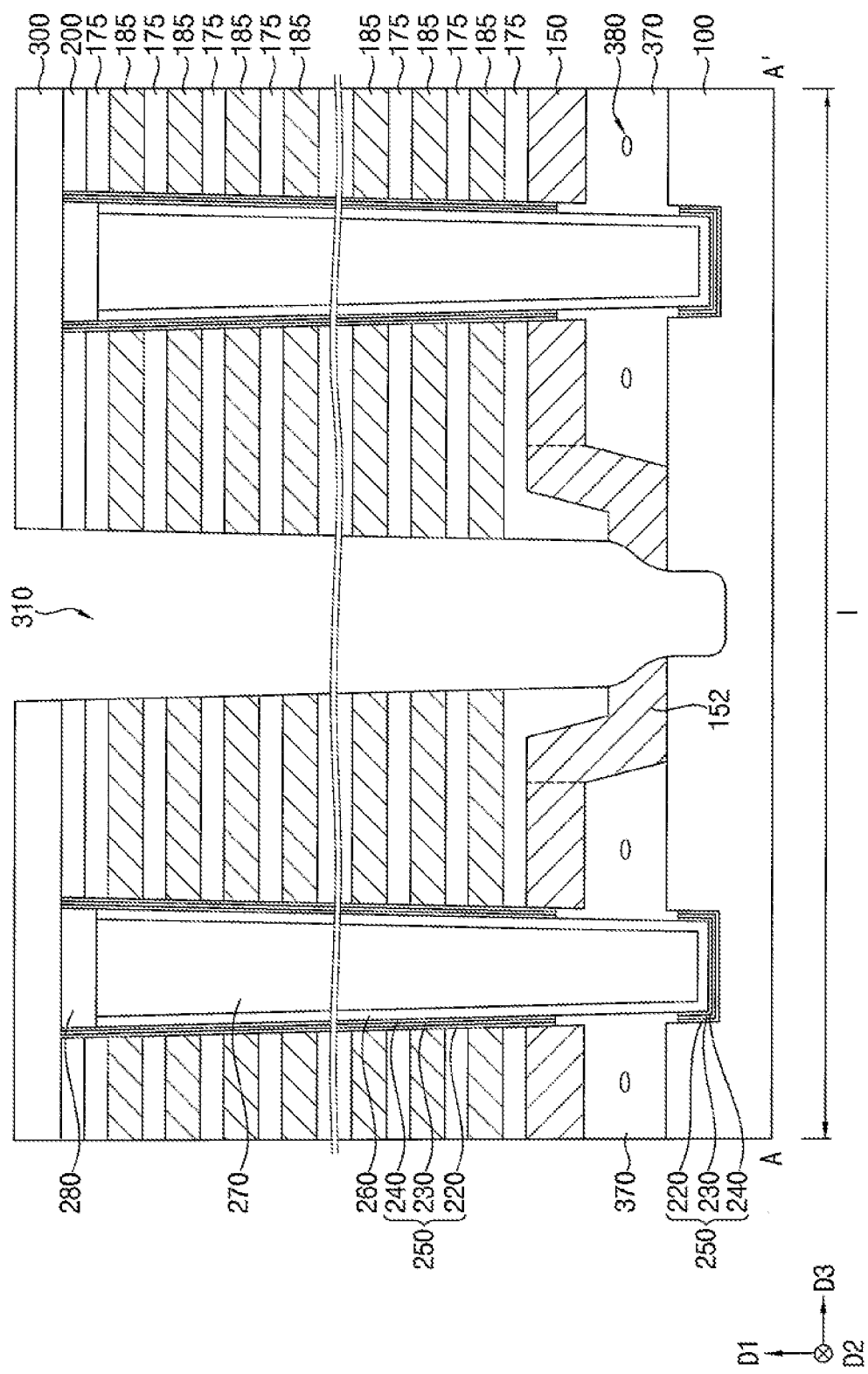
Figure 23:
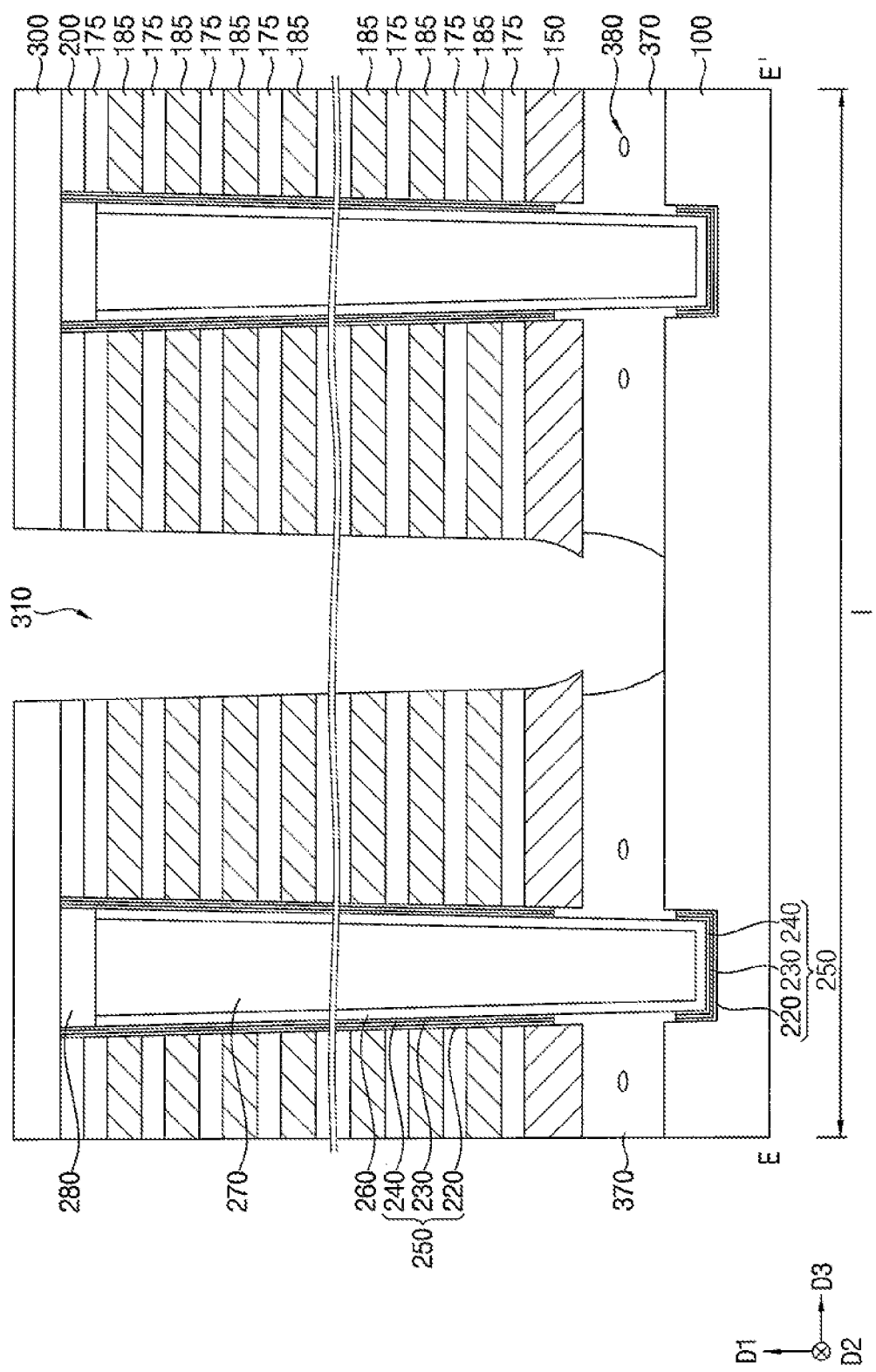
Figure 24:
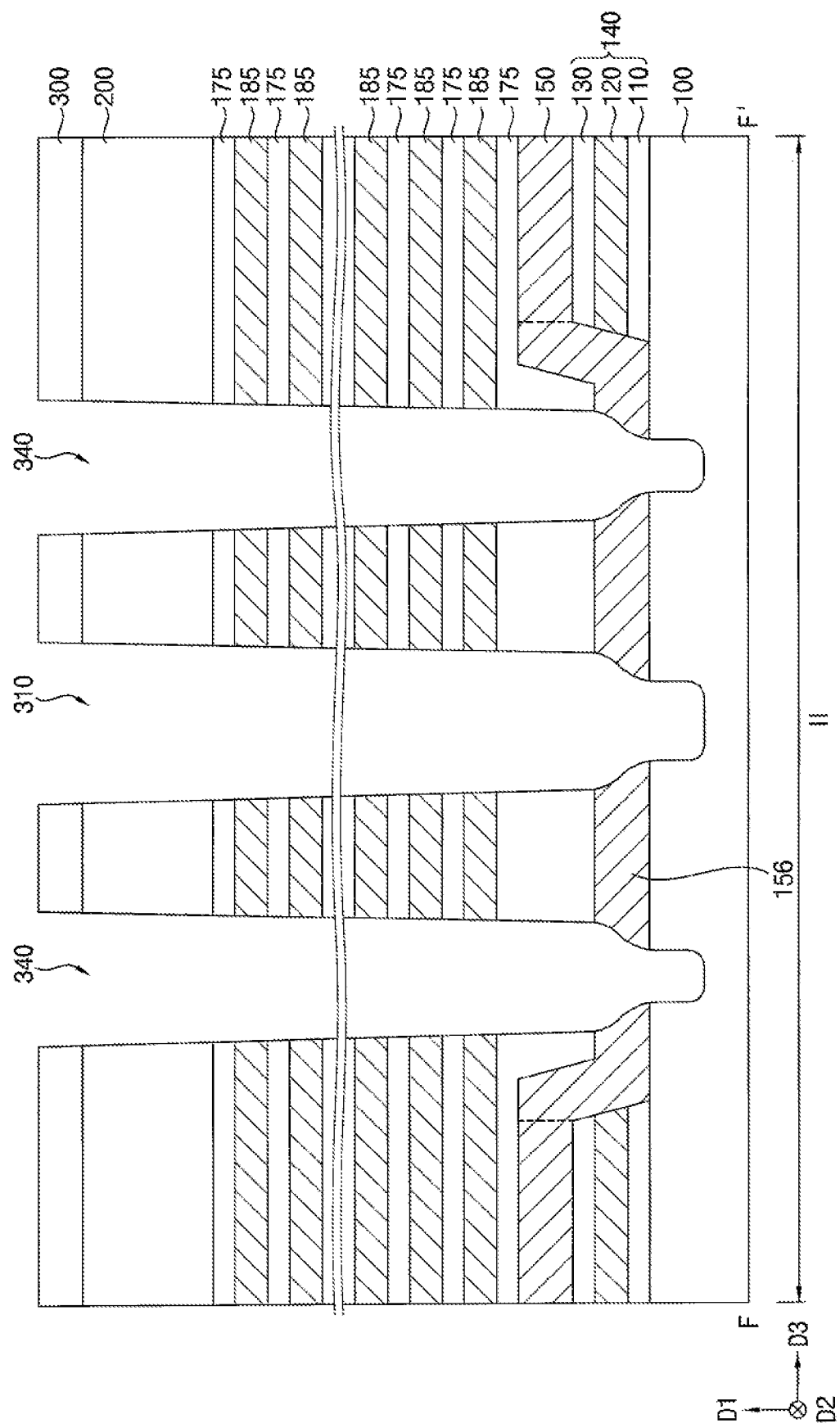
Figure 25:
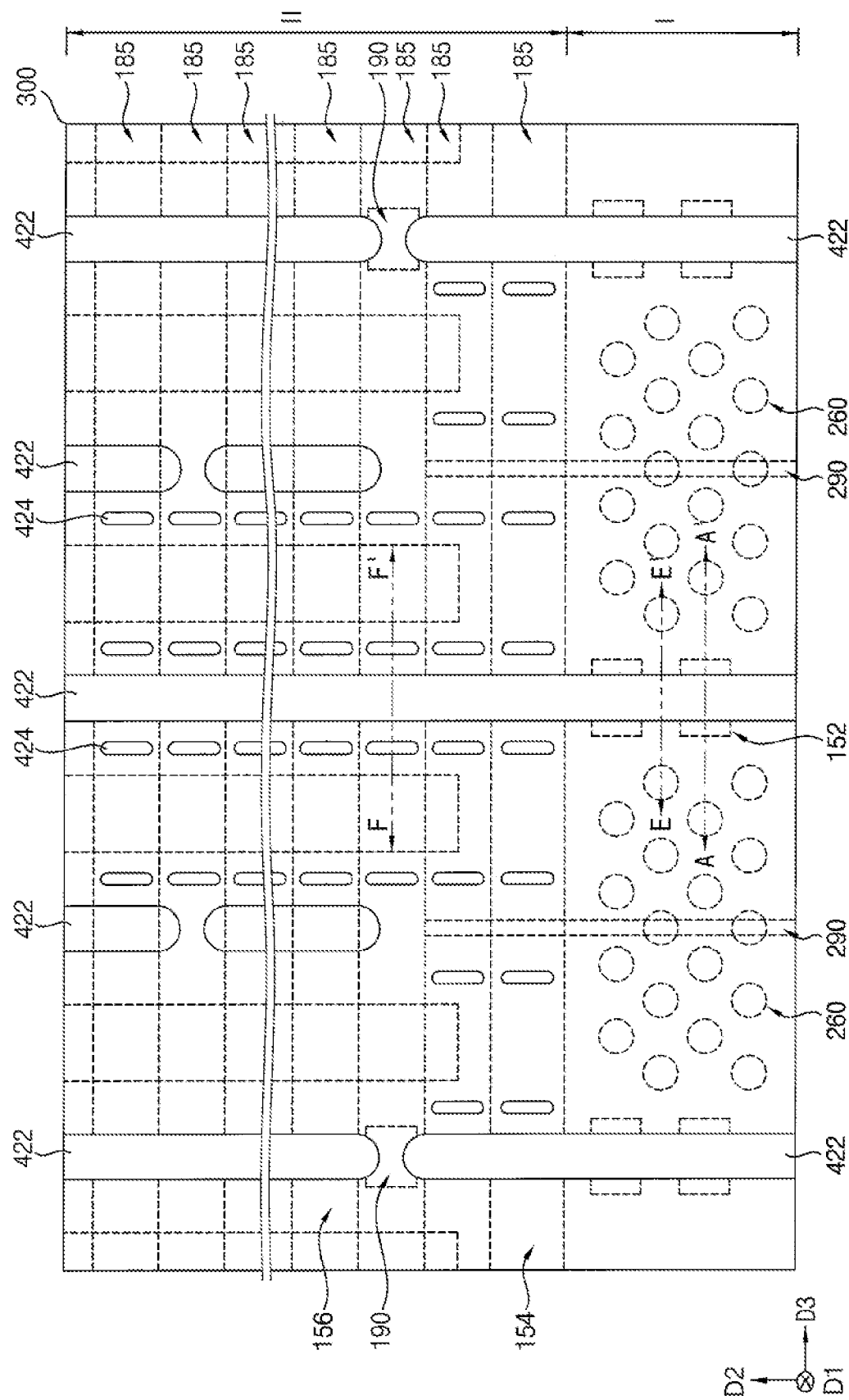
Figure 26:
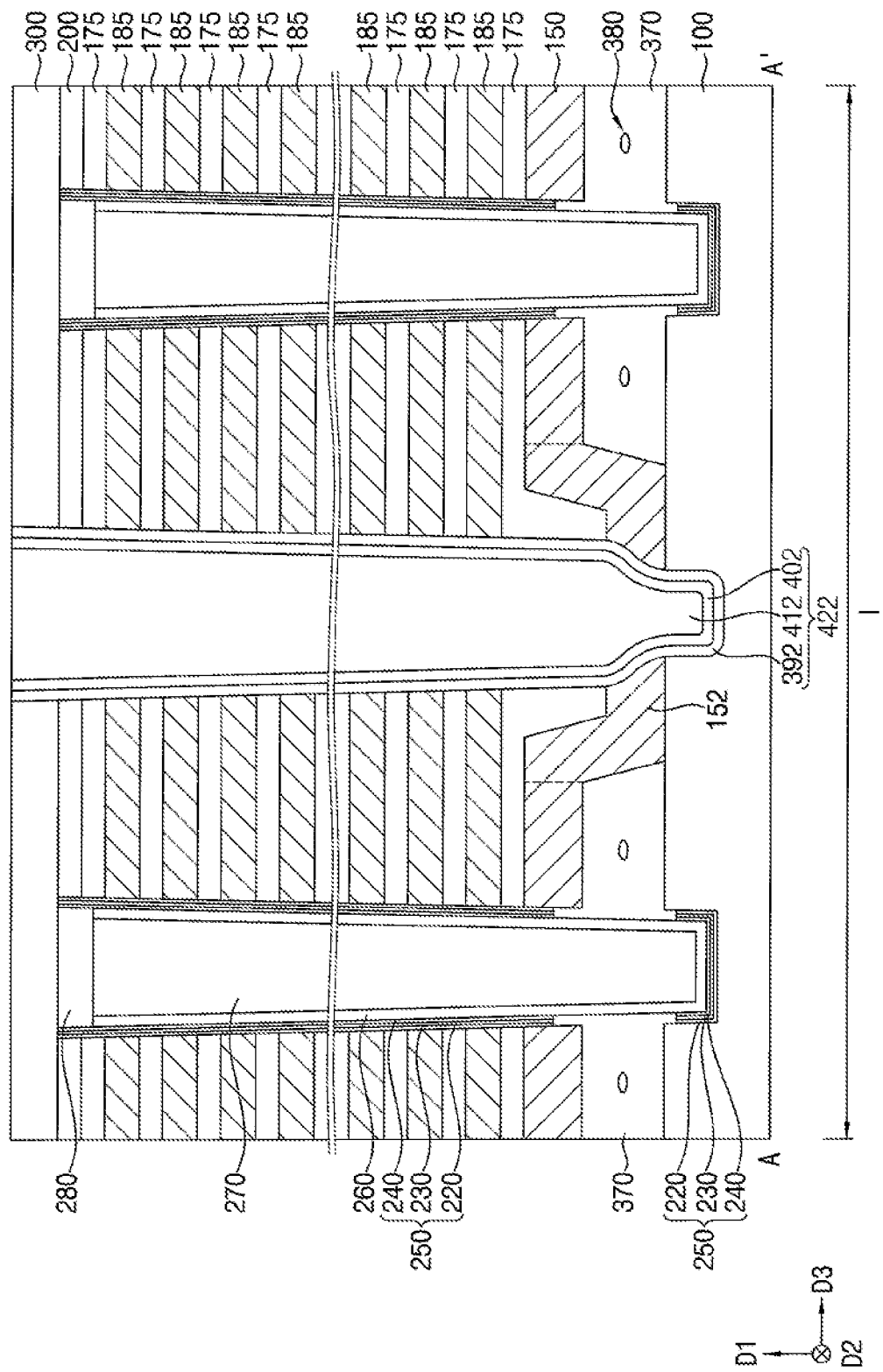
Figure 27:
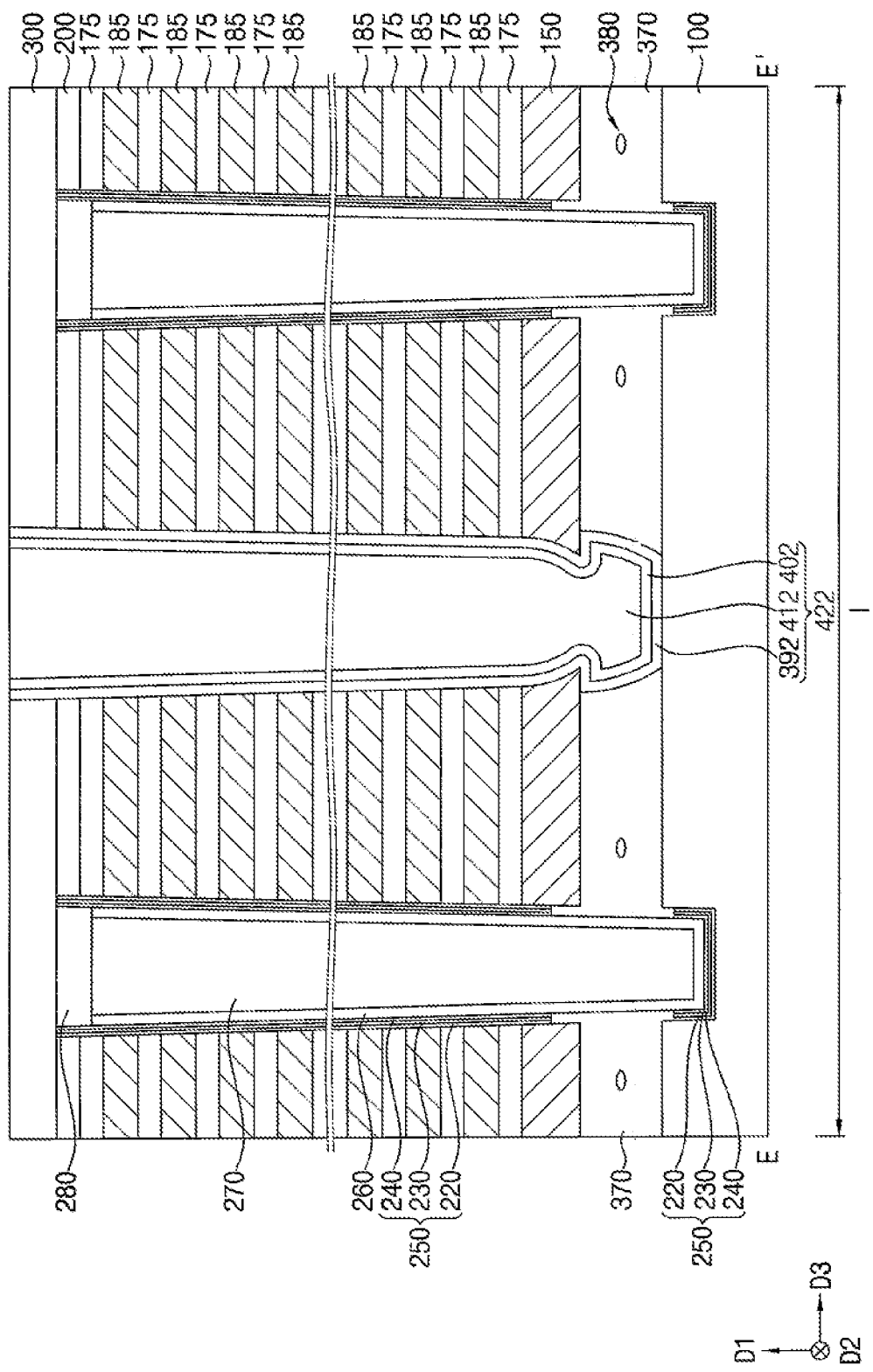
Figure 28:
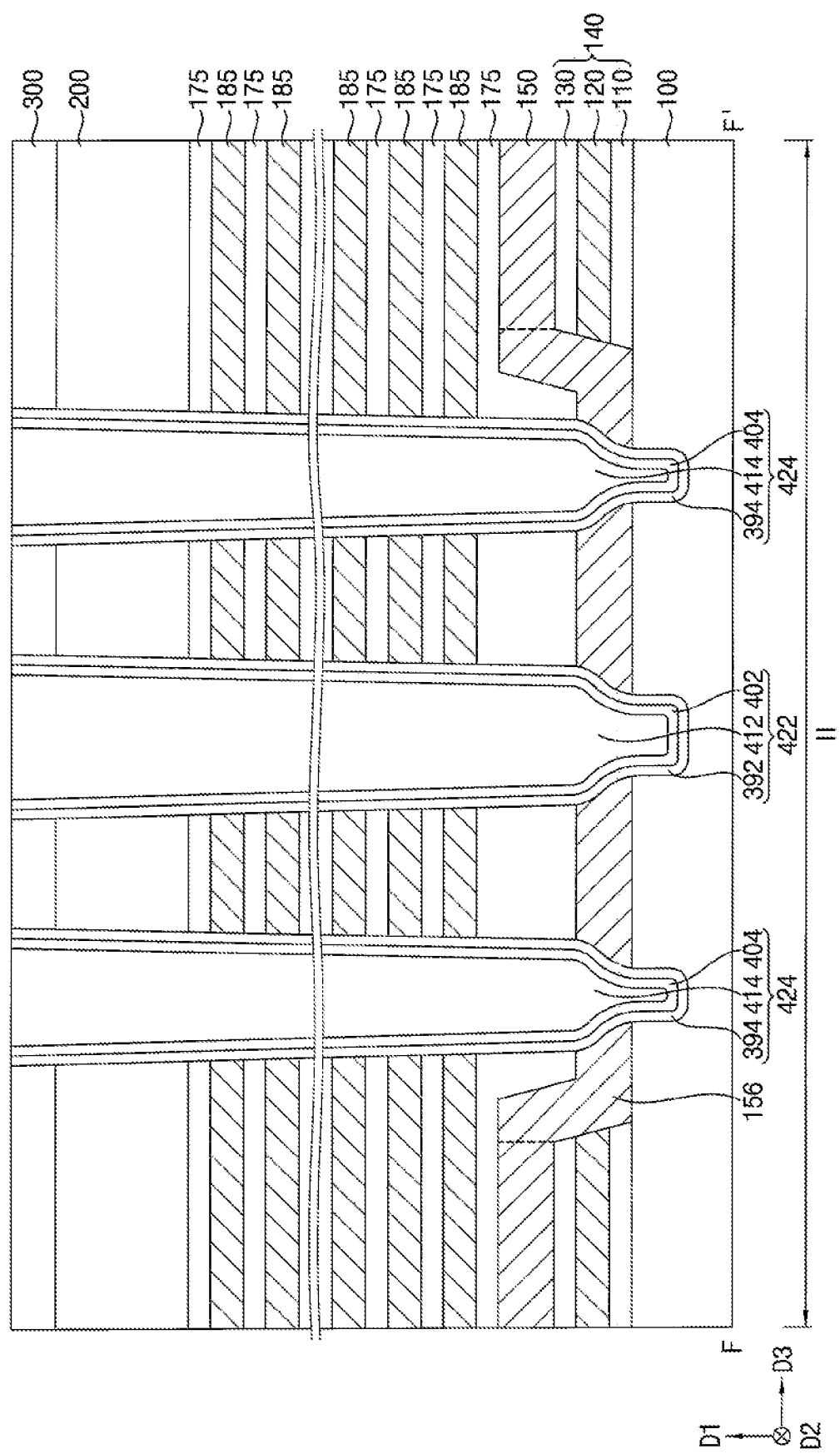

Referring to FIGS. 22 to 24, after removing the first spacer 350, a channel connecting layer may be formed to fill the first gap 360 in the sixth to ninth openings 310, 320, 330 and 340, and partially removed by, e.g., an etch back process to form a channel connection pattern 370 in the first gap 360.

The channel connection pattern 370 may include, e.g., amorphous silicon (a-Si) doped with n-type impurities. The channel connection pattern 370 may be crystallized later during other deposition processes so as to include polysilicon (p-Si). As the channel connection pattern 370 filling the first gap 360 is formed, the channels 260 of the channel array may be connected with each other. In an example embodiment of the present inventive concept, the channel connection pattern 370 may be formed by depositing amorphous silicon (a-Si), and crystallizing the amorphous silicon (a-Si) by a heat treatment process so that the channel connection pattern 370 may include polysilicon (p-Si).

An air gap 380 may be formed in the channel connection pattern 370.

Referring to FIGS. 25 to 28, a sacrificial structure 422 filling the sixth to eighth openings 310, 320 and 330 and a support structure 424 filling the ninth opening 340 may be formed.

The sacrificial structure 422 and the support structure 424 may be formed by sequentially forming an etch stop layer and a second spacer layer on sidewalls of the sixth to ninth openings 310, 320, 330 and 340, and the exposed upper surfaces of the first support layer 150, the first to third support patterns 152, 154 and 156, and the substrate 100, forming a fifth sacrificial layer on the second spacer layer to fill the sixth to ninth openings 310, 320, 330 and 340, and planarizing a second sacrificial layer structure including the fifth sacrificial layer, the second spacer layer and the etch stop layer.

The sacrificial structure 422 may include a first etch stop pattern 392, a second spacer 402 and a fifth sacrificial pattern 412 sequentially stacked, and the support structure 424 may include a second etch stop pattern 394, a third spacer 404 and a second filling pattern 414 sequentially stacked. The first etch stop pattern 392, the second spacer 402 and the fifth sacrificial pattern 412 of the sacrificial structure 422 may be formed from the etch stop layer, the second spacer layer and the fifth sacrificial layer of the second sacrificial layer structure, respectively. Similarly, the second etch stop pattern 394, the third spacer 404 and the second filling pattern 414 of the support structure 424 may be formed from the etch stop layer, the second spacer layer and the fifth sacrificial layer of the second sacrificial layer structure, respectively.

The etch stop layer may include a material having an etching selectivity with respect to the fourth sacrificial pattern 185, e.g., an oxide such as silicon oxide ($SiO_2$). The second spacer layer may include a nitride, e.g., silicon nitride ($Si_3N_4$), and the fifth sacrificial layer may include, e.g., polysilicon (p-Si).

Alternatively, the second spacer layer may not be formed, and thus the sacrificial structure 422 may include the first etch stop pattern 392 and the fifth sacrificial pattern 412, and the support structure 424 may include the second etch stop pattern 394 and the second filling pattern 414. Each of the fifth sacrificial pattern 412 and the second filling pattern 414 may include, e.g., polysilicon (p-Si) or a nitride such as silicon nitride ($Si_3N_4$). Each of the first etch stop pattern 392 and the second etch stop pattern 394 may include, e.g., an oxide such as silicon oxide ($SiO_2$).

Figure 29:
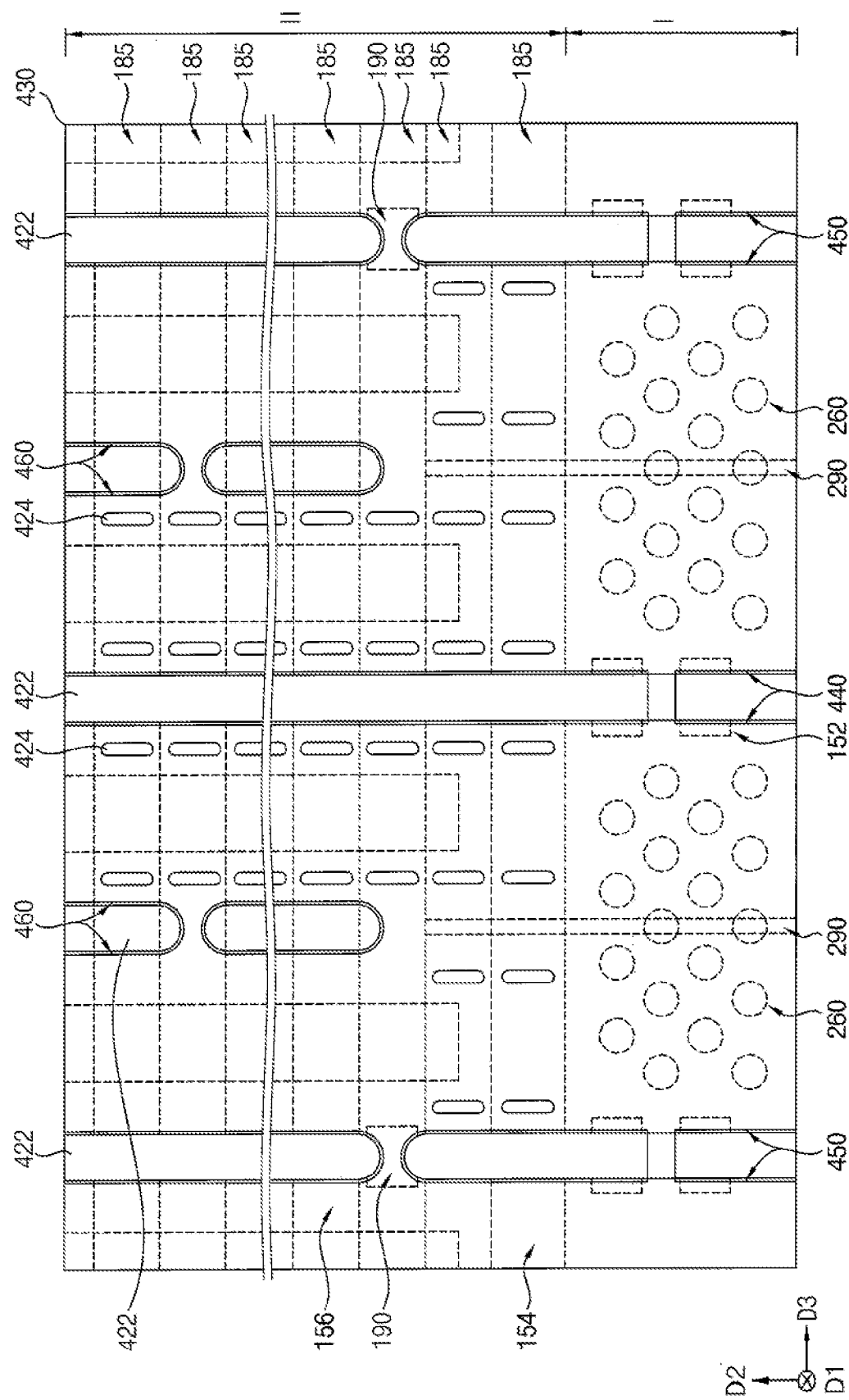
Figure 30:
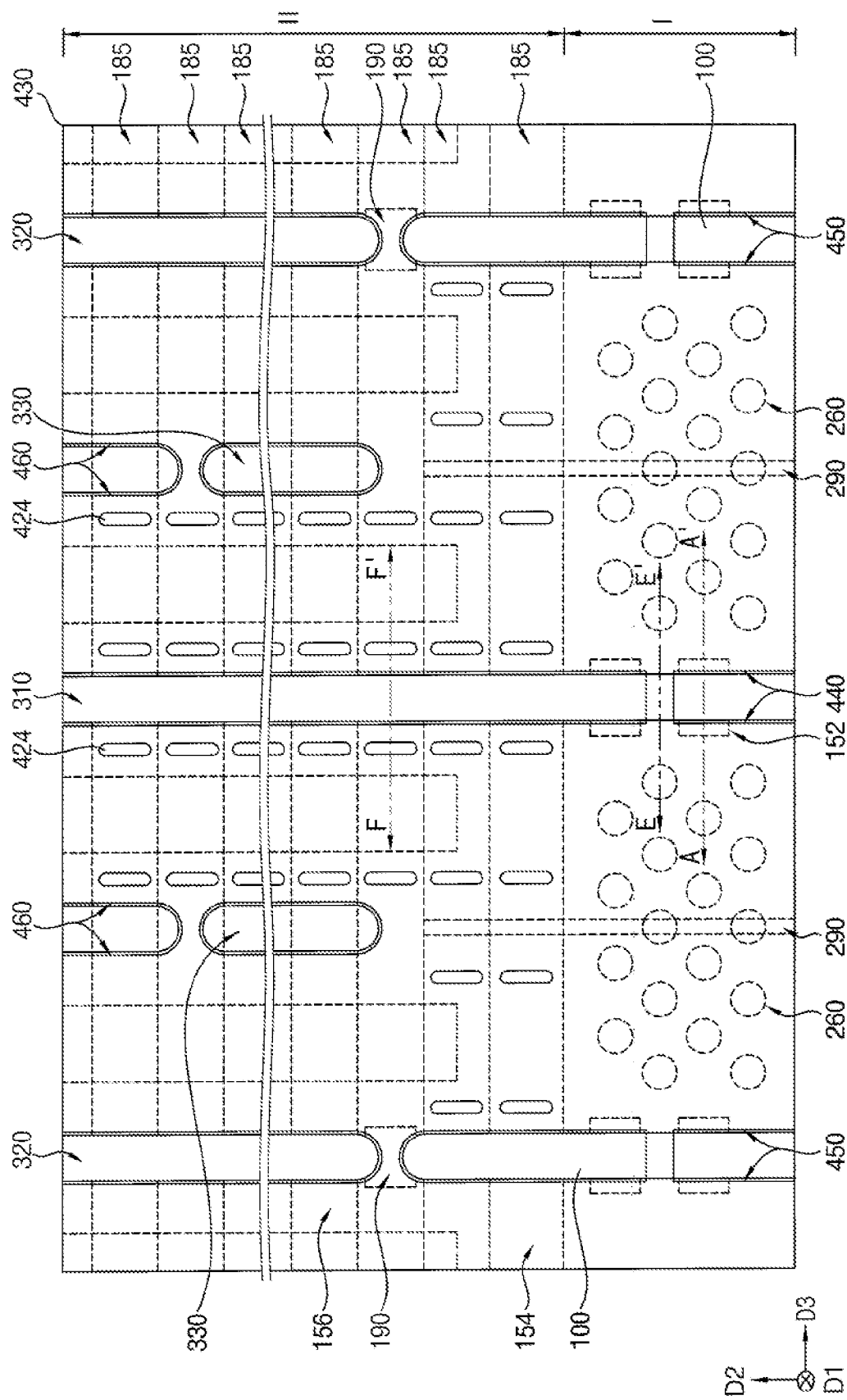
Figure 31:
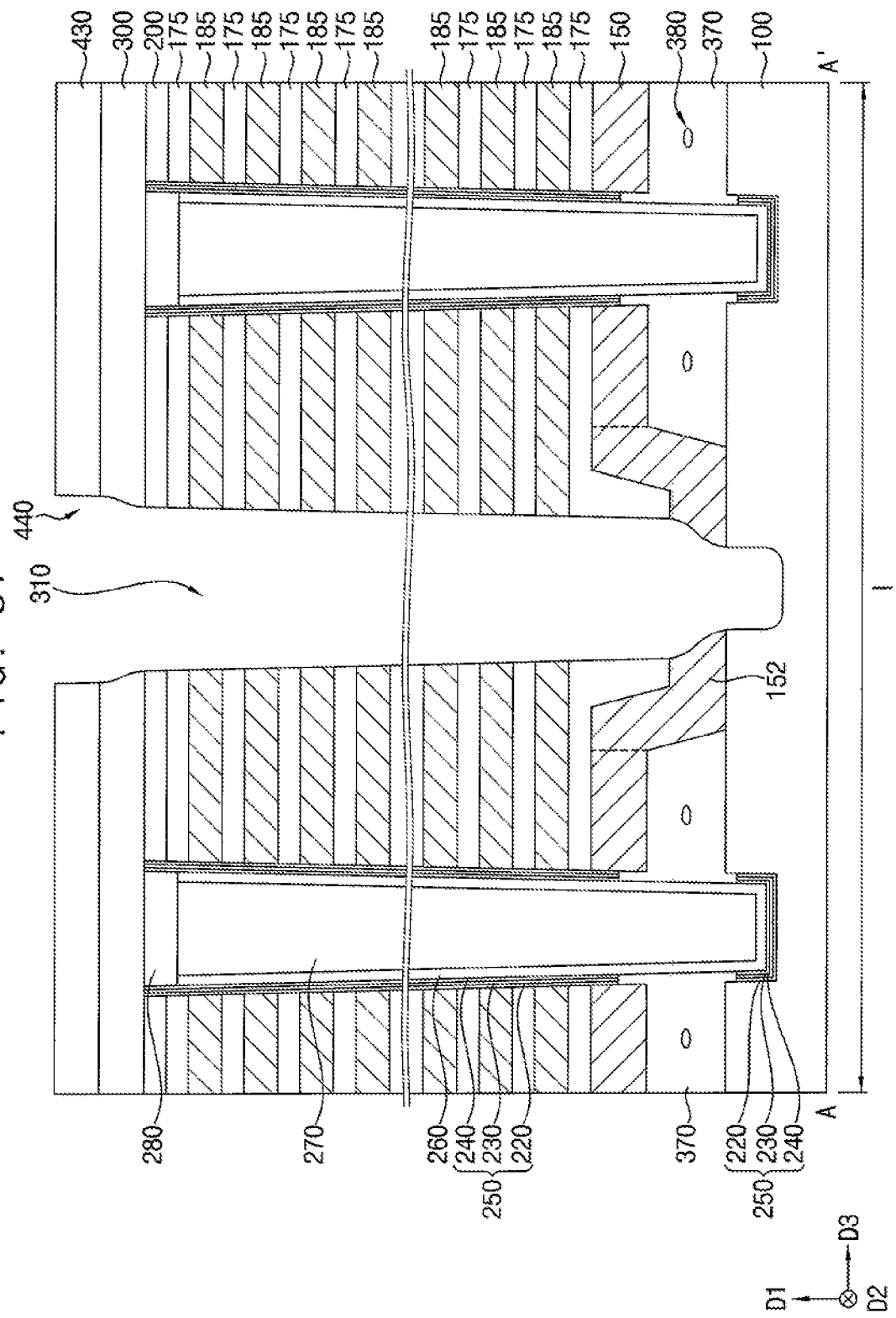
Figure 32:
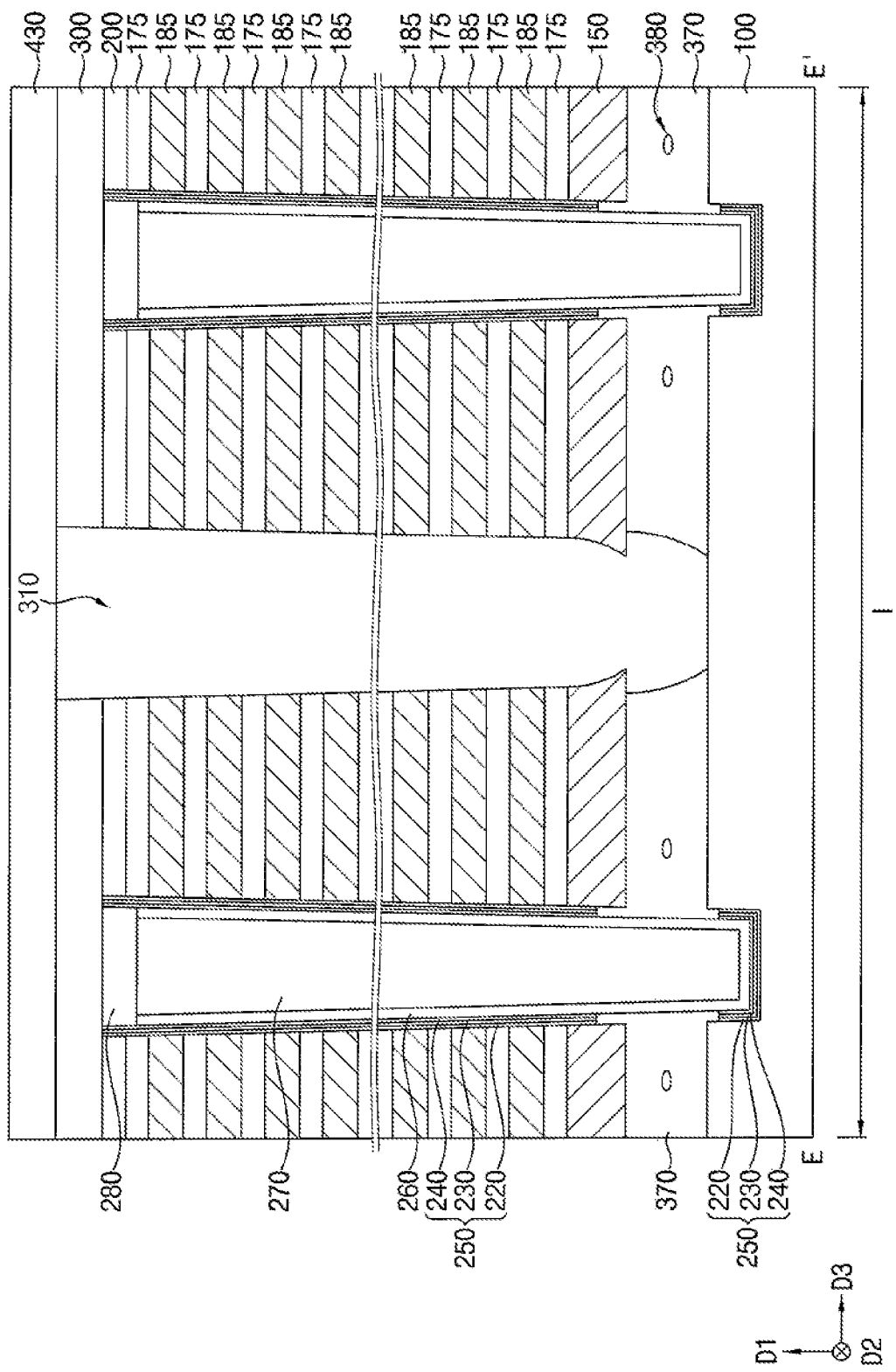
Figure 33:
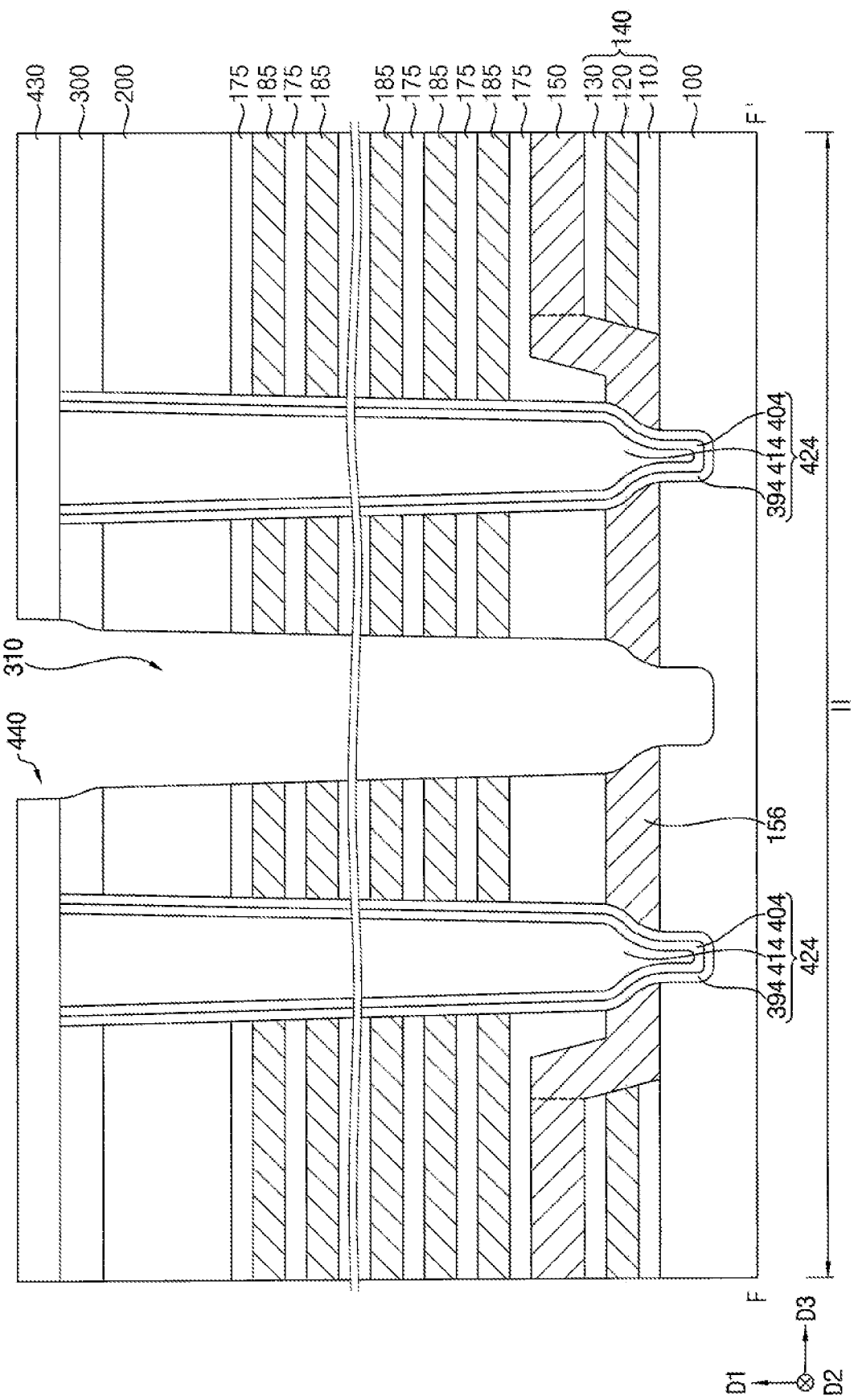

Referring to FIG. 29, a second support layer 430 may be formed on the second insulating interlayer 300, the sacrificial structure 422 and the support structure 424, and may be partially etched to form tenth to twelfth openings 440, 450 and 460 corresponding to the sixth to eighth openings 310, 320 and 330, respectively.

In an example embodiment of the present inventive concept, the tenth opening 440 may overlap the sacrificial structure 422 in the sixth opening 310 in the first direction D1. The tenth opening 440 may extend continuously in the second direction D2 on the second region II of the substrate 100, while a plurality of tenth openings 440 may be spaced apart from each other in the second direction D2 on the same sacrificial structure 422 on the first region I of the substrate 100. For example, the plurality of tenth openings 440 may be spaced apart from each other in the second direction D2 by the second support layer 430 located between the first support patterns 152 in a plan view. In an example embodiment of the present inventive concept, the tenth opening 440 may have a width in the third direction D3 greater than that of the sacrificial structure 422, however, the present inventive concept may not be limited thereto.

In an example embodiment of the present inventive concept, the eleventh opening 450 may overlap the sacrificial structure 422 in the seventh opening 320 in the first direction D1. The eleventh opening 450 may extend continuously in the second direction D2 on the second region II of the substrate 100, except for an area overlapping the first division pattern 190 in the first direction D1, while a plurality of eleventh openings 450 may be spaced apart from each other in the second direction D2 on the same sacrificial structure 422 on the first region I of the substrate 100. For example, the plurality of eleventh openings 450 may be spaced apart from each other in the second direction D2 by the second support layer 430 located between the first support patterns 152 in a plan view.

In an example embodiment of the present inventive concept, the twelfth opening 460 may overlap the sacrificial structure 422 in the eighth opening 330 in the first direction D1. A plurality of twelfth openings 460 may not be formed on the first region I of the substrate 100, and may be formed to be spaced apart from each other in the second direction D2 on the second region II of the substrate 100. Thus, the plurality of twelfth openings 460 may be spaced apart from each other in the second direction D2 on the second region II of the substrate 100.

The second support layer 430 may include an oxide, e.g., silicon oxide ($SiO_2$).

Referring to FIGS. 30 to 33, the sacrificial structure 422 may be removed by an etching process through the tenth to twelfth openings 440, 450 and 460, and thus the sixth to eighth openings 310, 320 and 330 may be formed again.

The tenth and eleventh openings 440 and 450 may not entirely expose but partially cover the sacrificial structure 422 at least on the first region I of the substrate 100, and thus, even though the sixth to eighth openings 310, 320 and 330 are formed again by the etching process, tops of the sixth to eighth openings 310, 320 and 330 may be partially covered by the second support layer 430. Accordingly, even though the mold has a high upper surface and a large extension length in the second direction D2, the mold may not lean or fall down by the second support layer 430 at least partially covering the tops of the sixth to eighth openings 310, 320 and 330.

In an example embodiment of the present inventive concept, the sacrificial structure 422 may be removed by a wet etching process.

The support structure 424 may be entirely covered by the second support layer 430 and not be exposed, and thus may not be removed by the etching process.

In an example embodiment of the present inventive concept, the support structure 424 may be formed by first, sequentially forming an etch stop layer and a second spacer layer on sidewalls of the sixth to ninth openings 310, 320, 330 and 340, and the exposed upper surfaces of the first support layer 150, the first to third support patterns 152, 154 and 156, and the substrate 100, forming a fifth sacrificial layer on the second spacer layer to fill the sixth to ninth openings 310, 320, 330 and 340, and planarizing a second sacrificial layer structure including the fifth sacrificial layer, the second spacer layer and the etch stop layer. After planarizing the second sacrificial layer structure, a second support layer 430 may be formed on the mold and the second sacrificial layer structure, and may be partially etched to form tenth to twelfth openings 440, 450 and 460 respectively exposing portions of the second sacrificial layer structure corresponding to the sixth to eighth openings 310, 320 and 330. Subsequently, the portions of the second sacrificial layer structure corresponding to the sixth to eighth openings 310, 320 and 330 may be removed, while a portion of the second sacrificial layer structure corresponding to the ninth opening 340 may remain as the support structure 424.

Figure 34:
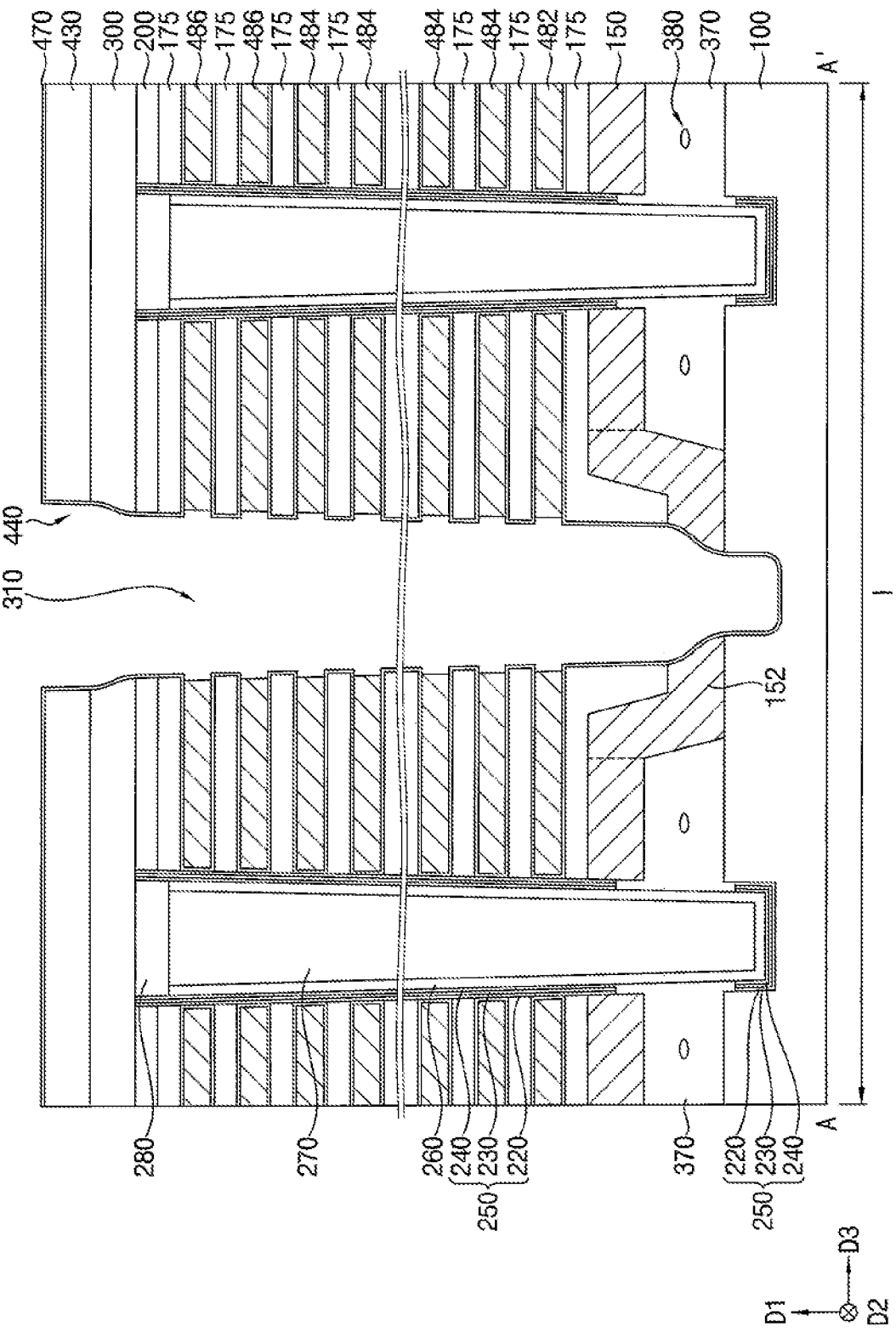
Figure 35:
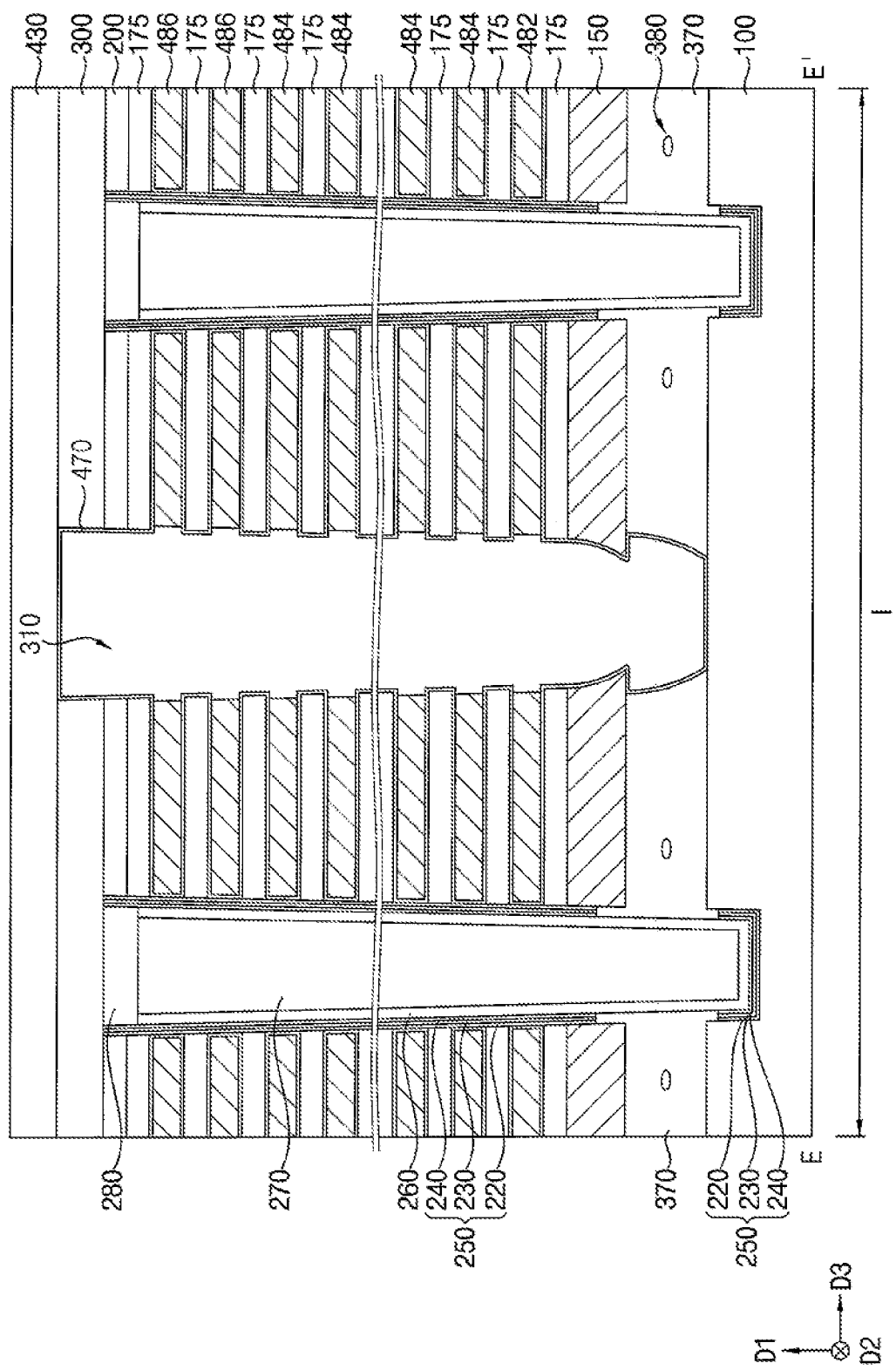
Figure 36:
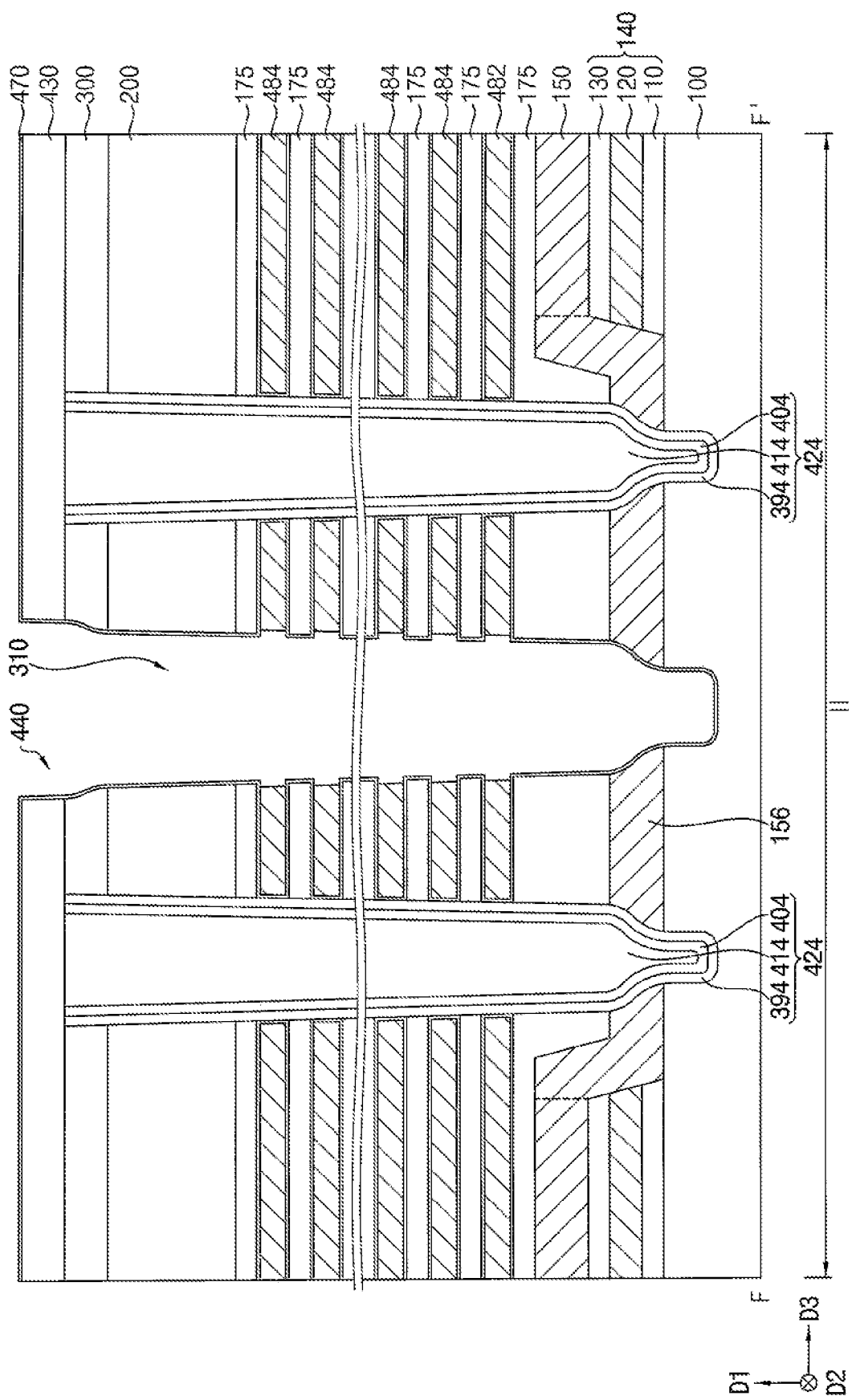

Referring to FIGS. 34 to 36, the fourth sacrificial patterns 185 exposed by the sixth to eighth openings 310, 320 and 330 may be removed to form a second gap between neighboring ones of the insulation patterns 175, and an outer sidewall of the charge storage structure 250 may be partially exposed by the second gap.

In an example embodiment of the present inventive concept, the fourth sacrificial patterns 185 may be removed by a wet etching process using phosphoric acid ($H_3PO_4$) or sulfuric acid ($H_2SO_4$). For example, when the fourth sacrificial patterns 185 are formed of silicon nitride ($Si_3N_4$) and the insulation patterns 175 are formed of silicon oxide ($SiO_2$), the fourth sacrificial patterns 185 may be removed by an etching process using an etching solution including phosphoric acid ($H_3PO_4$).

When the second gap is formed by the wet etching process, the pillar structure, which includes the charge storage structure 250, the channel 260, the first filling pattern 270 and the capping pattern 280, is formed on the first region I of the substrate 100 and the support structure 424 is formed on the second region II of the substrate 100, and thus the mold may not lean or fall down.

The outer sidewall of the support structure 424 may be exposed by the wet etching process, however, the second etch stop pattern 394 including a material having an etching selectivity with respect to the fourth sacrificial pattern 185 is formed on the outer sidewall of the support structure 424, and thus the support structure 424 may not be removed by the wet etching process. For example, the second etch stop pattern 394 may include, e.g., an oxide such as silicon oxide ($SiO_2$), and thus may not be removed by the etching process using an etching solution including phosphoric acid ($H_3PO_4$).

A second blocking layer 470 may be formed on the exposed outer sidewall of the charge storage structure 250 exposed by the sixth to eighth openings 310, 320 and 330, the outer sidewall of the support structure 424, inner walls of the second gaps, surfaces of the insulation patterns 175, sidewalls of the first and second insulating interlayers 200 and 300, a sidewall and an upper surface of the second support layer 430, sidewalls of the first support layer 150 and the first to third support patterns 152, 154 and 156, a sidewall of the channel connection pattern 370, and the upper surface of the substrate 100, and a gate electrode layer may be formed on the second blocking layer 470. The second blocking layer 470 may be formed by a deposition method having an excellent step coverage property. For example, the second blocking layer 470 may be formed by a CVD process or an ALD process.

The gate electrode layer may include a gate barrier layer and a gate conductive layer sequentially stacked. The gate conductive layer may include a low resistance metal, e.g., tungsten (W), titanium (Ti), tantalum (Ta), platinum (Pt), etc., and the gate barrier layer may include a metal nitride, e.g., titanium nitride (TiN), tantalum nitride (TaN), etc. The second blocking layer 470 may include a metal oxide, e.g., aluminum oxide ($Al_2O_3$), hafnium oxide ($HfO_2$), etc.

The gate electrode layer may be partially removed to form a gate electrode in each of the second gaps. In an example embodiment of the present inventive concept, the gate electrode layer may be partially removed by a wet etching process. As a result, the fourth sacrificial pattern 185 of the mold having a staircase shape including step layers, each of which may include the fourth sacrificial pattern 185 and the insulation pattern 175, may be replaced with the gate electrode and the second blocking layer 470 covering lower and upper surfaces of the gate electrode. Accordingly, instead of the mold including the fourth sacrificial pattern 185 and the insulation pattern 175, each of the step layers may include the gate electrode and the insulation pattern 175.

In an example embodiment of the present inventive concept, the gate electrode may extend in the second direction D2, and a plurality of gate electrodes may be spaced apart from each other in the first direction D1 to form a gate electrode structure. Additionally, a plurality of gate electrode structures may be formed in the third direction D3. That is, the gate electrode structures extending in the second direction D2 may be spaced apart from each other in the third direction D3 by the sixth opening 310.

Each of the gate electrode structures may be partially separated in the third direction D3 by the seventh opening 320, however, the partially separated portion of the each of the gate electrode structures may be connected with each other by the connection portion overlapping the first division pattern 190 on the second region II of the substrate 100. A gate electrode at a lowermost level in each of the gate electrode structures may be divided into two pieces in the third direction D3 by the first division pattern 190 and the seventh opening 320.

The gate electrodes at upper two levels, respectively, in each of the gate electrode structures may be divided into three pieces in the third direction D3 by the second division pattern 290 and the seventh opening 320.

In an example embodiment of the present inventive concept, the gate electrode structure may include first, second and third gate electrodes 482, 484 and 486 sequentially stacked in the first direction D1. In an example embodiment of the present inventive concept, the gate electrode structure may include at least one first gate electrode 482 serving as a ground selection line (GSL), a plurality of second gate electrodes 484 serving as word lines (WL), respectively, and at least one third gate electrode 486 serving as a string selection line (SSL). The number of levels at which the first to third gate electrodes 482, 484 and 486 are formed may not be limited thereto, and each of the first to third gate electrodes 482, 484 and 486 may be formed at one level or a plurality of levels. For example, the ground selection line (GSL) may be formed at a lowermost level, each of the word lines (WL) and the string selection line (SSL) may be formed on the ground selection line (GSL) at one level or a plurality of levels. In an example embodiment of the present inventive concept, the string selection line (SSL) may be formed at an uppermost level and one level directly under the uppermost level, and the word line (WL) may be formed between the ground selection line (GSL) and the string selection line (SSL) at a plurality of levels.

Referring to FIGS. 37 to 41, a division layer may be formed on the second blocking layer 470 to fill the sixth to eighth openings 310, 320 and 330 and the tenth to twelfth openings 440, 450 and 460, and the division layer and the second blocking layer 470 may be planarized until an upper surface of the second support layer 430 is exposed.

After planarizing the division layer and the second blocking layer 470, a third division pattern 480 filling the sixth and tenth openings 310 and 440, a fourth division pattern 490 filling the seventh and eleventh openings 320 and 450, and a fifth division pattern 500 filling the eighth and twelfth openings 330 and 460 may be formed, and the second blocking layer 470 may be transformed into a second blocking pattern 475.

First, second and third contact plugs 510, 520 and 530 extending through the second support layer 430, the second insulating interlayer 300, the first insulating interlayer 200, the insulation pattern 175 and the second blocking pattern 475 to contact upper surfaces of the first to third gate electrodes 482, 484 and 486, respectively, may be formed.

In an example embodiment of the present inventive concept, each of the first to third contact plugs 510, 520 and 530 may contact a corresponding step of the mold, and may be formed between the support structures 424 that may be spaced apart from each other in the third direction D3 to form a pair. For example, each of the pair of the support structures 424 may be formed on each of the opposite sides of each of the first to third contact plugs 510, 520 and 530 in the third direction D3.

A bit line electrically connected to the capping pattern 280 and upper wirings electrically connected to the first to third contact plugs 510, 520 and 530 may be further formed to complete the fabrication of the vertical memory device.

As illustrated above, the ninth opening 340 for forming the support structure 424 may be formed together with the sixth to eighth openings 310, 320 and 330 according to an example embodiment of the present inventive concept for separating the fourth sacrificial layer 180 into the fourth sacrificial patterns 185, and the support structure 424 may be formed in the ninth opening 340. Thus, when the sixth to eighth openings 310, 320 and 330 are formed, the support structure 424 has not been formed, and thus each of the sixth to eighth openings 310, 320 and 330 may be formed to extend in a straight line in the second direction D2 with no influence of the support structure 424.

If the ninth opening 340 for forming the support structure is formed together with the channel holes 210 for forming the channels 260 and the charge storage structures 250 before forming the sixth to eighth openings 310, 320 and 330, the support structure including, e.g., polysilicon (p-Si) as the channel 260 may be formed in the ninth opening 340. For example, a dummy channel as the support structure may be formed by the same process for forming the channel 260, and thus may include the same material, e.g., polysilicon (p-Si). When the sixth to eighth openings 310, 320 and 330 for separating the fourth sacrificial layer 180 into the fourth sacrificial patterns 185 each of which may extend in the second direction D2 is formed by, e.g., a reactive ion etching (RIE) process, each of the sixth to eighth openings 310, 320 and 330 may not be formed to extend in a straight line in the second direction D2 but may be bent toward the support structure due to ions stacked in polysilicon (p-Si) of the support structure. Thus, when the fourth sacrificial patterns 185 are removed through the sixth to eighth openings 310, 320 and 330 to form the second gaps, and the gate electrodes are formed in the second gaps, respectively, some ones of the gate electrodes may be electrically connected with each other, which may cause an electrical short.

In an example embodiment of the present inventive concept, the ninth opening 340 for forming the support structure 424 may be formed simultaneously with the sixth to eighth openings 310, 320 and 330, and then the support structure 424 may be formed in the ninth opening 340, so that each of the sixth to ninth openings 310, 320 and 330 may be formed to extend in a straight line in the second direction D2 with no influence of the support structure 424. Accordingly, when the gate electrodes are formed, the gate electrodes may not be electrically connected with each other to cause an electrical short, thereby providing a vertical memory device having enhanced electrical characteristics.

In an example embodiment of the present inventive concept, the ninth opening 340 may be formed after the forming of the sixth to eighth openings 310, 320 and 330. For example, the present inventive concept may have the feature in that the support structure 424 may be formed after the forming of the sixth to eighth openings 310, 320 and 330, and the ninth opening 340 may not be necessarily formed simultaneously with the sixth to eighth openings 310, 320 and 330. Accordingly, the ninth opening 340 may be formed after or even before forming the sixth to eighth openings 310, 320 and 330 if only the support structure 424 is formed in the ninth opening 340 after forming the sixth to eighth openings 310, 320 and 330. In other words, if the support structure 424 is formed in the ninth opening 340 before forming the sixth to eighth openings 310, 320 and 330 with a reactive ion etching process, during the reactive ion etching process, the sixth to eighth openings 310, 320 and 330 may not be formed in a straight line but may be bent due to the ions being accumulated in polysilicon (p-Si) of the support structure 424. In an example embodiment of the present inventive concept, the ninth opening 340 may be formed prior to the forming of the sixth to eighth openings 310, 320 and 330, and forming the support structure 424 in the ninth opening 340 may be performed after the forming of the sixth to eighth openings 310, 320 and 330. By forming the support structure 424 after forming the sixth to eighth openings 310, 320 and 330 as provided by the present inventive concept, each of the sixth to ninth openings 310, 320 and 330 may be formed to extend in a straight line, and accordingly, when the gate electrodes are formed, the gate electrodes may not be electrically connected with each other to cause an electrical short.

The vertical memory device formed by the above processes may have the following structural characteristics.

The vertical memory device may include the gate electrode structure including the gate electrodes 482, 484 and 486, each of which may extend in the second direction D2, spaced apart from each other in the first direction D1 to be stacked in a staircase shape on the second region II of the substrate 100 including the first and second regions I and II, the channels 260, each of which may extend through the gate electrode structure in the first direction D1, spaced apart from each other on the first region I of the substrate 100 in a horizontal direction substantially parallel to the upper surface of the substrate 100, the charge storage structure 250 disposed on the outer sidewall of each of the channels 260, the channel connection pattern 370 for electrically connecting the channels 260 with each other disposed on the first region I of the substrate 100, the first support layer 150 disposed on the channel connection pattern 370, the first to third support patterns 152, 154 and 156 being connected to the first support layer 150 and contacting the upper surface of the substrate 100, the first to third contact plugs 510, 520 and 530 extending in the first direction D1 to contact corresponding ones, respectively, of the steps of the gate electrode structure on the second region II of the substrate 100, and the support structures 424 each of which may extend in the first direction D1 through the corresponding ones of the steps of the gate electrode structure contacting the first to third contact plugs 510, 520 and 530, and each of the support structures 424 may include the second filling pattern 414 extending in the first direction D1 on the substrate 100, the third spacer 404 covering the sidewall and the bottom surface of the second filling pattern 414, and the second etch stop pattern 394 covering the sidewall and the bottom surface of the third spacer 404.

In an example embodiment of the present inventive concept, an upper surface of each of the support structures 424 may be higher than upper surfaces of the channels 260 by a thickness of the second insulating interlayer 300 plus a thickness of the capping pattern 280. In an example embodiment of the present inventive concept, an upper surface of each of the support structures 424 may be higher than upper surfaces of the charge storage structures 250 by a thickness of the second insulating interlayer 300.

In an example embodiment of the present inventive concept, a plurality of gate electrode structures may be formed in the third direction D3, and may be spaced apart from each other in the third direction D3 by the third division pattern 480 extending in the second direction D2 on the first and second regions I and II of the substrate 100.

In an example embodiment of the present inventive concept, an upper surface of the third division pattern 480 may be higher than the upper surfaces of the support structures 424 by a thickness of the second support layer 430.

In an example embodiment of the present inventive concept, the third division pattern 480 may extend through the first support layer 150 and the first support pattern 152 to contact the upper surface of the substrate 100 on the first region I of the substrate 100, and may extend through the channel connection pattern 370 and the second and third support patterns 154 and 156 to contact the upper surface of the substrate 100 on the second region II of the substrate 100. For example, a portion of the third division pattern 480 may extend through the first support pattern 152 (or the second support pattern 154 or the third support pattern 156), and another portion of the third division pattern 480 may extend through the channel connection pattern 370 and the first support layer 150.

In an example embodiment of the present inventive concept, the second blocking pattern 475 may be formed on the sidewall of the third division pattern 480, and may cover the lower and upper surfaces and a sidewall facing each of the channels 260 of each of the first to third gate electrodes 482, 484 and 486.

In an example embodiment of the present inventive concept, a plurality of support structures 424 (i.e., more than one of the support structures 424) may extend through each of the corresponding ones of the steps of the gate electrode structure contacting the first to third contact plugs 510, 520 and 530, respectively, and may be also formed at opposite sides in the third direction D3 of each of the first to third contact plugs 510, 520 and 530.

Figure 37:
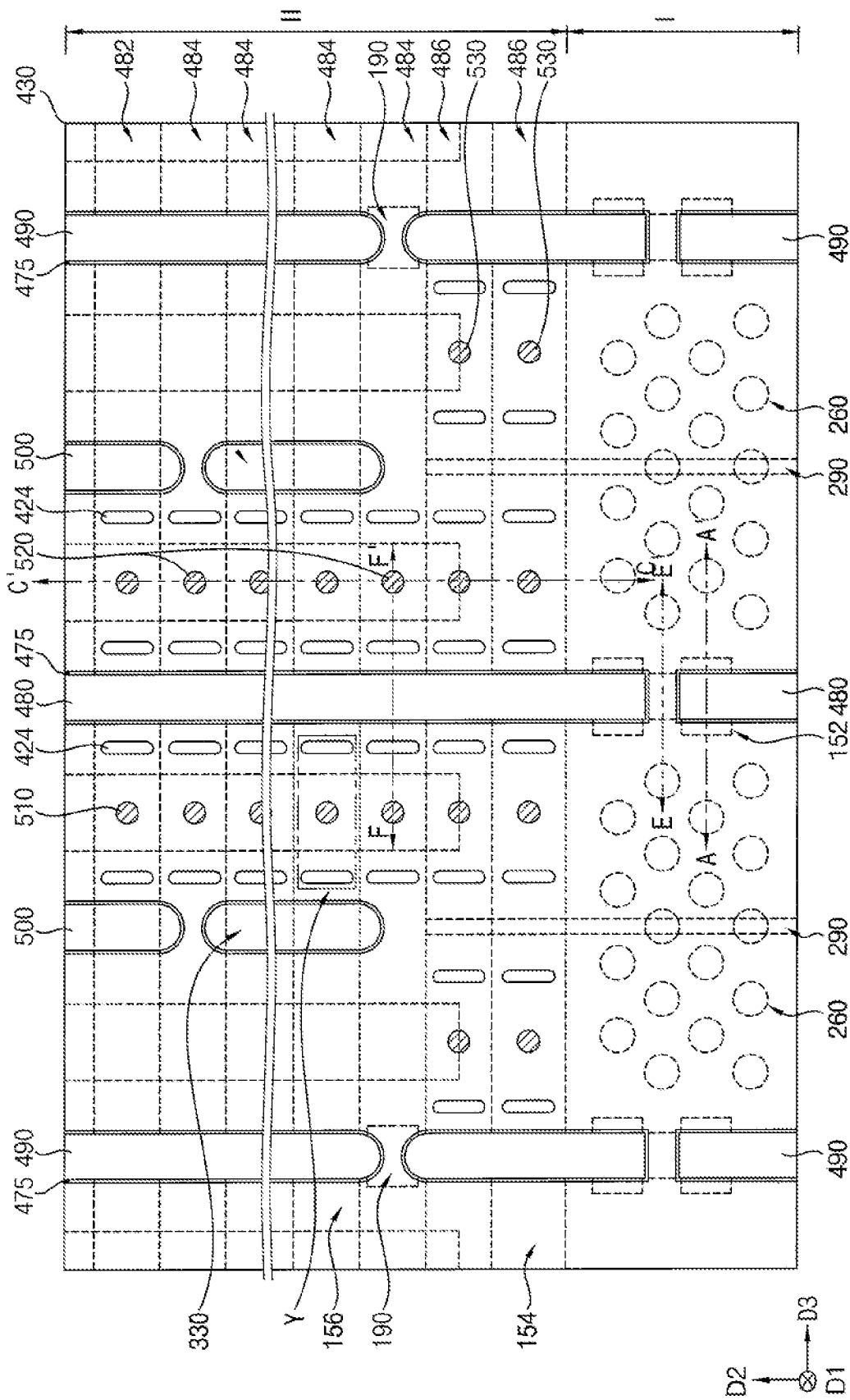
Figure 38:
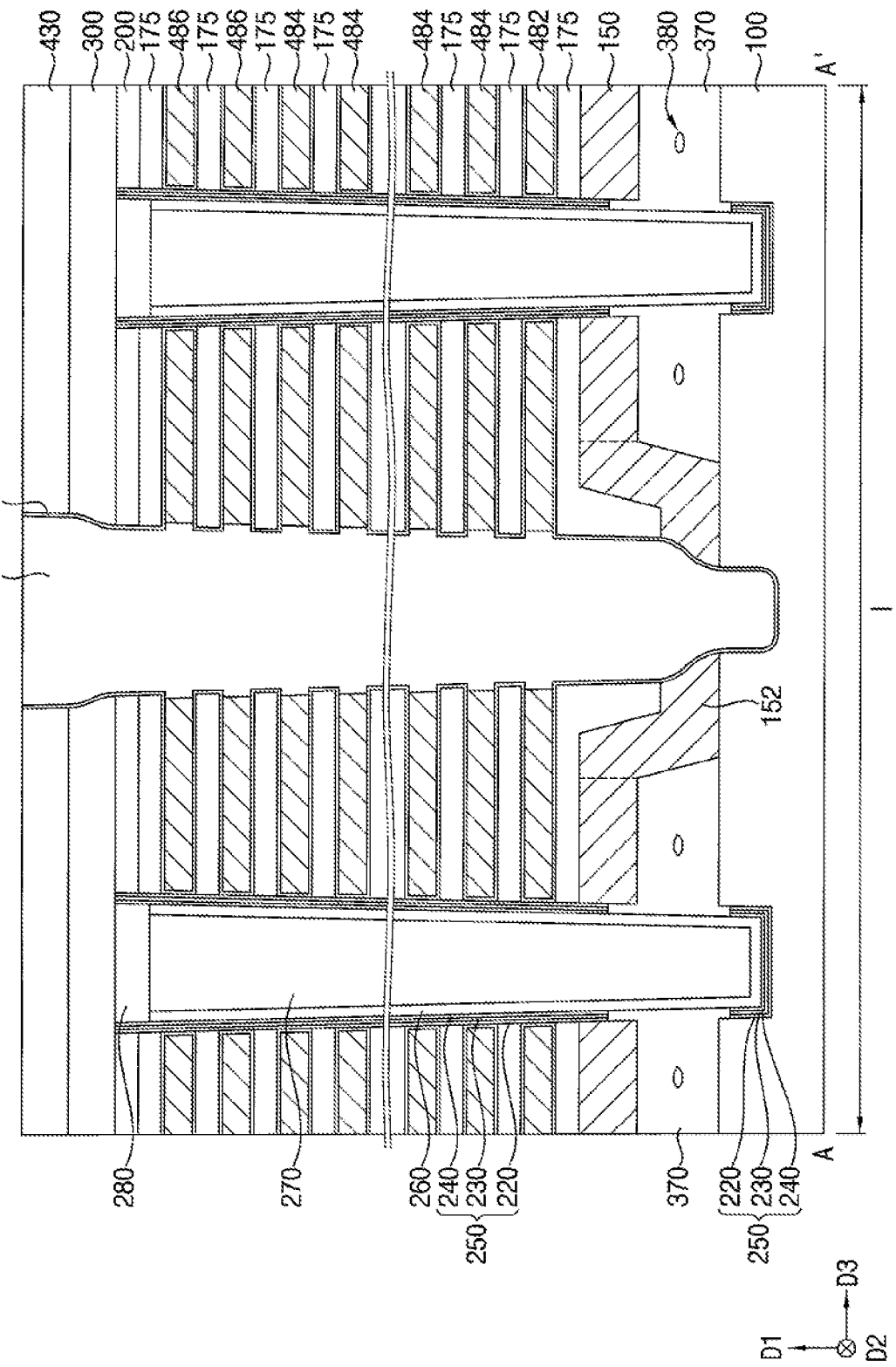

FIGS. 42 to 45 are plan views illustrating the shapes and layouts of the support structure each in accordance with an example embodiment of the present inventive concept, and are plan views about a region Y of FIG. 37.

Figure 42:
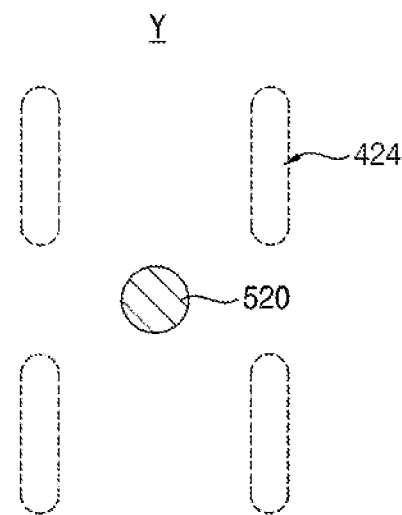
FIGS. 42 to 45 are plan views illustrating the shapes and layouts of the support structure each in accordance with an example embodiment of the present inventive concept, and are plan views about a region Y of FIG. 37.

Referring to FIG. 42, two support structures 424 may be spaced apart from each other in the second direction D2 at each of opposite sides of the second contact plug 520 in the third direction D3. For example, in the second direction D3, two support structures 424 may be on one side of the second contact plug 520 and another two may be on the opposite side of the second contact plug 520. Each of the support structures 424 may have a bar shape extending in the second direction D2 in a plan view. For example, four support structures 424 may be disposed around the second contact plug 520.

Figure 43:
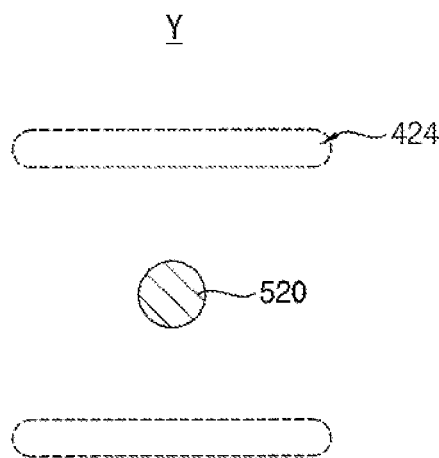

Referring to FIG. 43, one support structure 424 may be formed at each of opposite sides of the second contact plug 520 in the second direction D2. For example, in the second direction D2, one support structure 424 is on one side of the second contact plug 520 and another one is on the opposite side of the second contact plug 520. Each of the support structures 424 may have a bar shape extending in the third direction D3 in a plan view.

Figure 44:
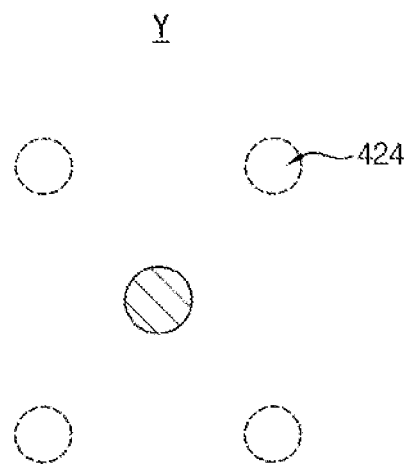

Referring to FIG. 44, the support structures 424 may be disposed in a layout of those shown in FIG. 42, however, each of the support structures 424 may have a shape of a circle or ellipse in a plan view.

Figure 45:
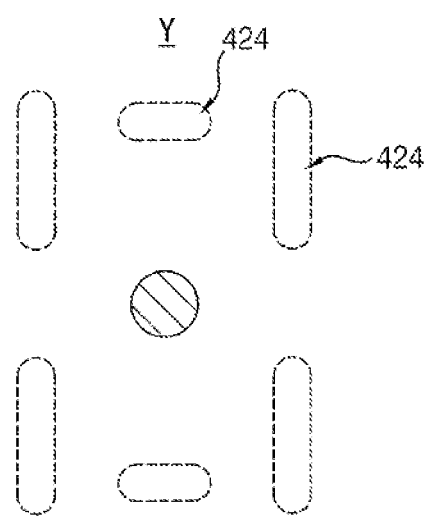

Referring to FIG. 45, as shown in FIG. 42, two support structures 424 may be spaced apart from each other in the second direction D2 at each of opposite sides of the second contact plug 520 in the third direction D3, and further one support structure 424 may be formed at each of opposite sides of the second contact plug 520 in the second direction D2. Ones of the support structures 424 formed at each of opposite sides of the second contact plug 520 in the third direction D3 may be referred to as first support structures, which may have a bar shape extending in the second direction D2 in a plan view. Ones of the support structures 424 formed at opposite sides of the second contact plug 520 in the second direction D2 may be referred to as second support structures, which may have a bar shape extending in the third direction D3 in a plan view. For example, six support structures 424 may be disposed around the second contact plug 520. The arrangement of the support structures 424 illustrated in FIG. 45 may be a combination of the arrangement of the support structures 424 illustrated in FIG. 42 and the arrangement of the support structures 424 illustrated in FIG. 42, except that the two support structures 424 formed at the opposite sides of the second contact plug 520 in the second direction D2 in FIG. 45 may have an extending length shorter than that of the support structures 424 illustrated in FIG. 43.

As illustrated above, the support structures 424 may be disposed around the second contact plug 520 in a free layout if they do not contact the second contact plug 520, and the support structures 424 may also be formed around the first and third contact plugs 510 and 530. However, in order that each of the support structures 424 may extend through the second support pattern 154 or the third support pattern 156 on the second region II of the substrate 100, the layout of the second and third support patterns 154 and 156 may be changed according to the layout of the support structures 424.

Figure 46:
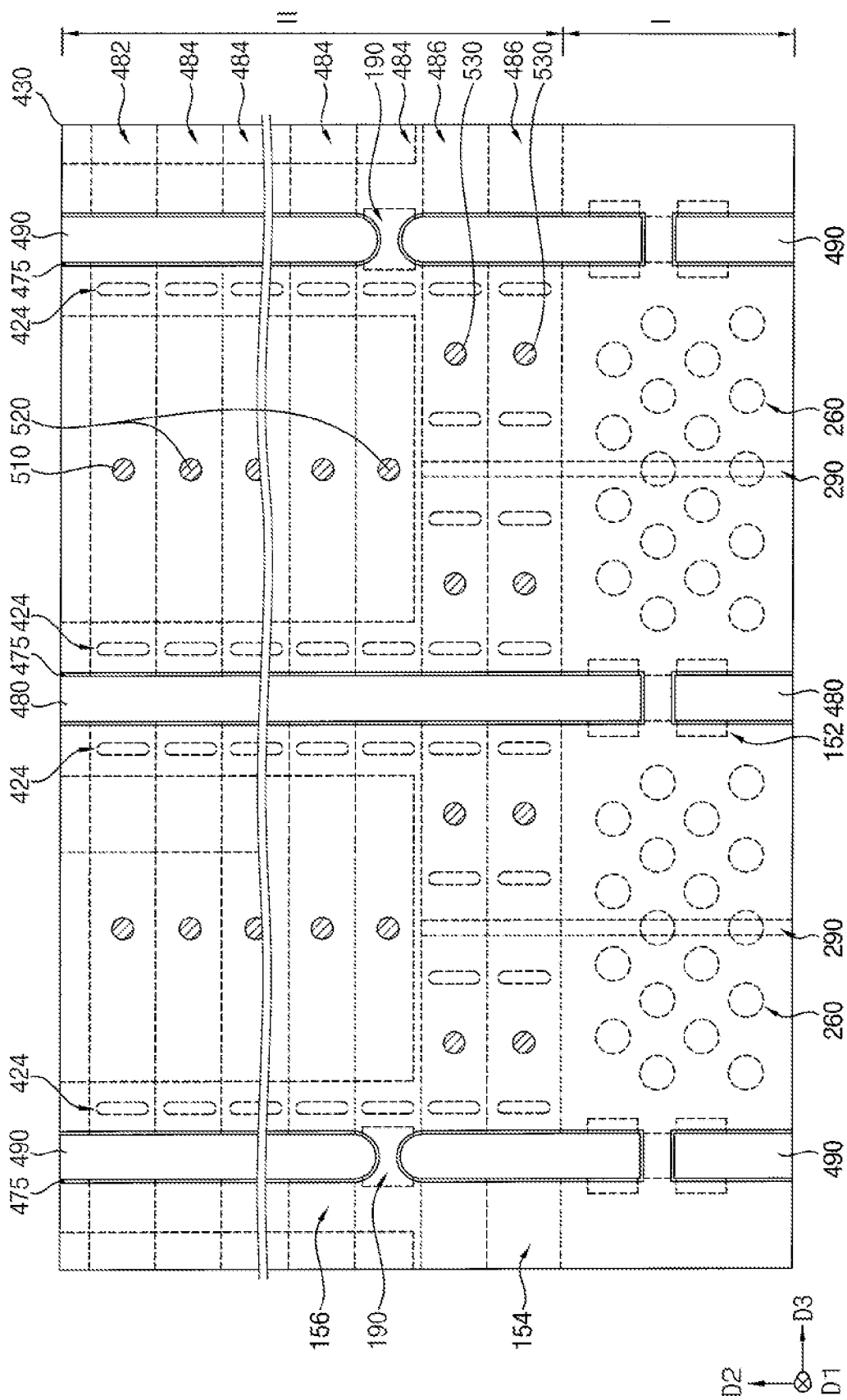
FIG. 46 is a plan view illustrating a vertical memory device in accordance with an example embodiment of the present inventive concept.

FIG. 46 is a plan view illustrating a vertical memory device in accordance with an example embodiment of the present inventive concept.

This vertical memory device of FIG. 46 may be substantially the same as or similar to that of FIGS. 37 to 41, except that this vertical memory device does not include the fifth division pattern and accordingly has different layouts of the support pattern, the support structure and the contact plugs. Thus, like reference numerals refer to like elements, and detailed descriptions thereon are omitted herein.

Referring to FIG. 46, the second support pattern 154 and the fifth division pattern 500 aligned with the second division pattern 290 may not be formed on the second region II of the substrate 100.

Each of the first to third contact plugs 510, 520 and 530 may be formed between the third division pattern 480 in the sixth and tenth openings 310 and 440 and the fourth division pattern 490 in the seventh and eleventh openings 320 and 450, and the support structure 424 may be formed at each of opposite sides in the third direction D3 of each of the first to third contact plugs 510, 520 and 530.

While specific example embodiments have been particularly shown and described, it will be understood by one of ordinary skill in the art that variations in form and detail may be made therein without departing from the spirit and scope of the present inventive concept as defined in the appended claims.

What is claimed is:

1. A vertical memory device comprising:
a gate electrode structure formed on a substrate including a cell array region and a pad region, the gate electrode structure including gate electrodes spaced apart from each other in a first direction perpendicular to an upper surface of the substrate and stacked in a staircase shape on the pad region of the substrate, each of the gate electrodes extending in a second direction parallel to the upper surface of the substrate;
a channel extending in the first direction through the gate electrode structure on the cell array region of the substrate;
a charge storage structure formed on an outer sidewall of the channel;
contact plugs contacting corresponding ones of steps, respectively, of the gate electrode structure, each of the contact plugs extending in the first direction on the pad region of the substrate; and
support structures extending through the corresponding ones of the steps, respectively, of the gate electrode structure, each of the support structures extending in the first direction on the pad region of the substrate,
wherein each of the support structures includes:
a filling pattern extending in the first direction on the substrate; and
an etch stop pattern covering a sidewall and a bottom surface of the filling pattern,
wherein an upper surface of each of the support structures is higher than an upper surface of the channel, and higher than an upper surface of the charge storage structure,
wherein the gate electrode structure is one of a plurality of gate electrode structures disposed in a third direction parallel to the upper surface of the substrate and crossing the second direction,
wherein the plurality of gate electrode structures are spaced apart from each other by a division pattern extending in the second direction on the cell array region and the pad region of the substrate,
wherein an upper surface of the division pattern includes a first portion located on the cell array region but not on the pad region of the substrate, a second portion being different from and being higher than the first portion and located on the cell array region and the pad region of the substrate, a sidewall bordering the first portion and the second portion, and both the first portion and the second portion of the upper surface of the division pattern being substantially parallel to the upper surface of the substrate, and
wherein the first portion of the upper surface of the division pattern is covered by an upper support layer, and the second portion of the upper surface of the division pattern is substantially coplanar with an upper surface of the upper support layer, a lowermost surface of the upper support layer being higher than an uppermost surface of the gate electrode structure.

2. The vertical memory device of claim 1, wherein the filling pattern includes polysilicon or a nitride, and the etch stop pattern includes an oxide.

3. The vertical memory device of claim 1, further comprising a spacer disposed between the filling pattern and the etch stop pattern.

4. The vertical memory device of claim 1, wherein more than one of the support structures extend through each of the corresponding ones of the steps, of the gate electrode structure, and
wherein the more than one of the support structures are disposed at opposite sides of each of the contact plugs in a third direction parallel to the upper surface of the substrate and crossing the second direction.

5. The vertical memory device of claim 1, wherein more than one of the support structures extend through each of the corresponding ones of the steps, of the gate electrode structure, and
wherein the more than one of the support structures include:
first support structures disposed at opposite sides of each of the contact plugs in a third direction parallel to the upper surface of the substrate and crossing the second direction, each of the first support structures having a bar shape extending in the second direction in a plan view; and
second support structures disposed at opposite sides in the second direction of each of the contact plugs, each of the second support structures having a bar shape extending in the third direction in the plan view.

6. The vertical memory device of claim 1, wherein more than one of the support structures extend through each of the corresponding ones of the steps, of the gate electrode structure, and
wherein the more than one of the support structures are disposed at opposite sides of each of the contact plugs in the second direction.

7. The vertical memory device of claim 1, wherein the second portion of the upper surface of the division pattern is higher than an upper surface of each of the support structures.

8. The vertical memory device of claim 1, wherein the division pattern includes silicon oxide, and
wherein the vertical memory device further comprises a blocking pattern covering a sidewall of the division pattern and including a metal oxide.

9. The vertical memory device of claim 1, wherein the channel is one of a plurality of channels spaced apart from each other in a horizontal direction parallel to the upper surface of the substrate, and
wherein the vertical memory device further comprises a channel connection pattern on the cell array region of the substrate, the channel connection pattern electrically connecting the plurality of channels with each other.

10. The vertical memory device of claim 9, further comprising:
a support layer disposed on the channel connection pattern; and
a support pattern connected to the support layer, the support pattern contacting the upper surface of the substrate,
wherein each of the support structures extends through the support pattern and contacts the upper surface of the substrate.

11. A vertical memory device comprising:
a gate electrode structure formed on a substrate, the gate electrode structure including gate electrodes spaced apart from each other in a first direction perpendicular to an upper surface of the substrate and stacked in a staircase shape, each of the gate electrodes extending in a second direction parallel to the upper surface of the substrate;

a division pattern formed at a sidewall of the gate electrode structure, the division pattern extending in the second direction on the substrate;

channels spaced apart from each other in a horizontal direction parallel to the upper surface of the substrate, each of the channels extending in the first direction through the gate electrode structure on the substrate;

a charge storage structure formed on an outer sidewall of each of the channels;

a channel connection pattern formed on the substrate, the channel connection pattern electrically connecting the channels with each other;

a support layer formed on the channel connection pattern;

a support pattern connected to the support layer, the support pattern contacting the upper surface of the substrate;

a contact plug extending on the substrate in the first direction and contacting a step of the gate electrode structure; and a support structure extending on the substrate in the first direction, the support structure extending through the step of the gate electrode structure and the support pattern to contact the upper surface of the substrate, wherein an upper surface of the division pattern includes a first portion located on cell array region but not on pad region of the substrate, a second portion being different from and being higher than the first portion and located on the cell array region and the pad region of the substrate, a sidewall bordering the first portion and the second portion, and both the first portion and the second portion of the upper surface of the division pattern being substantially parallel to the upper surface of the substrate, wherein the second portion of the upper surface of the division pattern is higher than an upper surface of the support structure, the first portion of the upper surface of the division pattern is substantially coplanar with the upper surface of the support structure, the upper surface of the support structure is higher than upper surfaces of the channels, and the upper surface of the support structure is higher than an upper surface of the charge storage structure, and wherein the first portion of the upper surface of the division pattern is covered by an upper support layer, and the second portion of the upper surface of the division pattern is substantially coplanar with an upper surface of the upper support layer, a lowermost surface of the upper support layer being higher than an uppermost surface of the gate electrode structure.

12. The vertical memory device of claim 11, wherein the gate electrode structure is one of a plurality of gate electrode structures disposed in a third direction parallel to the upper surface of the substrate and crossing the second direction, and wherein the plurality of gate electrode structures are spaced apart from each other by the division pattern in the third direction.

13. The vertical memory device of claim 11, further comprising a blocking pattern covering a sidewall of the division pattern and including a metal oxide.

14. The vertical memory device of claim 11, wherein the support structure includes:

a filling pattern extending in the first direction on the substrate; and an etch stop pattern covering a sidewall and a bottom surface of the filling pattern.

15. The vertical memory device of claim 11, wherein each of the support layer and the support pattern includes polysilicon doped with impurities or undoped polysilicon.

16. The vertical memory device of claim 11, wherein a portion of the division pattern extends through the support pattern, and another portion of the division pattern extends through the channel connection pattern and the support layer.

17. The vertical memory device of claim 11, wherein the support structure is one of a plurality of support structures extending through the step of the gate electrode structure, and wherein the plurality of support structures are disposed at opposite sides of the contact plug in a third direction parallel to the upper surface of the substrate and crossing the second direction.

18. A vertical memory device comprising:

a gate electrode structure formed on a substrate including a cell array region and a pad region, the gate electrode structure including gate electrodes spaced apart from each other in a first direction perpendicular to an upper surface of the substrate and stacked in a staircase shape on the pad region of the substrate, each of the gate electrodes extending in a second direction parallel to the upper surface of the substrate;

channels spaced apart from each other in a horizontal direction parallel to the upper surface of the substrate, each of the channels extending in the first direction through the gate electrode structure on the cell array region of the substrate;

a charge storage structure formed on an outer sidewall of each of the channels;

a channel connection pattern formed on the cell array region of the substrate, the channel connection pattern electrically connecting the channels with each other;

a support layer formed on the channel connection pattern;

a support pattern connected to the support layer, the support pattern contacting an upper surface of the substrate;

contact plugs contacting corresponding ones of steps, respectively, of the gate electrode structure, each of the contact plugs extending in the first direction on the pad region of the substrate; and support structures extending through the corresponding ones of the steps, respectively, of the gate electrode structure, each of the support structures extending in the first direction on the pad region of the substrate, wherein each of the support structures includes:

a filling pattern extending in the first direction on the substrate; and an etch stop pattern covering a sidewall and a bottom surface of the filling pattern, wherein an upper surface of each of the support structures is higher than upper surfaces of the channels, and higher than an upper surface of the charge storage structure, wherein the gate electrode structure is one of a plurality of gate electrode structures disposed in a third direction parallel to the upper surface of the substrate and crossing the second direction, wherein the plurality of gate electrode structures are spaced apart from each other by a division pattern extending in the second direction on the cell array region and the pad region of the substrate, wherein an upper surface of the division pattern includes a first portion located on the cell array region but not on the pad region of the substrate, a second portion being different from and being higher than the first portion and located on the cell array region and the pad region of the substrate, a sidewall bordering the first portion and the second portion, and both the first portion and the second portion of the upper surface of the division pattern being substantially parallel to the upper surface of the substrate, and wherein the first portion of the upper surface of the division pattern is covered by an upper support layer, and the second portion of the upper surface of the division pattern is substantially coplanar with an upper surface of the upper support layer, a lowermost surface of the upper support layer being higher than an uppermost surface of the gate electrode structure.

19. The vertical memory device of claim 18, further comprising a spacer disposed between the filling pattern and the etch stop pattern.

* * * * *